United States Patent [19]
Onakado et al.

[11] Patent Number: 6,107,659
[45] Date of Patent: Aug. 22, 2000

[54] NONVOLATILE SEMICONDUCTOR MEMORY DEVICE OPERABLE AT HIGH SPEED WITH LOW POWER SUPPLY VOLTAGE WHILE PREVENTING OVERERASING/OVERWRITING

[75] Inventors: Takahiro Onakado; Natsuo Ajika, both of Hyogo, Japan

[73] Assignee: Mitsubishi Denki Kabushiki Kaisha, Tokyo, Japan

[21] Appl. No.: 09/033,581

[22] Filed: Mar. 3, 1998

[30] Foreign Application Priority Data

Sep. 5, 1997 [JP] Japan ................................. 9-241434

[51] Int. Cl.[7] .................................................. H01L 29/788
[52] U.S. Cl. ......................... 257/318; 257/320; 257/326; 257/378; 365/177
[58] Field of Search ................................... 257/315, 316, 257/318, 320, 326, 378; 365/185.3, 185.18, 185.25, 177

[56] References Cited

U.S. PATENT DOCUMENTS 5,060,194 10/1991 Sakui et al. ............................. 365/177
5,350,938 9/1994 Matsukawa et al. .................... 257/378
5,483,483 1/1996 Choi et al. ............................... 365/177
5,659,505 8/1997 Kobayashi et al. ................. 365/185.29

FOREIGN PATENT DOCUMENTS 59-74666 4/1984 Japan .
4-57369 2/1992 Japan .

OTHER PUBLICATIONS

"A Novel NAND Structure with a BJT Contact for the High Density Mask ROMs", Choi, et al, 1994 Symposium on VLSI Technology Digest of Technical Papers, pp. 163–164.

Primary Examiner—David Hardy
Assistant Examiner—George C. Eckert, II
Attorney, Agent, or Firm—McDermott, Will & Emery

[57] ABSTRACT

A memory cell array of a nonvolatile semiconductor memory device is provided with a bipolar transistor whose base is connected to a node between sources of two memory cell transistors. A memory cell SL decoder controls the potential level of an emitter of the bipolar transistor. A collector of the bipolar transistor is held at a ground potential. In a read operation, the emitter potential is so controlled that the bipolar transistor enters an ON state, and a current flowing through a channel of either memory cell transistor is amplified by the bipolar transistor to be read.

20 Claims, 49 Drawing Sheets

|  | BL | WL | SL |
|---|---|---|---|
| SELECTED STATE | -6V | 10V | 0V |
| NON-SELECTED STATE | 0V | 0V | 0V |

| BL | WL | SL | WELL |
|----|-----|----|------|
| 0V | -18V | 0V | 0V |

| BL | WL | SL | WELL |
|----|-----|----|------|
| OPEN | -12V | 6V | 6V |

N-TYPE WELL   0V

FIG.61

APPLIED POTENTIALS IN READ OPERATION

|  | BL | WL | SG | SL |
|---|---|---|---|---|
| SELECTED STATE | 0V | 0V | -1.8V | -1.8V |
| NON-SELECTED STATE | -1.8V | 0V | 0V | -1.8V |

N-TYPE WELL=0V

FIG.62

APPLIED POTENTIALS IN WRITE OPERATION

|  | BL | WL | SG | SL |
|---|---|---|---|---|
| SELECTED STATE | -6V | 10V | -7V | 0V |
| NON-SELECTED STATE | -1.8V | 0V | 0V | -1.8V |

N-TYPE WELL=0V

FIG.63

APPLIED POTENTIALS IN ERASE OPERATION

|  | BL | WL | SG | SL |
|---|---|---|---|---|
| SELECTED STATE | OPEN | -18V | -1.8V | 0V |
| NON-SELECTED STATE | -1.8V | 0V | 0V | -1.8V |

N-TYPE WELL=0V

NONVOLATILE SEMICONDUCTOR MEMORY DEVICE OPERABLE AT HIGH SPEED WITH LOW POWER SUPPLY VOLTAGE WHILE PREVENTING OVERERASING/OVERWRITING

BACKGROUND OF THE INVENTION

1. Field of the Invention

The present invention relates to a nonvolatile semiconductor memory device, and more specifically, it relates to a nonvolatile semiconductor memory device for writing and erasing data in and from memory cells and reading data from the memory cells with a low power supply voltage.

2. Description of the Background Art

A flash memory, which is a kind of nonvolatile semiconductor memory device, can be fabricated at a lower cost than a dynamic random access memory (DRAM), and is recently expected as a memory device for the future generation.

FIG. 67 is a circuit diagram showing the structure of a memory cell array 5000 of a conventional NOR flash memory. A plurality of word lines WL and a plurality of bit lines BL are arranged on the memory cell array 5000. FIG. 67 representatively shows word lines WL1, WL2, WL3, ... and bit lines BL1, BL2 and BL3, ... Memory cells MC are provided on the respective intersections between the word lines WL and the bit lines BL. The memory cells MC are formed by floating gate MOS transistors.

The structure of a memory cell transistor forming each memory cell MC is now described.

FIG. 68 is a model sectional view for illustrating the memory cell transistor of the conventional nonvolatile semiconductor memory device. As shown in FIG. 68, the memory cell transistor has an N-type source region 2 and an N-type drain region 3 formed on a major surface of a P-type semiconductor substrate 1, a floating gate electrode 5 formed above a channel region which is held between the source region 2 and the drain region 3 through a tunnel oxide film 4, and a control gate electrode 7 formed above the floating gate electrode 5 through an insulating film 6. The source region 2 and the drain region 3 of each memory cell transistor is formed by ion implantation through masks of side wall insulating films 9 formed on side walls of the floating gate electrode 5 and the control gate electrode 7.

Referring to FIGS. 67 and 68, a source line SL is connected to the source region 2 of each memory cell MC. A bit line BL is connected to the drain region 3. A word line WL is connected to the control gate electrode 7.

The source-to-drain conductivity (channel conductance) varies with a potential applied to the control gate electrode 7. The potential of the control electrode 7, which is so increased that a current starts to flow between the source and the drain, is called a threshold voltage Vth. The threshold voltage Vth is increased as electrons are stored in the floating gate electrode 5.

The memory cell transistor stores information by changing the charged state of the floating gate electrode 5. The floating gate electrode 5, which is electrically isolated from the exterior by the insulating films 9, is in a structure for storing information in a nonvolatile manner.

Read, write and erase operations of the NOR flash memory are now briefly described.

In the write operation, electrons are injected into the floating gate 5 by channel hot electron injection. Thus, the threshold voltage Vth of the memory cell transistor changes from a low level to a high level.

In the erase operation, the electrons are extracted from the floating gate electrode 5 by an F-N (Fowler-Nordheim's) tunnel phenomenon at a gate edge of the source or the drain. Thus, the threshold voltage Vth changes from a high level to a low level.

In the read operation, a voltage of about 1 V is applied to a selected bit line BL and an external power supply voltage VCC is supplied to a selected word line WL, for reading information depending on whether or not a current flows between the source and the drain of the memory cell transistor positioned on the intersection between the selected word line WL and the selected bit line BL.

FIGS. 69 and 70 illustrate threshold voltage distributions of the NOR flash memory. As shown in FIG. 69, such a state that the threshold voltage Vth is higher than the external power supply voltage VCC (5 V) is referred to as a write state, and such a state that the threshold voltage Vth is lower than the external power supply voltage VCC (5 V) is referred to as an erase state in the NOR flash memory.

The NOR flash memory writes information bitwise, and simultaneously erases information from all bits or bits included in every prescribed block. Therefore, the threshold voltage distribution in the erase state is wider than that in the write state.

As shown in FIG. 70, employment of the present external power supply voltage VCC of 3.3 V results in the so-called overerased cells having threshold voltages Vth of not more than 1.5 V.

FIG. 71 is a circuit diagram for illustrating the problem of overerased cells in the flash memory. It is assumed that data is read from a memory cell QC1 which is connected to a bit line BL and memory cells QC2, QC3, QC4, ... connected to the same bit line BL are overerased. A voltage of about 1 V is applied to the bit line BL, in order to read the data from the memory cell QC1. Further, the external power supply voltage VCC is applied to a word line WL1 connected with the memory cell QC1.

In this case, leakage currents i0 flow in the bit line BL through the overerased memory cells QC2, QC3, QC4, ... although the potentials of word lines WL2, WL3, WL4, ... connected thereto are 0 V. As a result, the selected memory cell QC1, which is in a write state, is erroneously determined as being in an erase state although no current originally flows through this memory cell QC1. Thus, the presence of such overerased cells QC2, QC3, QC4, ... is a critical defect in operation of the flash memory.

A DINOR (divided bit line NOR) flash memory dividing bit lines into sectors is now described.

U.S. Pat. No. 5,659,505 discloses the contents of such a DINOR flash memory. The contents are now briefly described.

FIG. 72 is a circuit diagram showing the structure of a memory cell array 6000 of a conventional DINOR flash memory.

As shown in FIG. 72, the memory cell array 6000 includes two memory cell array blocks BLK0 and BLK1. FIG. 72 representatively shows four memory cell transistors MC for each memory cell array block BLK0 or BLK1. The memory cell array block BLK0 includes memory cell transistors MC1a and MC1b having drains connected to a subbit line SBL1 respectively, memory cell transistors MC2a and MC2b having drains connected to a subbit line SBL2 respectively, a selector gate SG1 opening/closing connection between a main bit line BL1 and the subbit line SBL1, and a selector gate SG2 for opening/closing connection between a main bit line BL2 and the subbit line SBL2.

Control gate electrodes of the memory cell transistors MC1a and MC2a are connected to a word line WL1, and those of the memory cell transistors MC1b and MC2b are connected to a word line WL2.

The memory cell array block BLK1 also includes memory cell transistors MC3a and MC3b having drains connected to a subbit line SBL3 respectively, and memory cell transistors MC4a and MC4b having drains connected to a subbit line SBL4 respectively.

The memory cell array block BLK1 further includes a selector gate SG3 for opening/closing connection between the main bit line BL1 and the subbit line SBL3, and a selector gate SG4 for opening/closing connection between the main bit line BL2 and the subbit line SBL4.

Control gate electrodes of the memory cell transistors MC3a and MC4a are connected to a word line WL3, and those of the memory cell transistors MC3b and MC4b are connected to a word line WL4.

The DINOR flash memory performs write, erase and read operations for memory cells after selecting the corresponding memory cell array block BLK by opening/closing the corresponding selector gate SG. Each memory cell transistor MC is formed by a floating gate MOS transistor.

The erase and write operations of the DINOR flash memory are now described.

FIG. 73 illustrates threshold voltage distributions of memory cells of the DINOR flash memory with an external power supply voltage VCC of 3.3 V.

In the erase operation, electrons are collectively injected into the floating gate electrode 5 by an F-N tunnel phenomenon on the overall channel surface. Thus, the threshold voltage Vth changes from a low level to a high level.

In the write operation, on the other hand, the electrons are extracted by an F-N tunnel phenomenon at the gate edge of the drain. Namely, low and high threshold voltage distribution sides are referred to as write and erase states respectively in the DINOR flash memory.

Further, the DINOR flash memory extracts the electrons by applying a pulse voltage bitwise and further repeats an operation (verify operation) of verifying the threshold voltage Vth, thereby narrowing the low threshold voltage side distribution. Consequently, the lower limit of the low threshold voltage side distribution exceeds 1.5 V, to implement the operation with the external power supply voltage VCC of 3.3 V.

On the other hand, there is such a tendency that a lower voltage operation, a lower power consumption operation and a higher-speed read operation are required to a nonvolatile semiconductor memory device.

FIG. 74 illustrates threshold voltage distributions of the memory cells of the DINOR flash memory with an external power supply voltage VCC of 1.8 V.

When the external power supply voltage VC is lower than the present value of 3.3 V (e.g., 1.8 V), the lower limit of the low threshold voltage side is reduced below 1.5 V as shown in FIG. 74, to result in the so-called overwritten cells. Consequently, it is conceivably difficult to implement a read operation employing the external power supply voltage VCC as such despite the aforementioned technique of the DINOR flash memory.

In order to solve this problem, conceivable is means of stepping up the low external power supply voltage VCC to about the present voltage level (3.3 V) in read operation for applying the stepped-up voltage to word lines.

When this means is applied, however, the read operation is retarded due to the time required for the step-up operation. Further, power consumption is increased due to the step-up operation. In addition, the number of circuits operating at 3.3 V is so increased that the effect of power consumption reduction by the low voltage of 1.8 V is disadvantageously reduced.

SUMMARY OF THE INVENTION

An object of the present invention is to provide a nonvolatile semiconductor memory device which can avoid a malfunction resulting from overerasing or overwriting in a low-voltage operation.

Another object of the present invention is to provide a nonvolatile semiconductor memory device which can perform a high-speed read operation with a low-voltage power source.

Still another object of the present invention is to provide a nonvolatile semiconductor memory device capable of performing a low-voltage operation, which can be fabricated at a low cost.

Briefly stated, the present invention provides a nonvolatile semiconductor memory device formed on a semiconductor substrate, which comprises a memory cell array, a plurality of bit lines, a plurality of word lines, a plurality of first cell selector lines, a memory cell selector circuit, a plurality of bipolar transistors, and a data read circuit.

The memory cell array includes a plurality of memory cells which are arranged in rows and columns. The plurality of bit lines are provided in correspondence to the columns of the memory cells respectively. The plurality of word lines are provided in correspondence to the rows of the memory cells respectively. The plurality of first cell selector lines are also provided in correspondence to the rows of the memory cells respectively.

Each memory cell includes a memory cell transistor. The memory cell transistor has a second conductivity type source region and a second conductivity type drain region formed on a first conductivity type major surface of the semiconductor substrate, a channel region held between the source and drain regions, a charge storage electrode formed on the channel region through an oxide film, and a control electrode formed above the charge storage electrode through an insulating film.

The drain region is coupled with the corresponding bit line, and the potential of the control electrode is controlled by the corresponding word line.

The memory cell selector circuit selects a corresponding word line in response to an external address signal in a read operation of the nonvolatile semiconductor memory device, for providing a potential difference between a selected bit line and a selected first cell selector line.

The plurality of bipolar transistors are provided between the source regions of the corresponding memory cell transistors and the corresponding first cell selector lines respectively, and so coupled as to amplify a current flowing between the source and drain regions of a selected memory cell transistor as a base current and control the quantity of a current flowing through a selected first cell selector line.

The data read circuit reads data held in a selected memory cell in response to the value of the current flowing through the selected first cell selector line.

Thus, a principal advantage of the present invention resides in that the bipolar transistors supply amplified currents to the cell selector lines with currents flowing through the channel regions of the memory cell transistors regarded as base currents, and hence it is possible to increase the speed of the read operation and enlarge a margin in the read operation.

Another advantage of the present invention resides in that the cell selector lines independently control emitter potentials of the bipolar transistors, and hence no currents flow from the bit lines to the cell selector lines unless the bipolar transistors enter ON states. Therefore, the potentials applied to the word lines in the read operation can be at an arbitrary value. Namely, data can be read with no regard to threshold voltage distributions of the memory cell transistors after writing.

Still another advantage of the present invention resides in that the bipolar transistors serve as memory cell selector transistors and hence a bit line potential is transmitted only to a selected cell in the read operation. Thus, leakage currents from non-selected cells provided on the same bit line as the selected cell can be eliminated, and it is possible to completely avoid an overwrite (or overerase) failure.

In general, a voltage applied to a word line cannot be reduced in reading due to limitation by an overwrite (or overerase) failure. If an external power supply voltage is lower than the limit value, therefore, it is necessary to generate the voltage applied to the word line with a step-up operation in the internal circuit. Therefore, the read access speed is reduced and power consumption is increased due to the time required for the step-up operation. According to the present invention, however, it is possible to implement reduction of the external power supply voltage while maintaining high-speed access and low power consumption with no requirement for a step-up operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 61 illustrates the potential arrangement of applied potentials in a read operation of the memory cell illustrated in FIG. 53;

FIG. 62 illustrates the potential arrangement of applied potentials in a write operation of the memory cell illustrated in FIG. 53;

FIG. 63 illustrates the potential arrangement of applied potentials in an erase operation of the memory cell illustrated in FIG. 53;

DESCRIPTION OF THE PREFERRED EMBODIMENTS

Embodiment 1

Figure 1:
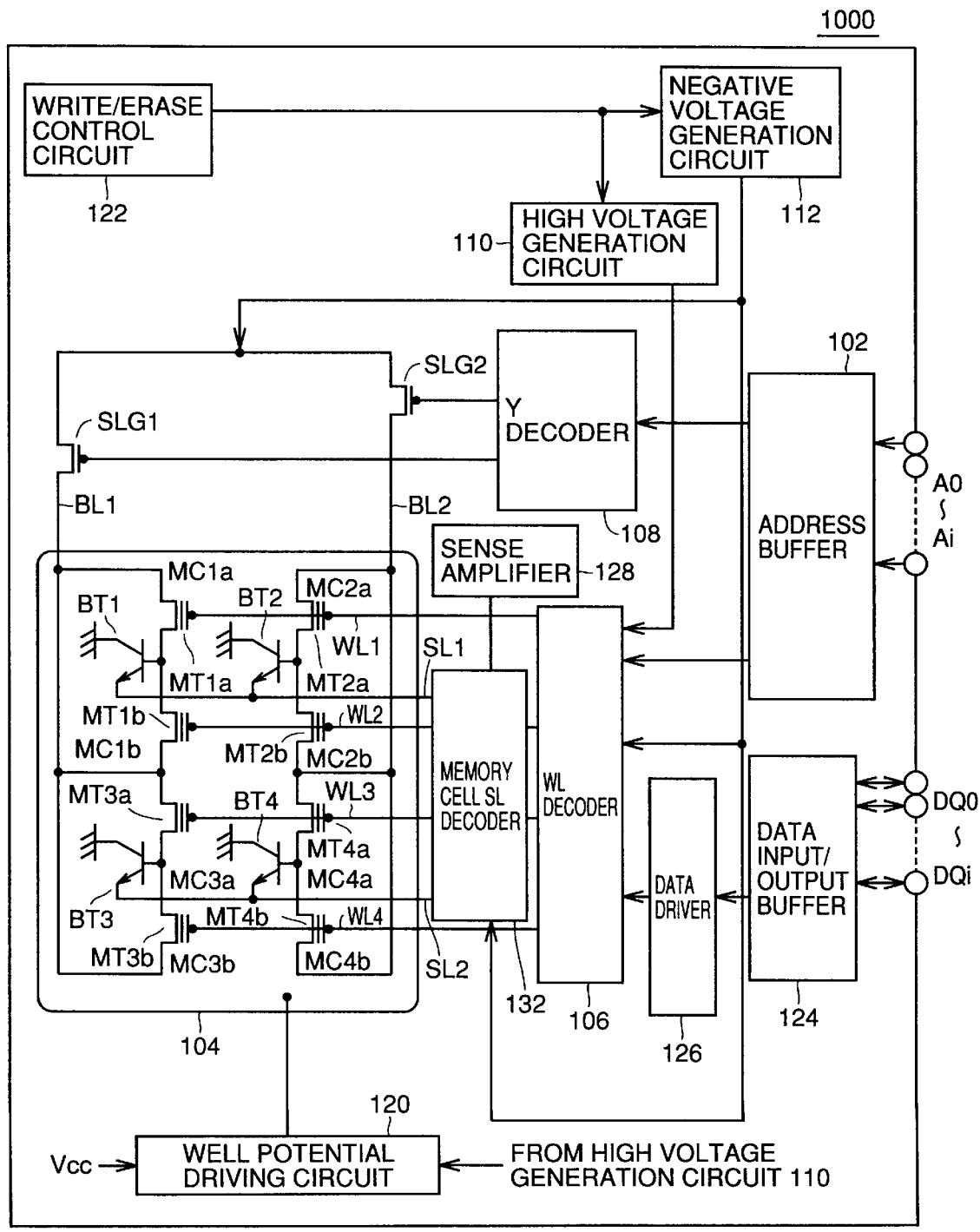
FIG. 1 is a schematic block diagram showing the structure of a nonvolatile semiconductor memory device 1000 according to an embodiment 1 of the present invention.

FIG. 1 is a schematic block diagram showing the structure of a nonvolatile semiconductor memory device 1000 according to an embodiment 1 of the present invention.

Referring to FIG. 1, the nonvolatile semiconductor memory device 1000 includes an address buffer 102 for receiving external address signals A0 to Ai and outputting a corresponding internal row address signal Ax and a corresponding internal column address signal Ay, a memory cell array 104 having memory cells arranged in rows and columns, a WL decoder 106 for receiving the internal row address signal Ax and selecting a corresponding row (word line) of the memory cell array 104, a memory cell SL decoder 132 for receiving the internal row address signal Ax and selecting a cell selector line provided for each pair of rows of the memory cell array 104, and a Y decoder 108 for receiving the internal column address signal Ay from the address buffer 102 and selecting a corresponding column of the memory cell array 104.

For simplifying the illustration, it is assumed here that the memory cell array 104 has memory cells of four rows by two columns in the nonvolatile semiconductor memory device 1000 shown in FIG. 1. In practice, the nonvolatile semiconductor memory device 1000 includes more memory cells in its memory cell array 104.

The memory cell array 104 includes memory cell transistors MT1a and MT2a selected by a word line WL1, memory cell transistors MT1b and MT2b selected by a word line WL2, memory cell transistors MT3a and MT4a selected by a word line WL3, and memory cell transistors MT3b and MT4b selected by a word line WL4.

Each of the memory cell transistors MT1a to MT4b is the so-called floating gate transistor having a source region and a drain region formed on a major surface of a semiconductor substrate provided with the nonvolatile semiconductor memory device 100, a channel region held between the source and drain regions, a floating gate formed on the channel region through a tunnel oxide film, and a control gate formed above the floating gate through an insulating film.

Namely, the control gate of each of the memory cell transistors MT1a to MT4b is connected to the corresponding word line WL.

In the embodiment 1, the memory cells including the memory cell transistors MT1a to MT4b are referred to as memory cells MC1a to MC4b respectively.

The drains of the memory cell transistors MT1a, MT1b, MT3a and MT3b are connected to a bit line BL1 respectively, while those of the memory cell transistors MT2a, MT2b, MT4a and MT4b are connected to a bit line BL2 respectively.

In the memory cell array 104, the sources of the memory cell transistors MT1a and MT1b are connected with each other, and a bipolar transistor BT1 is provided to have a base connected with the node between these sources, an emitter connected with a corresponding cell selector line SL and a collector receiving a ground potential.

Similarly, a bipolar transistor BT2 is provided in correspondence to a node between the sources of the memory cell transistors MT2a and MT2b, a bipolar transistor BT3 is provided in correspondence to a node between the sources of the memory cell transistors MT3a and MT3b, and a bipolar transistor BT4 is provided in correspondence to a node between the sources of the memory cell transistors MT4a and MT4b.

The emitter of the bipolar transistor BT2 is connected with a cell selector line SL1, and those of the bipolar transistors BT3 and BT4 are connected with a cell selector line SL2.

The collectors of the bipolar transistors BT2 to BT4 also receive the ground potential, similarly to the bipolar transistor BT1.

Thus, the bipolar transistors BT1 to BT4 are provided for the corresponding pairs of memory cell transistors respectively.

The WL decoder 106 selects the corresponding one of the word lines WL1 to WL4 in response to the internal row address signal Ax supplied from the address buffer 102.

The memory cell SL decoder 132 selects the corresponding one of the cell selector lines SL1 and SL2 in response to the internal row address signal Ax.

The nonvolatile semiconductor memory device 1000 further includes a high voltage generation circuit 110 for receiving an external power supply voltage Vcc and generating a high voltage necessary for an operation for writing or erasing data from any memory cell, a negative voltage generation circuit 112 for receiving the external power supply voltage Vcc and generating a negative voltage necessary in a write, erase or read operation of the memory cell array 104, and a well potential driving circuit 120 for receiving an output of the high voltage generation circuit 110 or the external power supply voltage Vcc and controlling well potentials formed by the memory cell transistors MT1a to MT4b on the surface of the semiconductor substrate.

The WL decoder 106 receives outputs of the high voltage generation circuit 110 and the negative voltage generation circuit 112, for supplying a prescribed negative voltage and a high voltage to the selected word line WL in the erase and write operations respectively.

The memory cell SL decoder 132 receives the output of the high voltage generation circuit 110 and the ground potential, for supplying a prescribed high potential or the ground potential to the selected cell selector line SL in the write operation.

The memory cell SL decoder 132 may receive the output from the high voltage generation circuit 110 for applying a high voltage to the selected cell selector line SL in the data erase operation for any memory cell, as described later.

The nonvolatile semiconductor memory device 1000 further includes a write/erase control circuit 122 for controlling the write and erase operations for any memory cell, a data input/output buffer 124 for receiving external data and outputting the same to the internal circuit or receiving data read from any memory cell and outputting the same to the exterior, a data driver 126 for receiving write data inputted in the data input/output buffer 124 and driving the potential of the corresponding word line WL, and a sense amplifier 127 for outputting corresponding read data through the cell selector line SL1 or SL2 in response to storage information of the selected memory cell in data reading.

The data driver 126 makes the WL decoder 106 output a prescribed potential level responsive to the data to be written in each memory cell transistor.

The bit lines BL1 and BL2 receive the output from the negative voltage generation circuit 112 through column selector gates SLG1 and SLG2 respectively, while the Y gate 108 controls gate potentials of the selector gates SLG1 and SLG2.

Therefore, the prescribed negative voltage from the negative voltage generation circuit 112 is applied to a selected bit line BL in response to the internal column address signal Ay from the address buffer 102.

While it is assumed that the memory cell transistors MT1a to MT4b are P-channel transistors with reference to FIG. 1 and in the following description, the present invention is not restricted to this but can also be applied to N-channel memory cell transistors following polarity changes of applied voltages or the like, as clarified through the following description.

Figure 2:
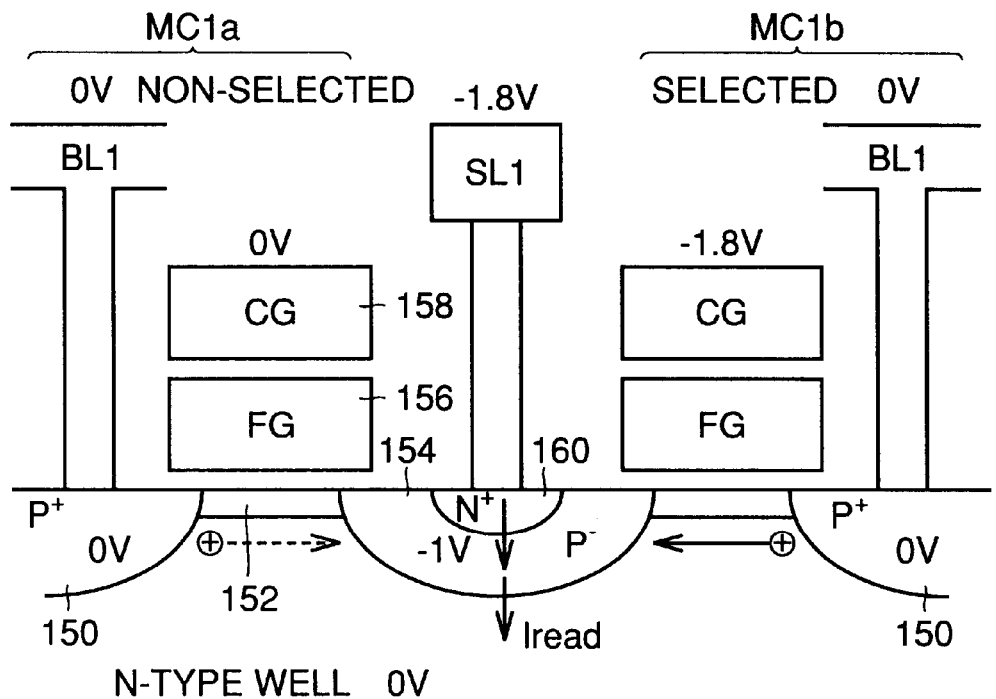
FIG. 2 is a conceptual diagram showing the structures of memory cells according to the embodiment 1 of the present invention.

FIG. 2 is a schematic block diagram showing the sectional structures of the memory cell transistors shown in FIG. 1.

FIG. 2 shows the sectional structures of the memory cell transistors MC1a and MC1b connected to the bit line BL1 and the bipolar transistor BT1 among the memory cell transistors MC1a to MC4b shown in FIG. 1.

Referring to FIG. 2, it is assumed that the memory cell transistors MC1a and MC1b are in non-selected and selected states respectively.

The memory cell transistor MC1a includes a drain region 150 formed in an N-type well on the major surface of the semiconductor substrate and doped with a high-concentration P-type impurity, a source region 154 doped with a P-type impurity in a lower concentration as compared with the drain region 150, a channel region 152 held between the drain region 150 and the source region 154, a floating gate 156 formed on the channel region 152 through a tunnel oxide film (e.g., an $SiO_2$ film of 10 nm in thickness), and a control gate 158 formed on the floating gate 156 through an insulating film (e.g., a multilayer film (hereinafter referred to as an ONO film) of silicon oxide/silicon nitride/silicon oxide).

The memory cell transistor MC1b is similar in structure to the memory cell transistor MC1a, except that the same shares the source region 154 with the memory cell transistor MC1a and components thereof are mirror-symmetrical with those of the memory cell transistor MC1a with respect to the source region 154.

An emitter region 160 doped with a high-concentration N-type impurity is formed on a surface side of the source region 154, to be completely enclosed with this source region 154 except the major surface of the semiconductor substrate.

The drain region 150 is connected with the bit line BL1, and the emitter region 162 is connected with the cell selector line SL1.

The source region 154 of the memory cell transistors MC1a and MC1b also serves as a base region of the bipolar transistor BT1.

Namely, the bipolar transistor BT1 is formed with an emitter defined by the N-type region 160, a base region defined by the P-type region 154 and a collector region defined by the N-type well.

In the non-selected memory cell transistor MT1a, the bit line BL1 is held at the potential of 0 V, and the potential of the control gate 158 is also held at 0 V.

In the selected memory cell transistor MT1b, on the other hand, the potential of the bit line BL1 is 0 V, the potential level of a control gate CG is −1.8 V, and that of the cell selector line SL1 is also −1.8 V.

On the other hand, the potential level of the N-type well is held at 0 V.

While the potential levels of the selected cell selector line SL1 and the control gate CG are identical to each other in FIG. 2, the present invention is not restricted to this, as clarified in the following description.

Namely, the potential level of the selected control gate CG may be at another value, in response to the threshold voltage of the memory cell transistor MC1b shifted following a write operation.

Figure 3:
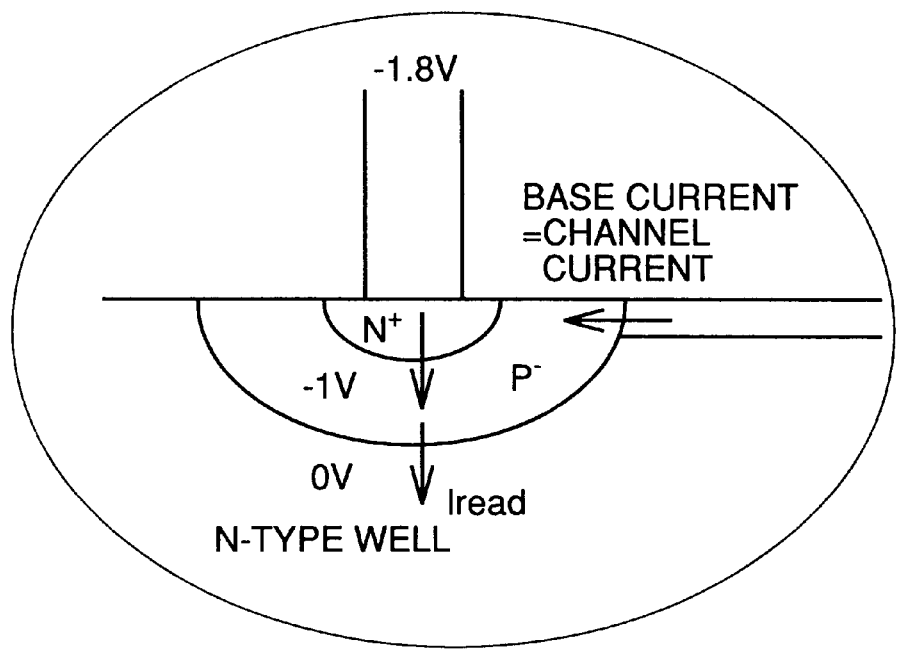
FIG. 3 is a model diagram showing flows of currents in a memory cell read operation according to the embodiment 1 of the present invention.

FIG. 3 is a conceptual diagram for illustrating currents flowing through an NPN transistor part formed by the N-type emitter region 160, the P-type base region 154 and the N-type well region (collector region) in the structure shown in FIG. 2.

In the example shown in FIG. 3, it is assumed that a current flows between the source and the drain of the memory cell transistor MT1b since the potential level of its control gate CG is −1.8 V.

Therefore, the source region 154 of the memory cell transistor MT1b, i.e., the base region of the bipolar transistor BT1, is biased to a positive side potential, e.g., a potential of −1 V, as compared with the emitter region 160 connected with the cell selector line SL1 held at the potential level of −1.8 V, in response to the potential level of 0 V of the bit line BL1.

Therefore, the emitter region 160 and the base region 154 of the NPN transistor are forward-biased.

In response to this, a channel current flows from a drain region 150 of the selected memory cell transistor MT1b through its channel region, to flow into the source region 154 (i.e., the P-type base region) as a base current of the bipolar transistor BT1. In response to this, a read current Iread (collector current) flows from the emitter region 160 to the N-type well region serving as the collector region.

A current obtained by amplifying the channel current flowing in the selected memory cell transistor MT1b in response to the current amplification factor of the bipolar transistor BT1 in an emitter grounded state flows through the cell selector line SL1 as the read current Iread.

In the non-selected memory cell transistor MT1a, on the other hand, the potential level of the control gate 158 is held at 0 V, and hence a current flowing through the channel of this transistor MT1a is substantially negligible.

While the bipolar transistor BT1 is an NPN transistor in the above description, the present invention is not restricted to this but each memory cell transistor may be an N-channel transistor, and each bipolar transistor may include a PNP transistor having an emitter defined by a P-type region formed in an N-type source region, a base defined by the N-type source region and a collector defined by a P-type well region provided with the memory cell transistor, as clarified in the following description.

Figure 4:
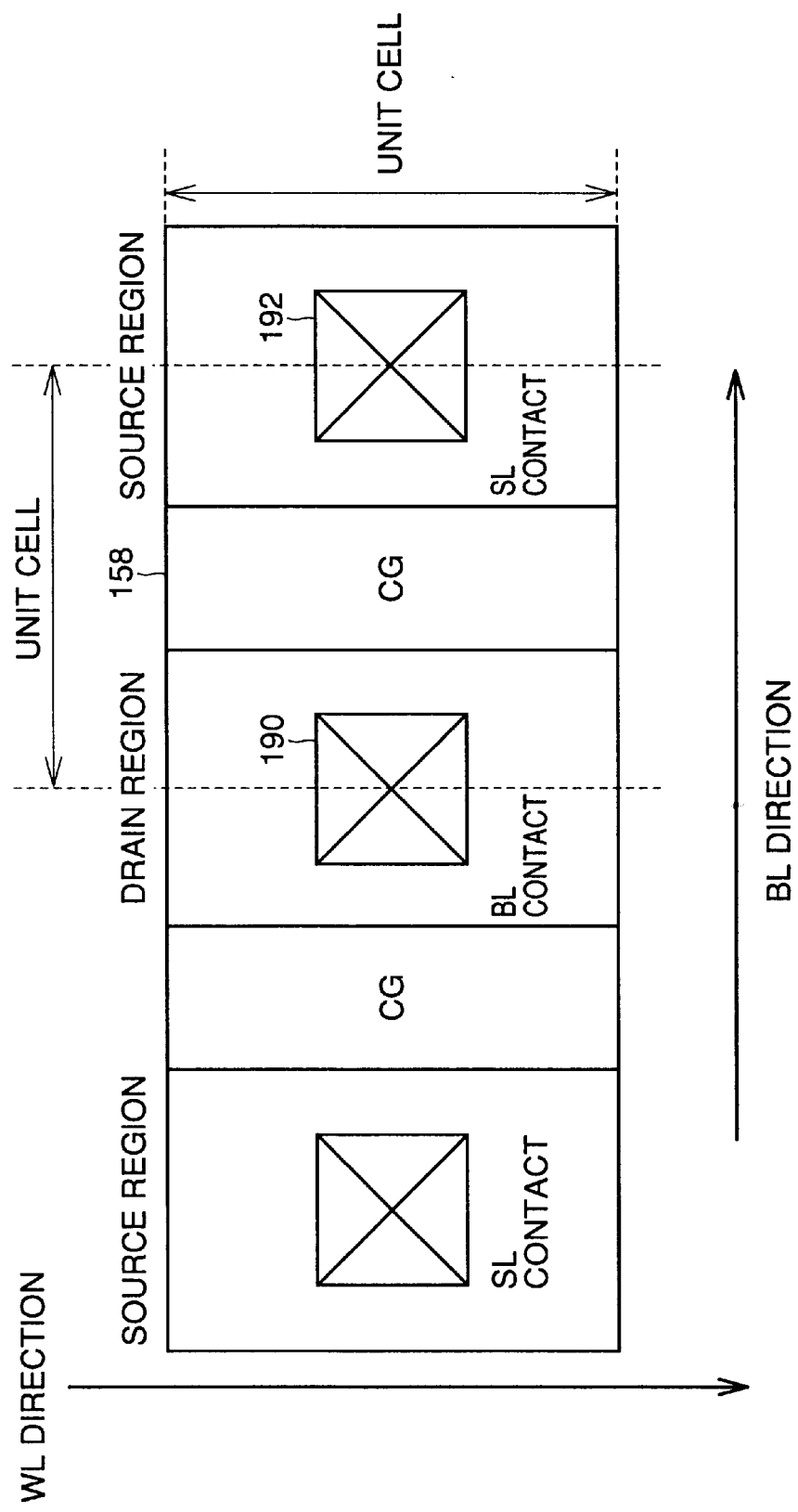
FIG. 4 is a plan view showing the plane pattern of the memory cell according to the embodiment 1 of the present invention.

FIG. 4 is a model diagram showing the plane pattern of each memory cell transistor shown in FIG. 1.

The drain and source regions are provided on both sides of the control gate 158, and the length of a unit cell along the bit line BL direction is defined by that between the centers of the drain and source regions.

The drain region is provided with a bit line contact 190 for electrically connecting the drain region with the bit line BL1, and the source region is provided with a cell selector line contact 192 for coming into contact with the emitter region 160 provided therein.

Figure 5:
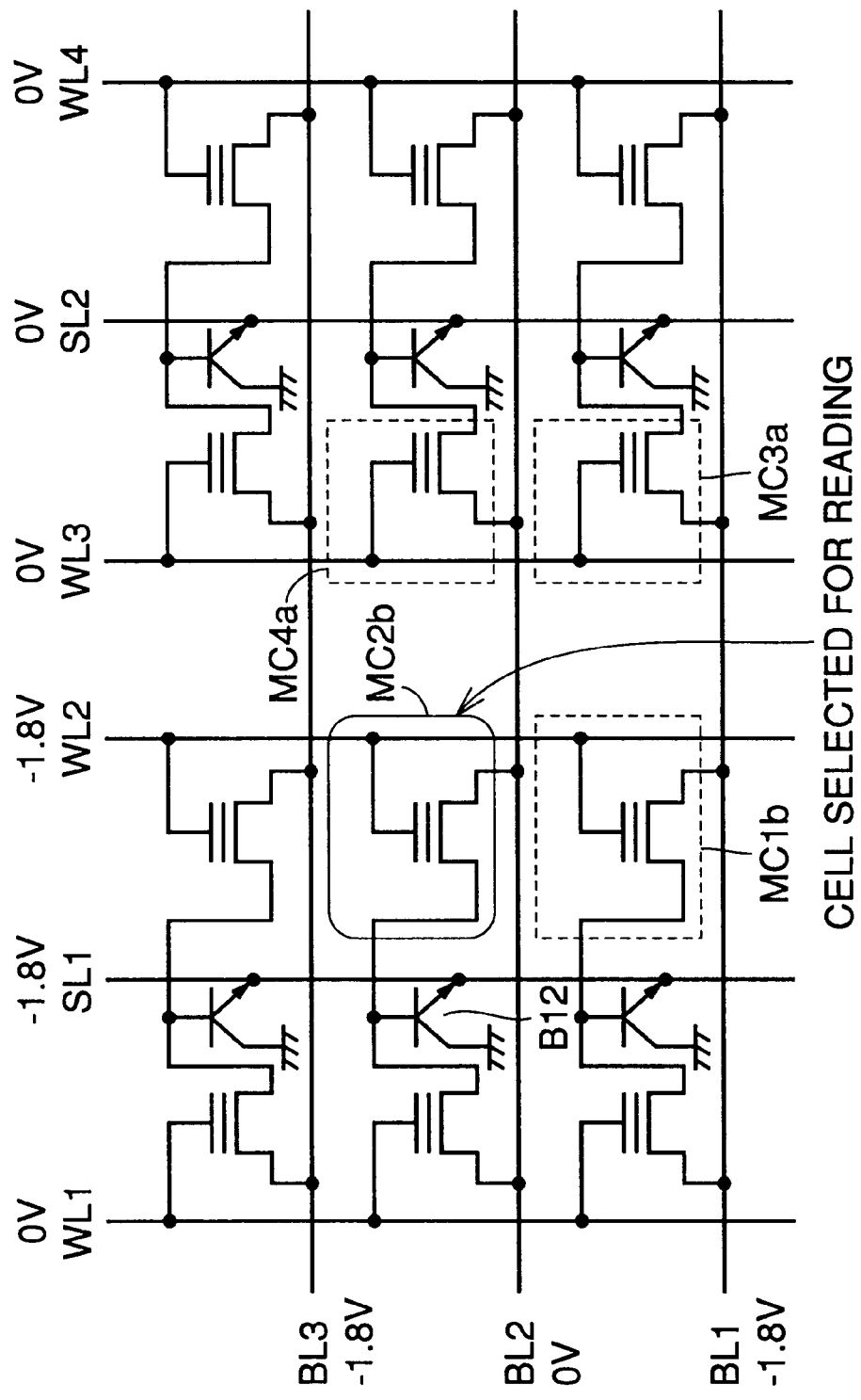
FIG. 5 is a circuit diagram for illustrating the structure of a memory cell array 104.

FIG. 5 is a circuit diagram showing the structure of the memory cell array 104 shown in FIG. 1 in more detail.

It is assumed that the memory cell transistor MC2b is selected in FIG. 5.

Namely, it is assumed that the potential level of the bit line BL1 connected with the drain of the memory cell transistor MC2b is held at 0 V, and those of the remaining bit lines BL1 and BL3 are held at −1.8 V.

Further, it is assumed that the potential level of the word line WL2 connected with the memory cell transistor MC2b is held at −1.8 V, and those of the remaining word lines WL1, WL3 and WL4 are held at 0 V.

It is also assumed that the potential level of the cell selector line SL1 connected with the emitter of the bipolar transistor BT2 provided in correspondence to the memory cell transistors MC2a and MC2b is held at −1.8 V, and that of the remaining cell selector line SL2 is held at 0 V.

Figure 6:
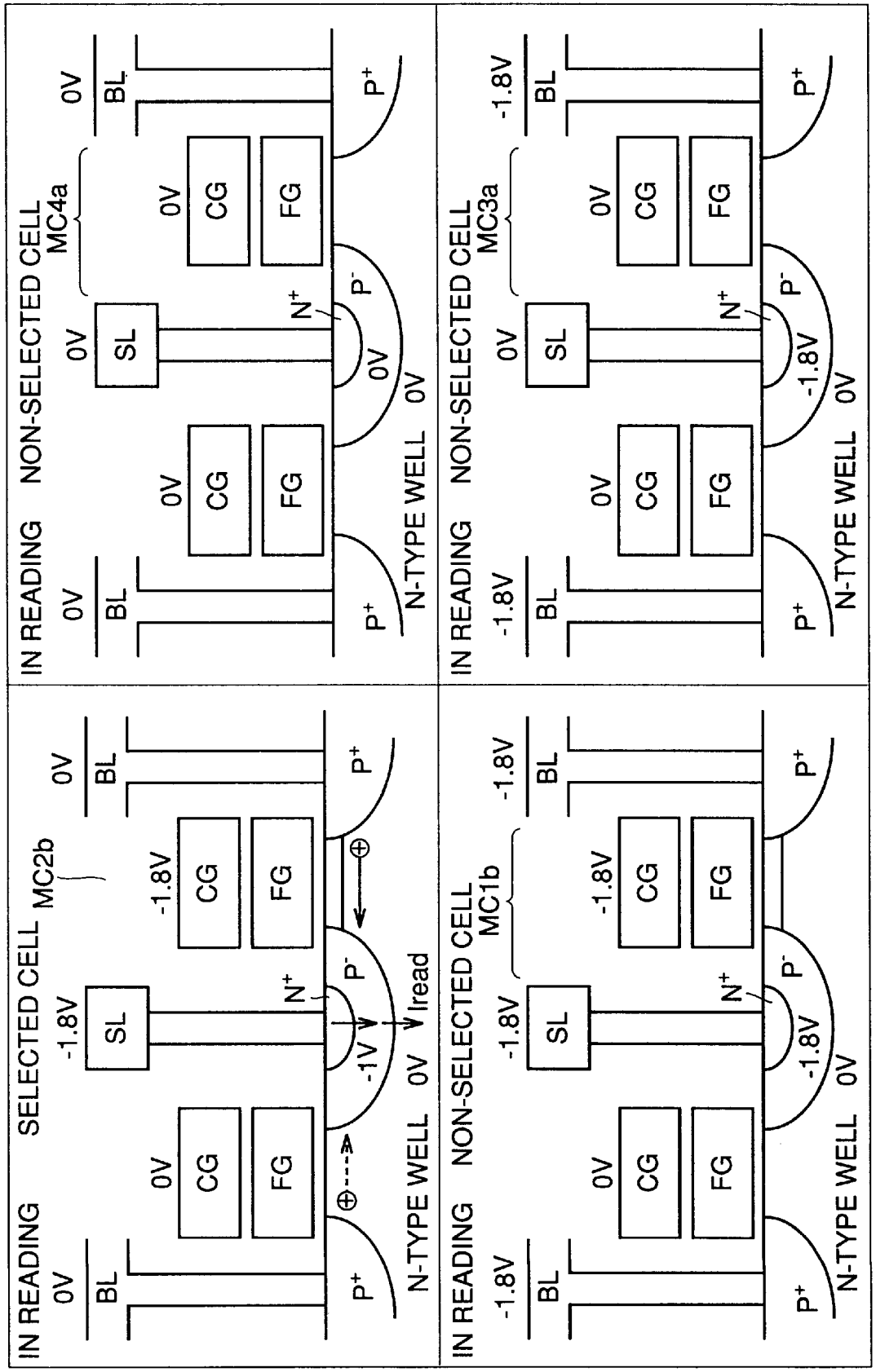
FIG. 6 is a model diagram for illustrating potential distributions of selected and non-selected memory cell transistors.

FIG. 6 is a model diagram showing the levels of potentials applied to the memory cell transistor MC2b selected in reading as shown in FIG. 5 and the non-selected memory cell transistors MC1b, MC4a and MC3a respectively.

Referring to FIG. 6, the potential levels of the cell selector line SL and the control gate CG are at −1.8 V and that of the bit line BL is held at 0 V in the selected memory cell transistor MC2b, as described with reference to FIG. 3. On the other hand, the potential level of the N-type well is 0 V.

When the memory cell transistor MC2b is in a conducting state since the potential level of the control gate CG is −1.8 V, therefore, an emitter current flows from the cell selector line SL toward the bipolar transistor BT2 formed in the source region 154 of the memory cell transistor MC2b as the read current Iread.

In the non-selected memory cell transistor MC4a, on the other hand, the potential levels of the cell selector line SL, the bit line BL and the control gate CG are 0 V. A base-emitter junction is not forward-biased whether the memory cell transistor MC4a is in a conducting state or not at the potential level of the word line (i.e., the potential level of the control gate CG), and hence no current flows to the cell selector line SL.

Namely, no current flows to the cell selector line SL2 connected with the memory cell transistor MC4a, regardless of the value of data held in the memory cell transistor MC4a.

In the non-selected memory cell transistor MC1b, the potential levels of the bit line BL, the control gate CG and the cell selector line SL are held at −1.8 V, while that of the N-type well is held at 0 V.

In this case, no forward bias is caused between the emitter and base regions of the bipolar transistor BT1 even if the memory cell transistor MC1b is in a conducting state due to the potential level (−1.8 V) of its control gate CG, since the potential level of the bit line BL is held at −1.8 V.

Therefore, no current resulting from the memory cell transistor MC1b flows to the cell selector line SL1 connected with the non-selected memory cell transistor MC1b.

In the non-selected memory cell transistor MC3a, the potential level of the bit line BL is held at −1.8 V, while those of the control gate CG, the cell selector line SL and the N-type well are held at 0 V.

Also in this case, an emitter-base junction of the bipolar transistor BT3 is reverse-biased even if the non-selected memory cell transistor MC3a is in a conducting state since the potential level of the bit line BL is −1.8 V and that of the cell selector line SL supplying a potential level to its emitter is 0 V, and no emitter current flows from the cell selector line SL toward the bipolar transistor BT3.

Also in this case, therefore, no current resulting from the non-selected memory cell transistor MC3a flows to the cell selector line SL2.

When the potential levels shown in FIG. 5 are supplied to the bit line BL2, the cell selector line SL1 and the word line WL2 respectively, the current amplified by the bipolar transistor BT1 flows to the cell selector line SL1 in response to data held in the memory cell transistor MC2b connected to the intersection between the bit line BL2 and the word line WL2, as described above.

Further, no currents result from the non-selected memory cell transistors MC1b, MC3a and MC4a which are present around the selected memory cell transistor MC2b.

Thus, it is possible to read information from the selected memory cell by detecting the value of the current flowing to the cell selector line SL1 by the sense amplifier 127.

[Write Operation]

Figure 7:
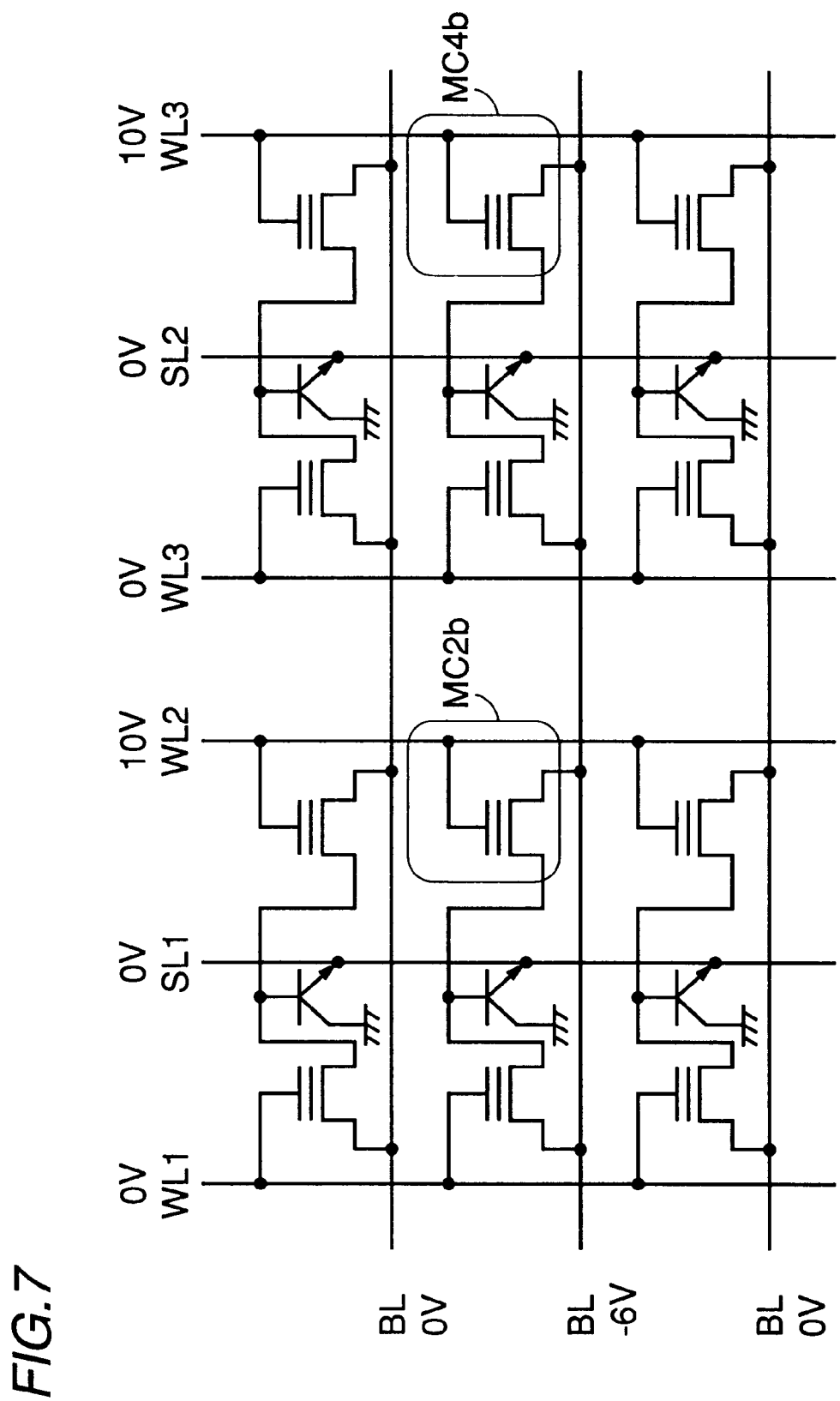
FIG. 7 is adapted to illustrate the potential arrangement in a write state of the memory cell array 104.

FIG. 7 is a conceptual diagram for illustrating the potential levels of the bit lines BL, the word lines WL and the cell selector lines SL in case of writing data in the memory cell transistors MC2b and MC4b in the memory cell array 104 shown in FIG. 1.

As clarified in the following description, it is possible to simultaneously write data in memory cell transistors which are connected to the same bit line, by changing the potential levels of the word lines connected with these memory cell transistors respectively.

Namely, the potential level of the bit line BL2 connected with the drains of the memory cell transistors MC2b and MC4b in common is held at −6 V. The potential levels of the cell selector lines SL1 and SL2 are held at 0 V.

On the other hand, the potential levels of the word line WL2 connected with the memory cell transistor MC2b for data writing and the word line WL3 connected with the gate of the memory cell transistor MC4b for data writing are held at 10 V respectively.

It is assumed that the potential level of the remaining word line WL1 is held at 0 V.

Figures 8, 9:
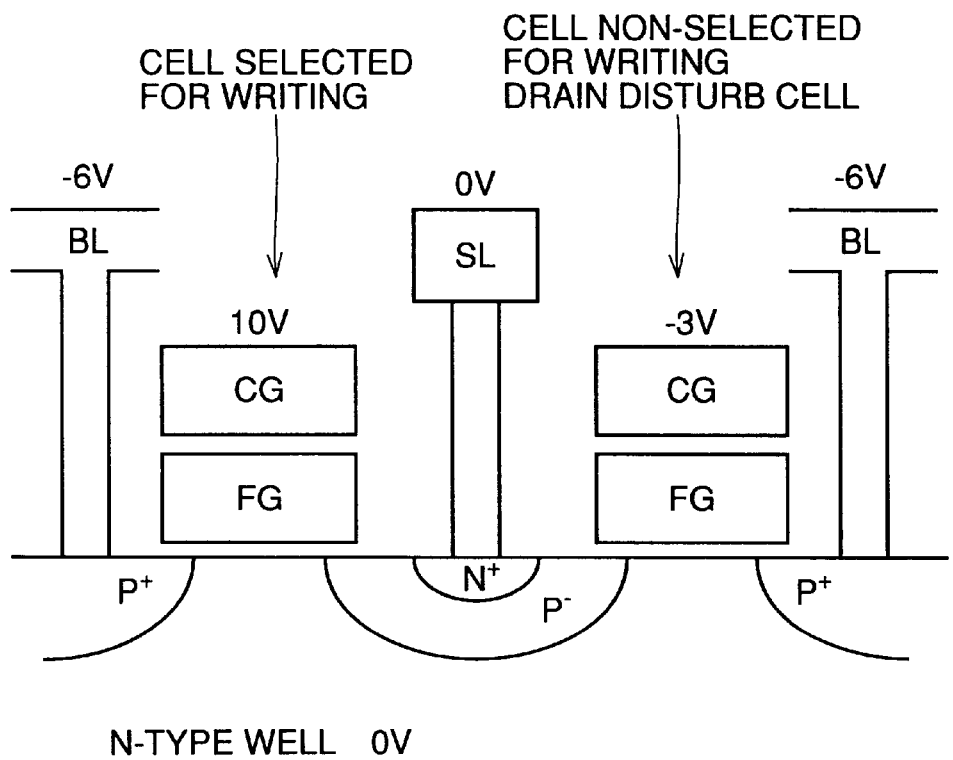
FIG. 8 is adapted to illustrate an exemplary potential arrangement in the memory cells in the write state.
FIG. 9 is adapted to illustrate another exemplary potential arrangement in the memory cells in the write state.

FIG. 8 shows the potential levels of the bit lines BL, the word lines WL and the cell selector lines SL in the write operation shown in FIG. 7, in relation to the selected and non-selected memory cells.

In relation to each selected memory cell, the potential levels of the bit line BL, the word line WL and the cell selector line SL are held at −6 V, 10 V and 0 V respectively.

On the other hand, the potential levels of all bit lines BL, word lines WL and cell selector lines SL connected to the non-selected memory cell transistors are held at 0 V.

Due to this potential arrangement, electrons generated in band-to-band tunnel currents in the vicinity of the drain regions 150 are injected into the floating gates 156 through the tunnel oxide films present between the floating gates 156 and the channel regions 152 in the selected memory cell transistors MC2b and MC4b, so that data are written therein.

In this case, holes are pulled toward the drain regions 150 among electron hole pairs generated by the band-to-band tunnel currents in the vicinity of the drain. regions 150 and hole-to-hole scattering is caused in the drain regions 150 due to high concentrations of the holes, whereby the holes lose energy and are not converted to hot holes having high energy.

Even if hot holes are present, no hot hole injection is possible since the potential levels of the word lines WL are 10 V and the floating gates 156 are at positive potentials.

Thus, the tunnel oxide films can be prevented from deterioration by hot hole injection.

In the write operation described with reference to FIGS. 7 and 8, the potential levels of the non-selected word lines WL performing no data writing, i.e., those of the control gates CG of the memory cell transistors are held at 0 V.

In order to prevent the so-called drain disturb failure in which the storage content of a non-selected bit whose drain is connected with a bit line common with a selected bit by a drain electric field in a write operation, however, a non-selected control gate is preferably at a potential level relaxing a gate-to-drain electric field.

Namely, a negative potential of about −3 V is preferably applied to the non-selected control gate in response to the potential level of −6 V of the bit line BL connected to the selected bit in the example described with reference to FIGS. 7 and 8.

When a negative voltage is applied to a non-selected word line in order to enlarge a drain disturb margin in a control gate of a conventional single-transistor type flash memory cell, the overall potential of a source line is reduced to a negative level so that the channel of the overall memory cell enters an OFF state since the source line of the memory cell is connected in common.

If the potential of the source line is reduced to a negative level, resistance against the so-called gate disturb failure in which the storage content of a non-selected bit connected to a gate wire (word line) common with a selected bit is changed by a gate electric field in a write operation is remarkably deteriorated.

However, no such problem is caused in the structure shown in FIGS. 1 and 2 in which the sources of the memory cell transistors are connected with the bases of the bipolar transistors and the cell selector lines control the potential levels of the emitters of the bipolar transistors independently of each other.

Therefore, it is possible to further prevent occurrence of a drain disturb failure by applying a negative voltage to the control gates (word lines) of the non-selected memory cell transistors in the write operation.

[Erase Operation]

Figures 10, 11, 12:
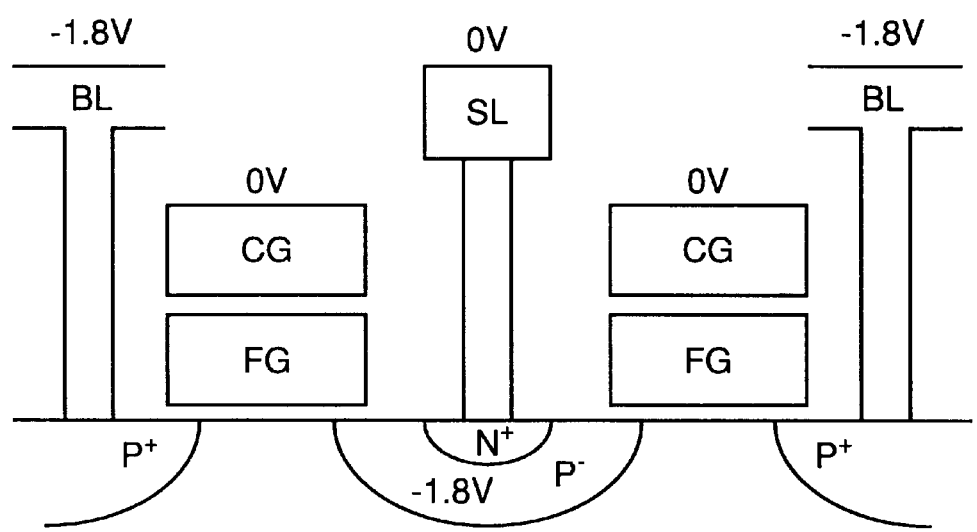
FIG. 10 illustrates a first exemplary potential arrangement in an erase operation for the memory cell according to the embodiment 1 of the present invention.
FIG. 11 illustrates a second exemplary potential arrangement in the erase operation for the memory cell according to the embodiment 1 of the present invention.
FIG. 12 illustrates a first exemplary potential arrangement in a standby state of the memory cells according to the embodiment 1 of the present invention.

FIG. 10 illustrates an exemplary potential distribution of the bit line BL, the word line WL, the cell selector line SL and the well in case of performing an erase operation on the memory cell illustrated with reference to FIG. 2.

In the example shown in FIG. 10, potentials of 0 V and −18 V are applied to the bit line BL, i.e., the drain region of the memory cell transistor and the word line WL, i.e., the control gate of the memory cell transistor, while the potential of the cell selector line SL, i.e., the emitter potential of the bipolar transistor having the emitter region in the source region of the memory cell transistor and the well potential are held at 0 V respectively. Thus, a channel layer of holes is formed in the channel region 152 shown in FIG. 2.

A strong electric field is applied to the tunnel oxide film between the channel layer and the floating gate electrode 156, so that electrons are extracted from the floating gate electrode 156 to the channel layer by an F-N tunnel phenomenon.

Due to such an erase operation, the memory cell enters a "High Vth" state (a state having a high threshold voltage Vth: the absolute value is increased with a negative sign since this is a P-channel transistor).

The potential arrangement shown in FIG. 10 is effective when the well is not divided for erased blocks but the well potential is common in the memory cell array 104 shown in FIG. 1.

FIG. 11 illustrates another exemplary potential arrangement of the bit line BL, the word line WL, the cell selector line SL and the well in case of performing an erase operation on the memory cell illustrated with reference to FIG. 2.

In the erase operation shown in FIG. 11, a potential of −12 V is applied to the word line WL, i.e., the control gate 156, the potential of the cell selector line SL, i.e., the emitter potential of the bipolar transistor having an emitter region in the source region of the memory cell transistor and the well potential are set at 6 V, and the bit line BL, i.e., the drain region of the memory cell transistor is brought into an open state.

Also in case of the aforementioned potential arrangement, a channel layer of holes is formed in the channel region 152 shown in FIG. 2, similarly to the case described with reference to FIG. 10. Further, a strong electric field is applied between the channel layer and the floating gate 156, whereby electrons are extracted from the floating gate 156 to the channel layer by an F-N tunnel phenomenon.

Namely, the memory cell enters a "High Vth" state, similarly to the case shown in FIG. 10.

The potential arrangement shown in FIG. 11, in which the well potential is set at the high level of 6 V, is effective when the well is divided for erased blocks so that the well potential driving circuit 120 shown in FIG. 1 can drive the potentials the divided wells independently of each other.

[Standby State]

Potential arrangements in a standby state of the memory cells illustrated with reference to FIG. 2 are now described.

Figure 13:
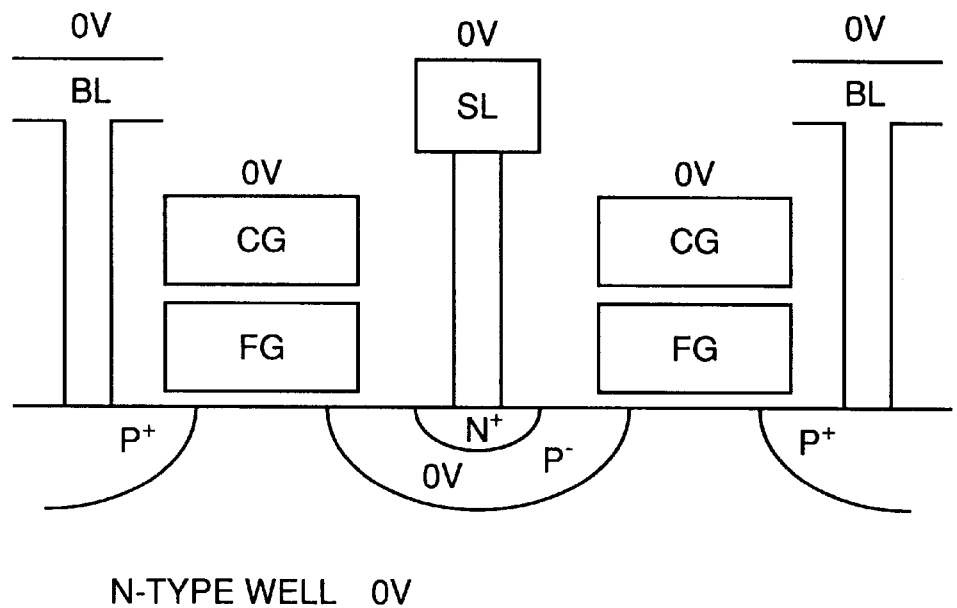
FIG. 13 illustrates a second exemplary potential arrangement in the standby state of the memory cells according to the embodiment 1 of the present invention.
Figure 14:
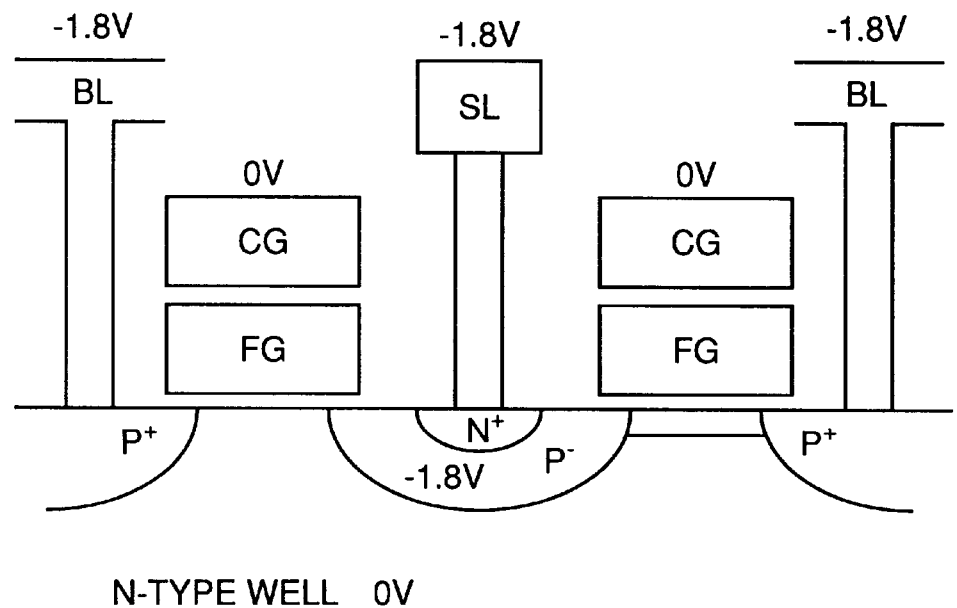
FIG. 14 illustrates a third exemplary potential arrangement in the standby state of the memory cells according to the embodiment 1 of the present invention.

FIGS. 12 to 14 illustrate exemplary potential arrangements possible in the standby state of the memory cells shown in FIG. 2 respectively.

Referring to FIG. 12, the potential levels of the bit lines BL are set at −1.8 V and those of the control gates CG are set at 0 V, for example, in the first exemplary potential arrangement in the standby state. The potential levels of the cell selector line SL and the N-type well are set at 0 V respectively.

Due to this potential arrangement, no current flows to the cell selector line SL in the standby state even if the memory cell transistors are in conducting states, since the emitter and the base of the bipolar transistor having the emitter region in the source region of the memory cell transistors are reverse-biased.

FIG. 13 shows another exemplary potential arrangement in the standby state.

Referring to FIG. 13, the potential levels of the bit lines BL and the control gates CG are held at 0 V respectively. The potential levels of the cell selector line SL and the N-type well are also held at 0 V.

Thus, all potential levels of the bit lines BL, the N-type well and the cell selector line SL are held at 0 V, whereby no current flows to the bipolar transistor having the emitter region in the source region of the memory cell transistors under such bias conditions.

Therefore, no excessive current flows to the cell selector line SL in the standby state.

FIG. 14 illustrates still another exemplary potential arrangement in the standby state of the memory cells shown in FIG. 2.

Referring to FIG. 14, the potential levels of the bit lines BL and the control gates CG are held at −1.8 V and 0 V respectively in the standby state. The potential levels of the cell selector line SL and the N-type well are held at −1.8 V and 0 V respectively.

Therefore, no current flows to the cell selector line SL in the standby state to increase power consumption even if the memory cell transistors are in conducting states when the potential levels of the control gates CG are held at 0 V, since the emitter and the base of the bipolar transistor having the emitter region in the source region of the memory cell transistors are not reverse-biased.

In the above description, it is assumed that the potential levels of the word lines WL, i.e., those of the control gates CG of the memory cell transistors are held at 0 V.

In the memory cells shown in FIG. 2, however, currents flow between the drains and the sources of the memory cell transistors only when the bipolar transistor enters an ON state in case of bringing the potentials of the word lines, i.e., those of the control gates CG into prescribed levels.

In other words, no current flows to the memory cells in the standby state when the potential levels of the cell selector line SL and the bit lines BL are so set that the bipolar transistor does not enter an ON state even if the potentials of the word lines WL are at an arbitrary level.

Therefore, it is also possible to employ the following potential arrangements in the standby state:

First, the potentials of the bit lines BL are set at −1.8 V, for example, those of the word lines WL are set at an arbitrary level, and those of the cell selector line SL and the N-type well are set at 0 V respectively.

In this case, the potentials of the bit lines BL are at a negative level and that of the cell selector line SL is 0 V, and hence the emitter and the base of the bipolar transistor are reverse-biased and no current flows to the memory cell transistors even if the same are in conducting states.

Second, the potentials of the bit lines BL are set at 0 V, those of the word lines WL are set at an arbitrary level, and that of the cell selector line SL is set at 0 V.

Also in this case, the bipolar transistor does not enter an ON state even if the memory cell transistors are in conducting states, since the potentials of the bit lines BL and the cell selector line SL are 0 V.

Therefore, no current flows to the memory cells in the standby state.

Third, the potentials of the bit lines BL are set at −1.8 V, those of the word lines WL are set at an arbitrary level, and that of the cell selector line SL is set at −1.8 V.

Also in this case, the bipolar transistor does not enter an ON state even if the memory cell transistors are in conducting states since the potential levels of the cell selector line SL and the bit lines BL are −1.8 V.

Thus, no current flows to the memory cells to increase power consumption in the standby state.

In the above case, further, the potentials of the word lines WL can be set at an arbitrary level in the standby state.

When the potential levels of the word lines WL are previously set at a read voltage also in the standby state, therefore, data can be read by driving only the potential levels of the bit lines BL and the cell selector line SL, for increasing the speed of the read operation.

When the potentials of the word lines WL can be set at an arbitrary level in the standby state, i.e., when sufficient level differences are present between the threshold voltages Vth of the memory cell transistors in "High Vth" states and those in "Low Vth" states as operation margins, it is possible to adjust absolute values thereof to have arbitrary levels.

This means that the read voltage may not necessarily be set at a negative level but can be set at 0 V or a positive level in P-channel memory cell transistors.

If the potential levels of the word lines WL can be set at 0 V in reading, for example, the potential levels of the word lines WL can be fixed at the ground potential and may not be particularly driven.

This means that the speed of the read operation can be increased and a circuit for driving the potential levels of the word lines WL can be simplified.

In addition to the aforementioned potential arrangements in the standby state of the memory cells shown in FIG. 2, the power supply voltage Vcc can be applied to the N-type well in the standby state so that the remaining potentials are arranged along any of the potential arrangements described with reference to FIGS. 12 to 14 or the aforementioned first to third potential arrangements.

Thus, the threshold voltage Vth of the memory cell transistors can readily excess 0 V, for example. Namely, it is not necessary to apply a negative potential in case of selecting the word lines WL when the memory cell transistors are P-channel transistors.

Figure 15:
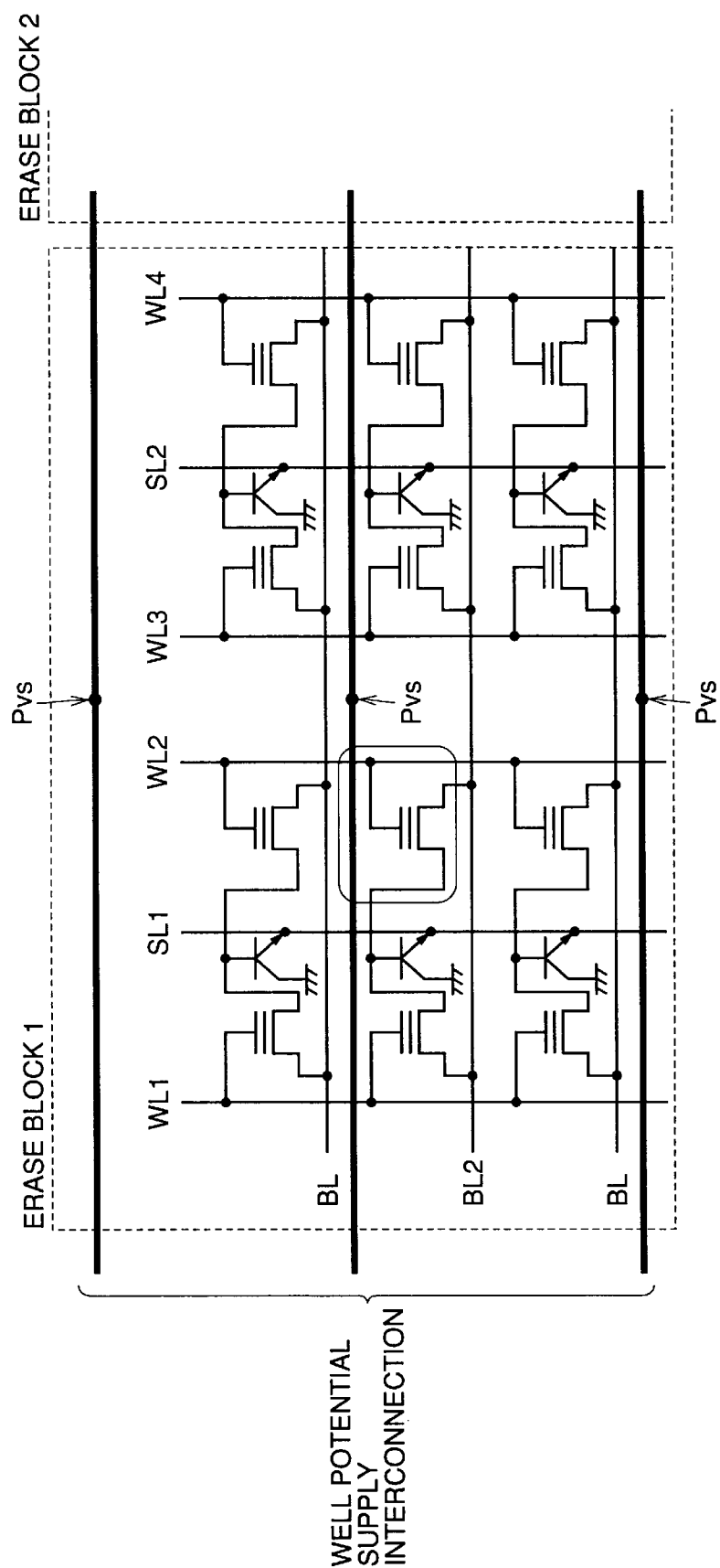
FIG. 15 is a plan view showing the structure of well potential supply wires in the memory cell array 104 according to the embodiment 1 of the present invention.

FIG. 15 is a schematic block diagram showing the structure of wires for supplying potentials to the well from the well potential driving circuit 120 in the structure of the memory cell array 104 shown in FIG. 1.

It is assumed that the memory cell array shown in FIG. 15 is present in the same erase block 1 in case of performing an erase operation.

Namely, it is assumed that FIG. 15 shows a memory cell array present in the same well in case of performing well division every erase block.

In the example shown in FIG. 15, at least two interconnections for supplying a well potential from the well potential driving circuit 120 are present in the same erase block.

The well potential supply interconnections, supplying the ground potential or a positive high voltage to the N-type well, are in contact with the N-type well at feeder points Pvs.

The bipolar transistors having the emitter regions in the source regions of the memory cell transistors have the well region as collector regions, and hence the level of the potential supplied by the well potential supply interconnections remarkably influences operations of the bipolar transistors.

When only a single well potential supply interconnection is provided in the erase block, for example, the collector resistance is effectively increased in each bipolar transistor separated from the position where the well potential supply interconnection is in contact with the well surface.

Thus, there is such a possibility that saturation characteristics of the bipolar transistor are deteriorated to cause difficulty in a correct read operation.

Therefore, it is possible to reduce such saturation of the bipolar transistors by arranging a plurality of well potential supply interconnections in the erase block, as shown in FIG. 15.

Figure 16:
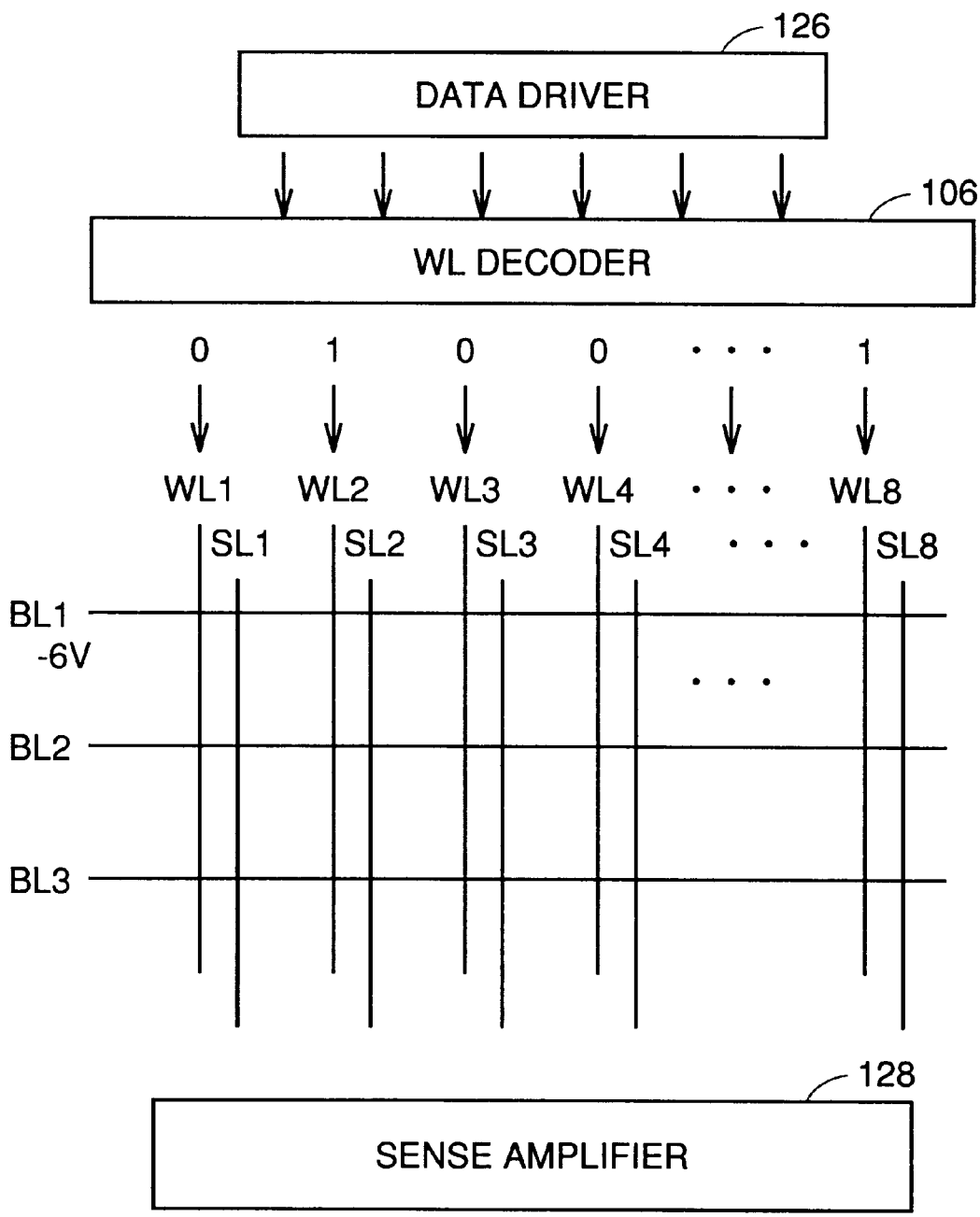
FIG. 16 is a conceptual diagram for illustrating a data write operation in the nonvolatile semiconductor memory device according to the embodiment 1 of the present invention.
Figure 17:
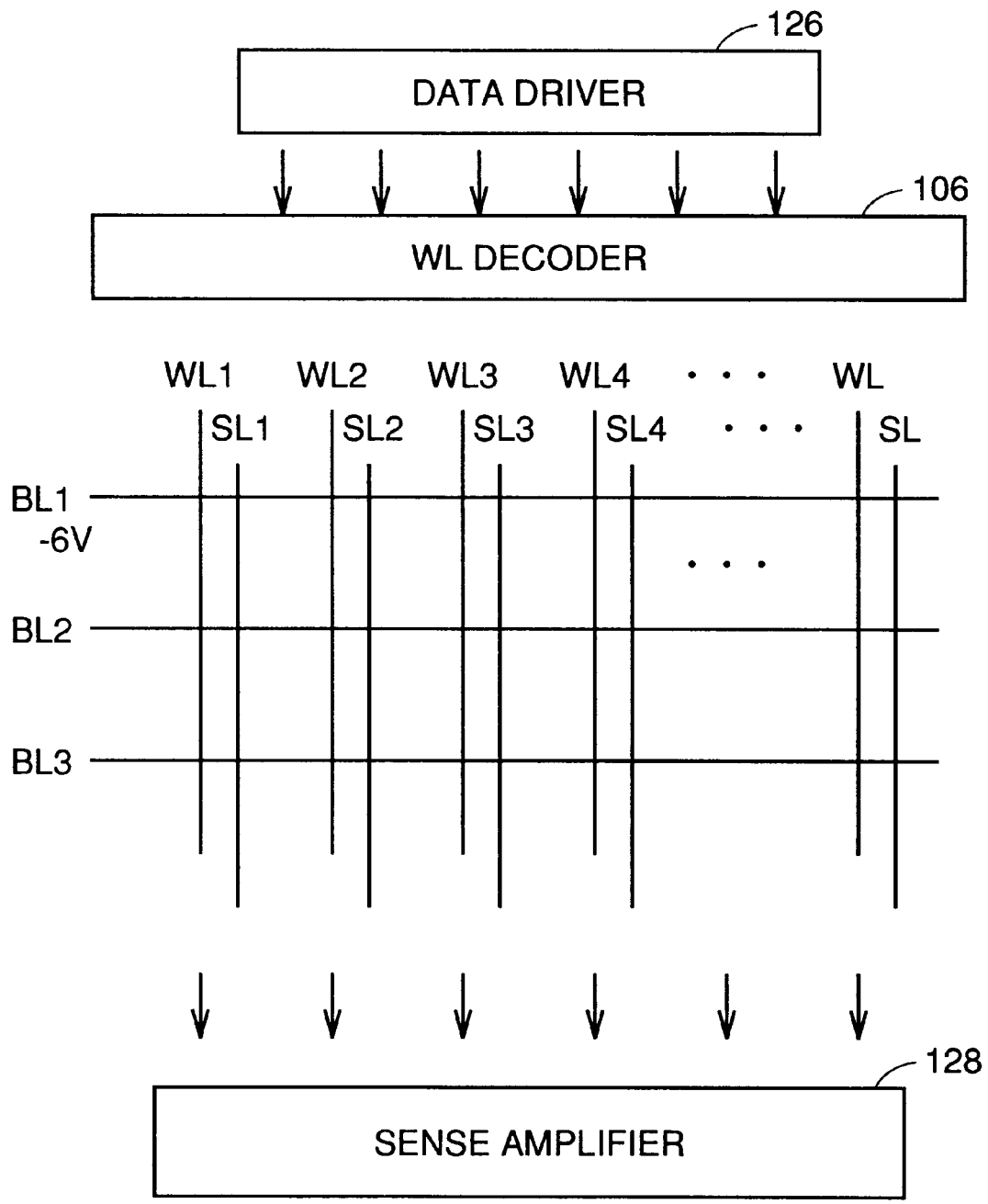
FIG. 17 is a conceptual diagram for illustrating a verify operation in the nonvolatile semiconductor memory device according to the embodiment 1 of the present invention.
Figure 18:
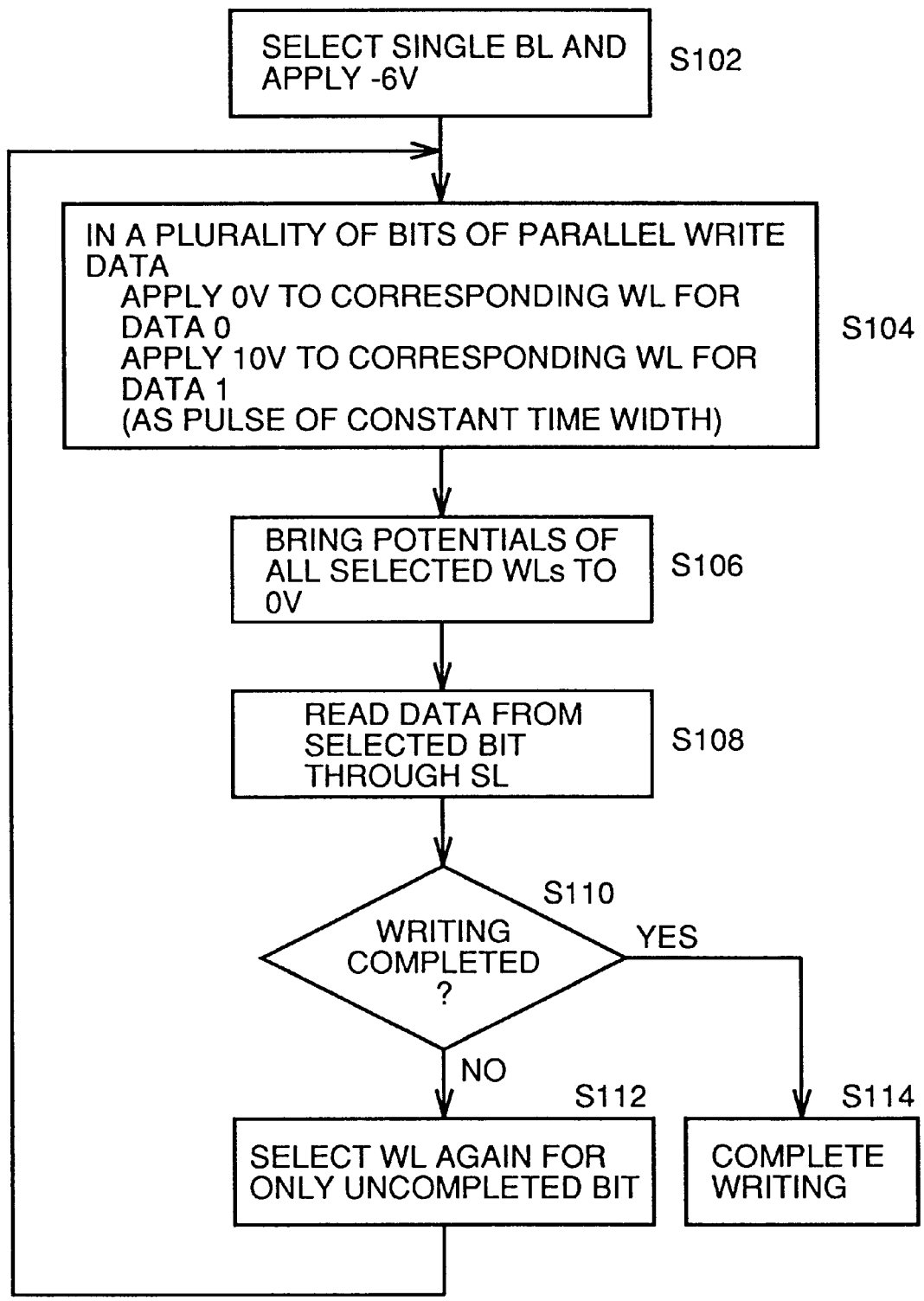
FIG. 18 is a flow chart for illustrating the data write operation in the nonvolatile semiconductor memory device according to the embodiment 1 of the present invention.

FIGS. 16 and 17 are conceptual diagrams for illustrating the operation of the nonvolatile semiconductor memory device 1000 illustrated in FIG. 1 in case of writing data in a plurality of memory cells on the same bit line in parallel with each other, and FIG. 18 is a flow chart for illustrating the flow of the parallel write operation processing.

With reference to FIGS. 16 and 18, an operation of applying write pulses to selected memory cells in parallel with each other is now described.

The Y decoder 108 selects a single bit line BL1, for example, in response to an address signal supplied to the address buffer 102 and brings the bit line selector gate SLG1 into a conducting state, thereby applying a potential of −6 V to the selected bit line BL1 (step S102).

Then, the data driver 126 makes the WL decoder 106 supply word lines WL1 to WL8 selected by the same with the following potential levels respectively in response to a plurality of data such as 8-bit data "0, 1, 0, 0, . . . , 1", for example, supplied through the data input/output buffer 124:

When the data to be written is 0, the WL decoder 106 applies 0 V to the corresponding word line WL. When the data to be written is 1, the WL decoder 106 applies 10 V to the corresponding word line WL. Such application is performed in the form of pulses of a constant time width (step S104).

Then, the WL decoder 106 brings all potentials of the selected plurality of word lines WL to 0 V (step S106).

With reference to FIGS. 17 and 18, a verify operation after the application of the write pulses is now described.

The memory cell SL decoder 132 supplies the sense amplifier 128 with read data through the cell selector lines SL1 to SL8 connected with selected memory cells. The sense amplifier 128 reads the data in parallel through the cell selector lines SL1 to SL8 (step S108).

The write/erase control circuit 122 compares the data read by the sense amplifier 128 with the write data supplied to the data driver 126, to determine whether or not the write operation is completed.

When determining that the write operation is completed for all selected memory cells, the write/erase control circuit 122 ends the write operation (step S114).

When determining that the write operation is not yet completed (step S110), on the other hand, the write/erase control circuit 122 makes the WL decoder 106 select only word line(s) corresponding to uncompleted bit(s) to apply a pulse of 0 V or 10 V of a constant time width to the corresponding word line(s) in response to whether rewritten data is 0 or 1 (step S104).

The aforementioned processing through the steps S104 and S112 is repeated until a determination is made that the write operation is completed for all selected bits. Thus, it is possible to write data in a plurality of bits of memory cells on the same bit line BL in parallel with each other.

In the aforementioned write operation, the verify operation is performed by driving the potential levels of the word lines WL in writing and reading data from selected cell selector lines SL in reading while fixing the potential level of the bit line BL at that in a selected state, whereby a high-speed data write operation is enabled.

Embodiment 2

A method of fabricating the nonvolatile semiconductor memory device 1000 shown in FIGS. 1 and 2 is now described with reference to FIGS. 19 to 30.

FIGS. 19 to 30 are sectional views showing first to twelfth steps of the method of fabricating the nonvolatile semiconductor memory device 1000 having the aforementioned structure.

Figure 19:
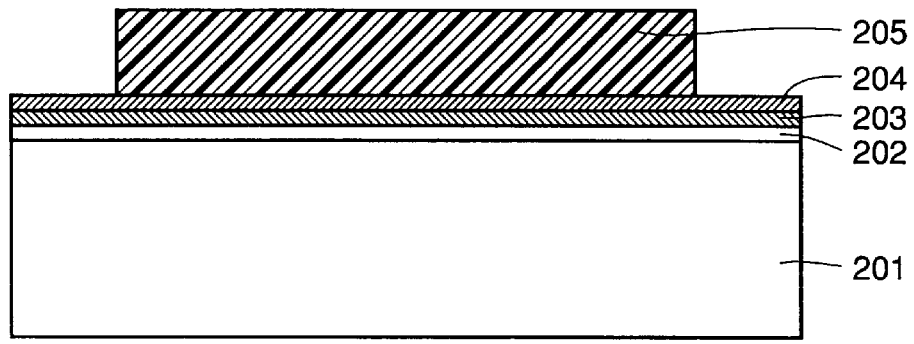
FIG. 19 is a sectional view showing a first step of a method of fabricating a memory cell transistor part of a nonvolatile semiconductor memory device according to an embodiment 2 of the present invention.

Referring to FIG. 19, an underlayer oxide film 202 of about 300 Å in thickness is formed on a major surface of a P-type silicon substrate 201. A polycrystalline silicon film 203 of about 500 Å in thickness is formed on the underlayer oxide film 202 by CVD (chemical vapor deposition). A silicon nitride film 204 of about 1000 Å is formed on the polycrystalline silicon film 203 by CVD or the like. A resist film 205 is formed on the silicon nitride film 204, to expose element isolation regions. This resist film 205 is employed as a mask for performing anisotropic etching, thereby etching parts of the silicon nitride film 204 and the polycrystalline silicon film 203 located on the element isolation regions.

Figure 20:
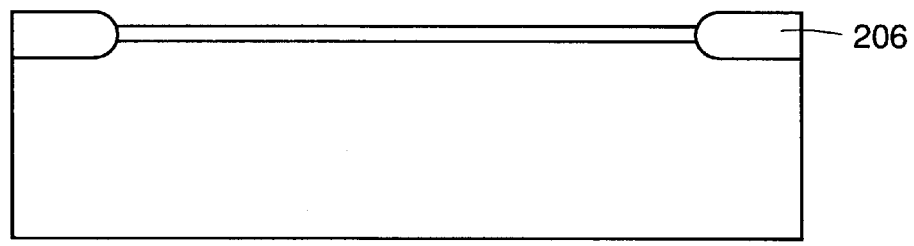
FIG. 20 is a sectional view showing a second step of the method of fabricating the memory cell transistor part of the nonvolatile semiconductor memory device according to the embodiment 2 of the present invention.

Thereafter the resist film 205 is removed and the silicon nitride film 204 is employed as a mask for performing selective oxidation, thereby forming field oxide films 206 as shown in FIG. 20. The polycrystalline silicon film 203 and the silicon nitride film 204 are removed.

Figure 21:
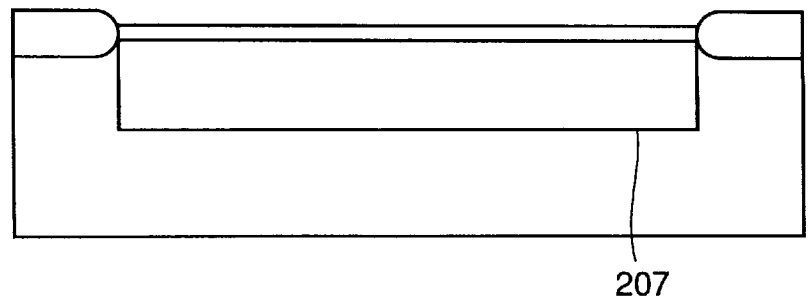
FIG. 21 is a sectional view showing a third step of the method of fabricating the memory cell transistor part of the nonvolatile semiconductor memory device according to the embodiment 2 of the present invention.

As shown in FIG. 21, phosphorus (P) is ion-implanted into a memory cell transistor region and impurity driving is performed at a temperature of about 1000° C., for forming an N-type well 207.

Figure 22:
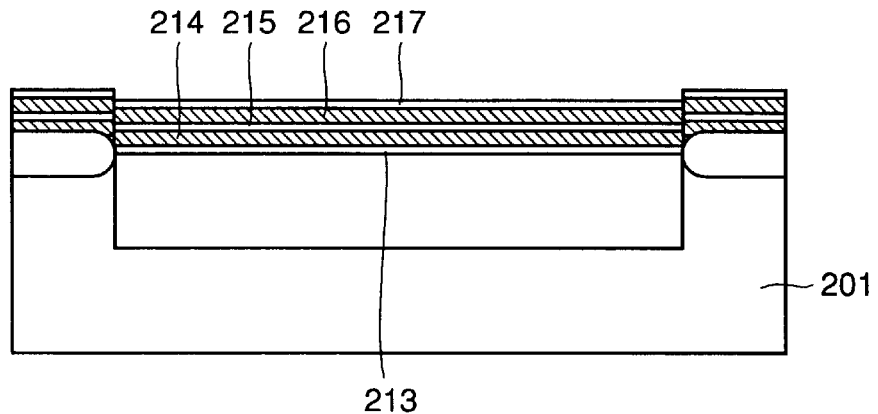
FIG. 22 is a sectional view showing a fourth step of the method of fabricating the memory cell transistor part of the nonvolatile semiconductor memory device according to the embodiment 2 of the present invention.

As shown in FIG. 22, the underlayer oxide film 202 is removed, and thereafter thermal oxidation is performed for forming a gate oxide film 213 of about 100 Å in thickness on the overall upper surface of the P-type silicon substrate 201. A first polycrystalline silicon film 214 of about 1200 Å in thickness is formed on the gate oxide film 213 by CVD or the like.

A high-temperature oxide film of about 100 Å in thickness is formed on the first polycrystalline silicon film 214 by CVD or the like, a silicon nitride film is formed on the high-temperature oxide film in a thickness of about 100 Å by CVD or the like, and another high-temperature oxide film of about 150 ÅÅ in thickness is formed on the silicon nitride film by CVD. Thus, an ONO film 215 is formed.

Then, a polycrystalline silicon layer into which an impurity is introduced is formed on the ONO film 215 in a thickness of about 1200 Å by CVD or the like. A tungsten silicide (WSi) layer is formed on the polycrystalline silicon layer in a thickness of about 1200 Å by sputtering. Thus, a conductive layer 216 is formed to define control gate electrodes.

A TEOS film 217 of about 2000 Å in thickness is formed on the conductive layer 216 by CVD.

Figure 23:
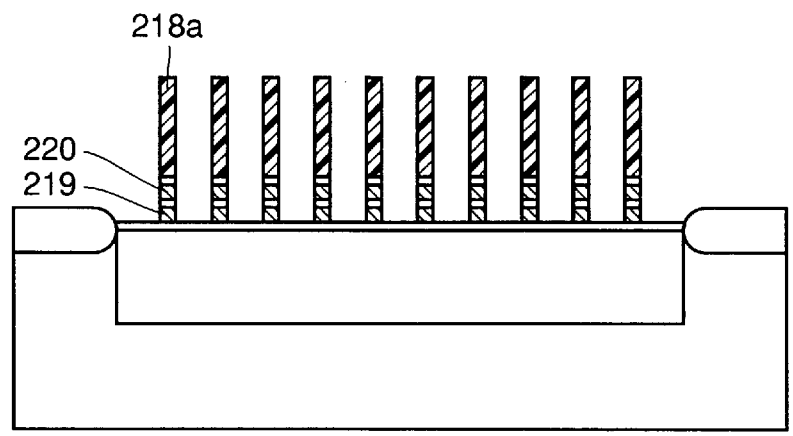
FIG. 23 is a sectional view showing a fifth step of the method of fabricating the memory cell transistor part of the nonvolatile semiconductor memory device according to the embodiment 2 of the present invention.

Referring to FIG. 23, resist films 218a are intermittently formed on the TEOS film 217 in the transverse direction. The resist films 218a are employed as masks for etching the TEOS film 217, the conductive film 216, the ONO film 215 and the first polycrystalline silicon film 214. Thus, floating gate electrodes 219 and control gate electrodes 220 are formed.

Figure 24:
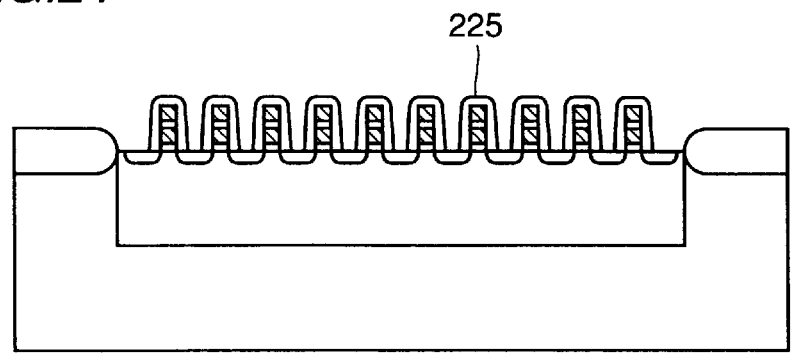
FIG. 24 is a sectional view showing a sixth step of the method of fabricating the memory cell transistor part of the nonvolatile semiconductor memory device according to the embodiment 2 of the present invention.

Referring to FIG. 24, a high-temperature oxide film of about 2000 Å in thickness is formed on the memory cell transistor region by CVD. This high-temperature oxide film is anisotropically etched thereby forming side walls 225 on side surfaces of gates of memory cell transistors. These side walls 225 are employed as masks for injecting $BF_2$ or B, for forming P-type impurity layers of 1E17 to 1E20 $cm^{-3}$ in concentration and 0.1 to 0.3 $\mu$m in thickness. Thus, source and drain regions of the memory cell transistors are formed.

It is preferable to set the impurity concentration of the source regions to be lower than that of the drain regions, although the present invention is not particularly restricted to this.

If the impurity concentration of the source regions also serving as base regions of bipolar transistors is excessively high, emitter injection efficiency is disadvantageously reduced.

Figure 25:
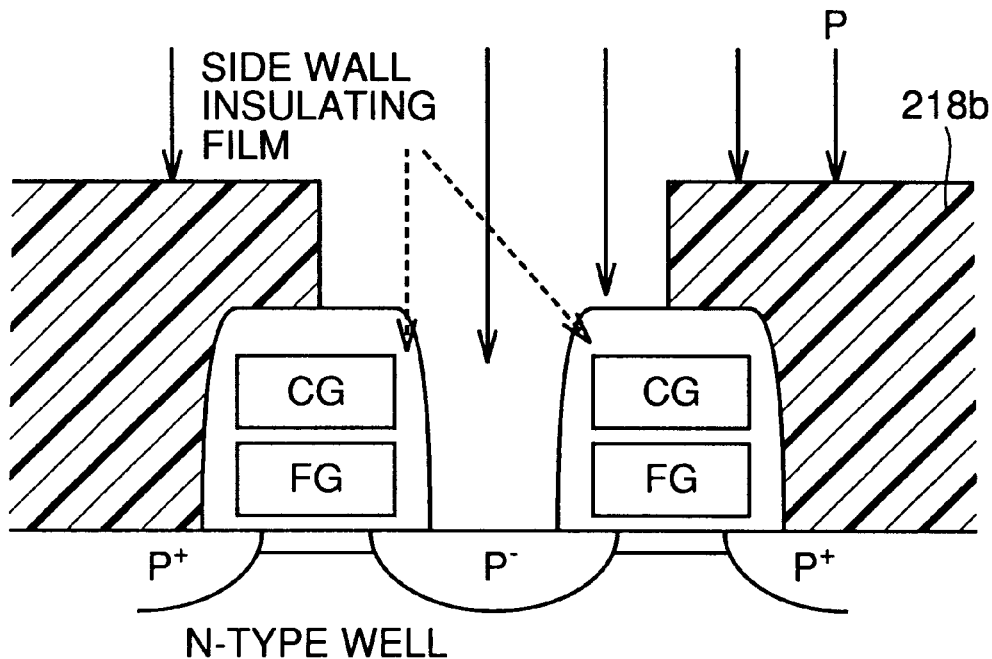
FIG. 25 is a sectional view showing a seventh step of the method of fabricating the memory cell transistor part of the nonvolatile semiconductor memory device according to the embodiment 2 of the present invention.
Figure 26:
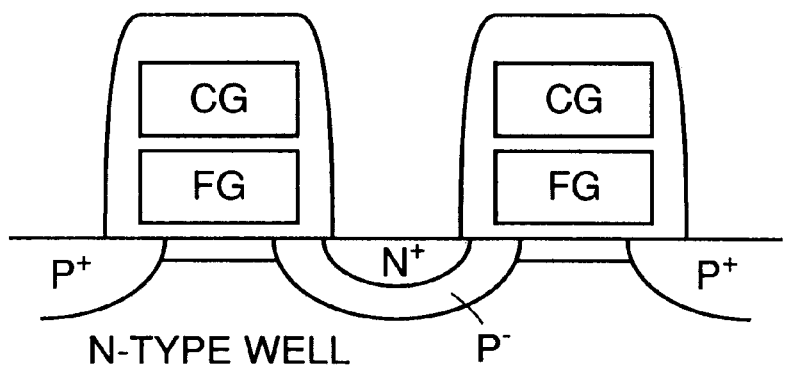
FIG. 26 is a sectional view showing an eighth step of the method of fabricating the memory cell transistor part of the nonvolatile semiconductor memory device according to the embodiment 2 of the present invention.

Thereafter a resist pattern 218b opening only on the source region of each pair of memory cell transistors is formed as shown in FIG. 25, and this resist pattern 218b and side wall insulating films are employed as masks for ion-implanting arsenic (As) or phosphorus (P), thereby forming an emitter region of 0.05 to 0.2 $\mu$m in depth with an N-type impurity concentration of 1E19 to 1E21 cm−3, as shown in FIG. 26.

Namely, an $N^+$-type emitter region is formed to be enclosed with the P-type source region of the memory cell transistors after removal of the resist pattern 218b, as shown in FIG. 26.

Figure 27:
FIG. 27 is a sectional view showing a ninth step of the method of fabricating the memory cell transistor part of the nonvolatile semiconductor memory device according to the embodiment 2 of the present invention.
Figure 28:
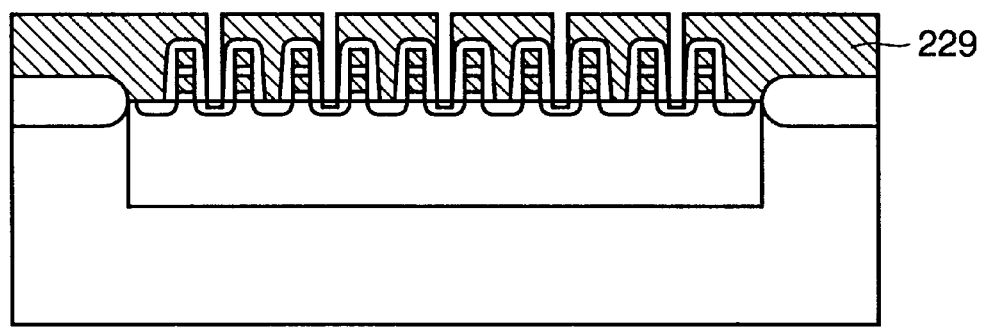
FIG. 28 is a sectional view showing a tenth step of the method of fabricating the memory cell transistor part of the nonvolatile semiconductor memory device according to the embodiment 2 of the present invention.

After the N-type impurity is completely ion-implanted into the surface of the source region of the memory cell transistors as shown in FIG. 26, annealing is performed to activate the impurity, whereby an emitter region of a bipolar transistor is formed on the common source region of each adjacent pair of memory cell transistors, as shown in FIG. 27.

Then, a TEOS oxide film 229 of about 10000 Å in thickness is formed by CVD, and etched back to be flattened. Resist films are employed as masks for etching the TEOS oxide film 229 in portions on the source regions of the memory cell transistors, thereby forming contact holes shown in FIG. 28.

Then, a polycrystalline silicon layer of about 2000 Å in thickness is formed by CVD or the like and an impurity is introduced into this polycrystalline silicon layer for providing conductivity. Further, a tungsten silicide film is deposited by about 1000 Å (the multilayer film of the polycrystalline silicon film and the tungsten silicide film is hereinafter referred to as a polycide film).

Figure 29:
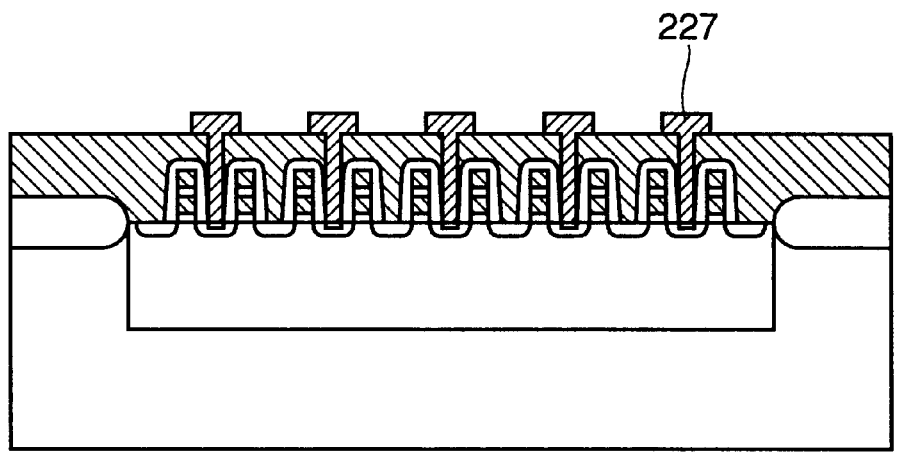
FIG. 29 is a sectional view showing an eleventh step of the method of fabricating the memory cell transistor part of the nonvolatile semiconductor memory device according to the embodiment 2 of the present invention.

A resist film having a prescribed shape is applied to the polycide film and patterning is performed through the resist film serving as a mask, for forming cell selector lines 227 as shown in FIG. 29.

Figure 30:
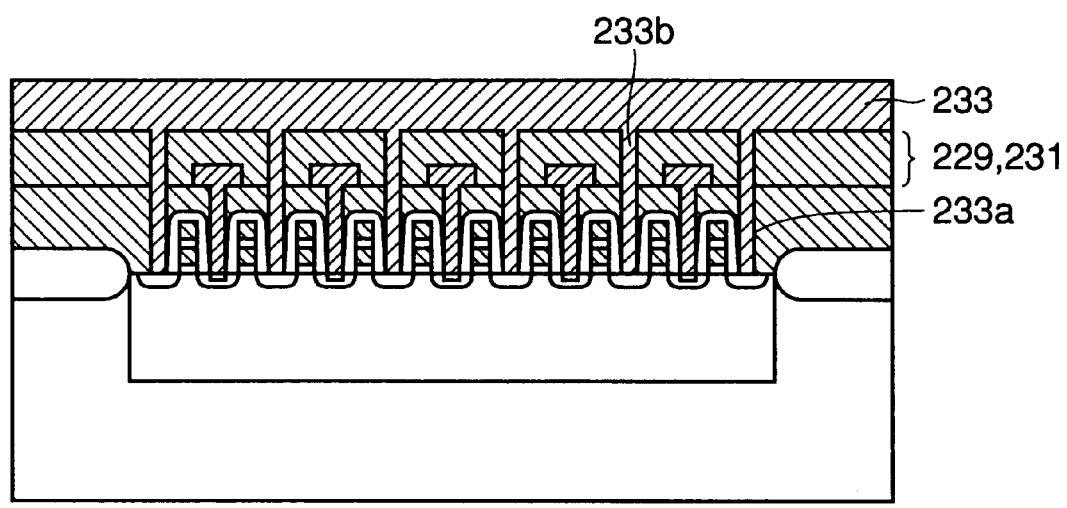
FIG. 30 is a sectional view showing a twelfth step of the method of fabricating the memory cell transistor part of the nonvolatile semiconductor memory device according to the embodiment 2 of the present invention.

Referring to FIG. 30, the resist film is removed, and a silicon oxide film 229 consisting of a TEOS film or the like is formed on the cell selector lines 227 by CVD or the like. The thickness of the silicon oxide film 229 is about 1500 Å. Another silicon oxide film 231 consisting of a BPTEOS film or the like having a thickness of about 10000 Å is formed on the silicon oxide film 229 by CVD or the like. Thereafter a heat treatment is performed at about 850° C. for making a reflow and etching back the silicon oxide film 231 by about 5000 Å with BHF (buffered hydrofluoric acid) or the like.

A resist film of a prescribed shape is deposited on the silicon oxide film 231 and employed as a mask for etching the silicon oxide film 229 and 231. Thus, contact holes 233a are formed for connecting drain regions of the memory cell transistors with a main bit line 233 formed in a later step.

Then, tungsten plugs 233b are formed in the contact holes 233a by CVD and an etchback process.

Then, an aluminum alloy layer of about 5000 Å in thickness is formed on the tungsten plugs 233b and the silicon oxide film 231 by sputtering or the like.

A resist film (not shown) of a prescribed shape is deposited on the aluminum alloy layer and employed as a mask for patterning the aluminum alloy layer, thereby forming the bit line 233.

Thereafter the resist film employed for patterning the aluminum alloy layer is removed, and an interlayer isolation layer (not shown) is formed on the bit line 233.

Thus, the memory cell transistors having the sectional shapes shown in FIG. 2 are fabricated.

Due to the aforementioned process, it is possible to form a bipolar transistor shared by each pair of memory cell transistors while suppressing increase of memory cell areas.

Embodiment 3

In the method of fabricating memory cell transistors according to the embodiment 2 of the present invention, ion implantation is performed on the surfaces of the source regions of the memory cell transistors for forming the emitters through the masks of the side wall insulating films formed on the side surfaces of the control gates and the floating gates of the memory cell transistors and the patterned resist layer.

However, the method of forming emitter layers in the source regions of the memory cell transistors is not restricted to that described with reference to the embodiment 2.

In the embodiment 2, the cell selector lines shown in the embodiment 1 are formed by employing the polycrystalline silicon layer.

Figure 31:
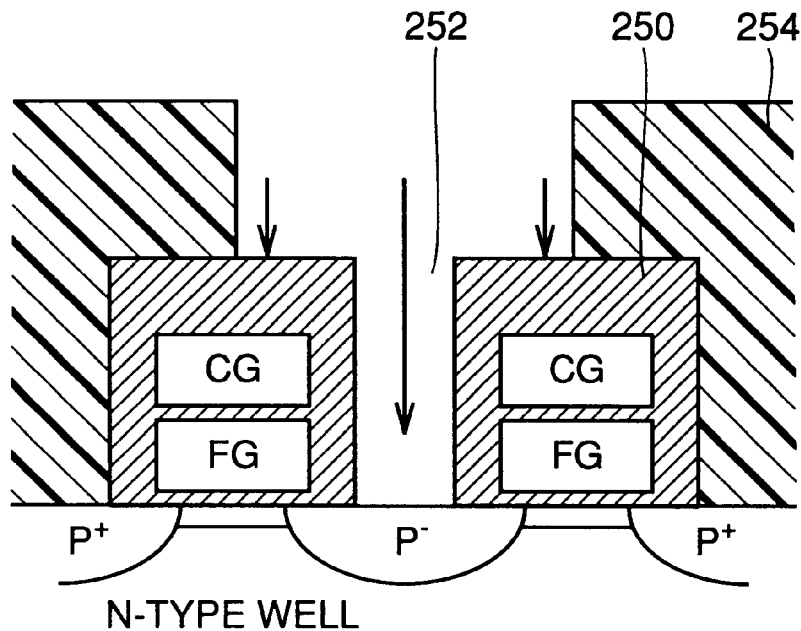
FIG. 31 is a sectional view for showing a step of a method of fabricating memory cell transistors according to an embodiment 3 of the present invention.

Assuming that the cell selector lines are formed by aluminum wires, the following fabrication steps are also employable:

FIG. 31 shows a method of forming an emitter layer in case of forming a cell selector line by an aluminum wire which is directly in contact with a semiconductor substrate surface.

When the ion implantation into the source and drain regions of each pair of memory cell transistors shown in FIG. 26 is completed in the steps shown in the embodiment 2, an interlayer isolation film 250 is formed. A contact hole 252 opening in the source and drain regions of the memory cell transistors is formed in the interlayer isolation film 250.

Further, an N-type impurity for forming an emitter layer is ion-implanted into a semiconductor substrate surface side of the source region through a resist mask opening only for the source region of the memory cell transistors.

Also through this step, a bipolar transistor can be formed in proximity to each pair of memory cell transistors to have an emitter layer on the source region surface side.

Due to the aforementioned process, it is possible to form a bipolar transistor shared by each pair of memory cell transistors while suppressing increase of memory cell areas.

Embodiment 4

Figure 32:
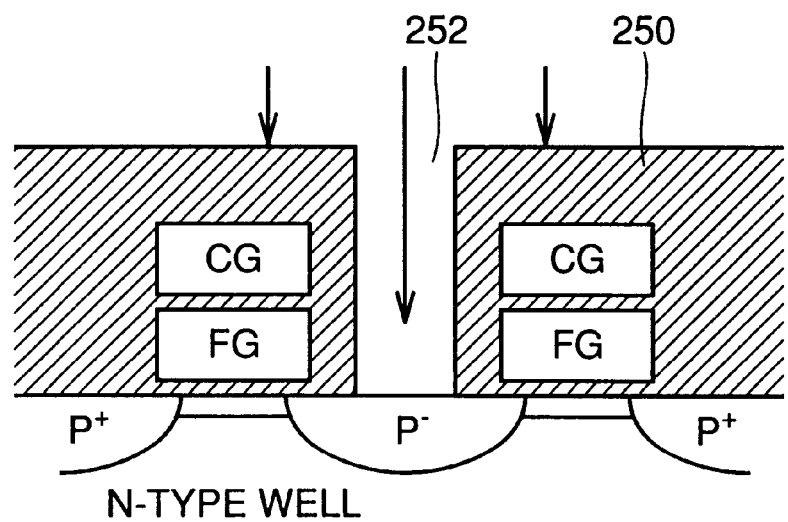
FIG. 32 is a sectional view for showing a step of a method of fabricating memory cell transistors according to an embodiment 4 of the present invention.

FIG. 32 illustrates another step of forming an emitter region of a bipolar transistor according to an embodiment 4 of the present invention.

Referring to FIG. 32, an interlayer isolation film 250 is deposited when impurity ions are completely implanted into source and drain regions of each pair of memory cell transistors. A contact hole 252 is formed in the interlayer isolation film 250 to open on the source region of the memory cell transistors. An N-type impurity for forming an emitter layer is ion-implanted into the contact hole 252 through the interlayer isolation film 250 serving as a mask.

Then, a polycide wire is formed in the contact hole 252, thereby forming the so-called direct contact by the polycide wire.

Also through such process, it is possible to ion-implant an impurity of a conductivity type different from that of a source region into a semiconductor substrate surface side of the source region shared by each adjacent pair of memory cell transistors.

Due to the aforementioned process, it is possible to form a bipolar transistor shared by each pair of memory cell transistors while suppressing increase of memory cell areas.

Embodiment 5

Figure 33:
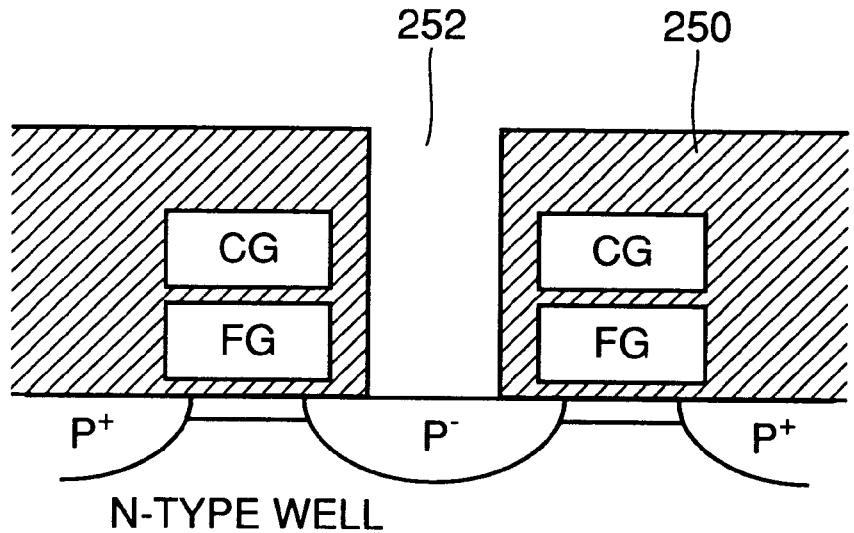
FIG. 33 is a first sectional view showing a method of fabricating a memory cell transistor part of a nonvolatile semiconductor memory device according to an embodiment 5 of the present invention.
Figure 34:
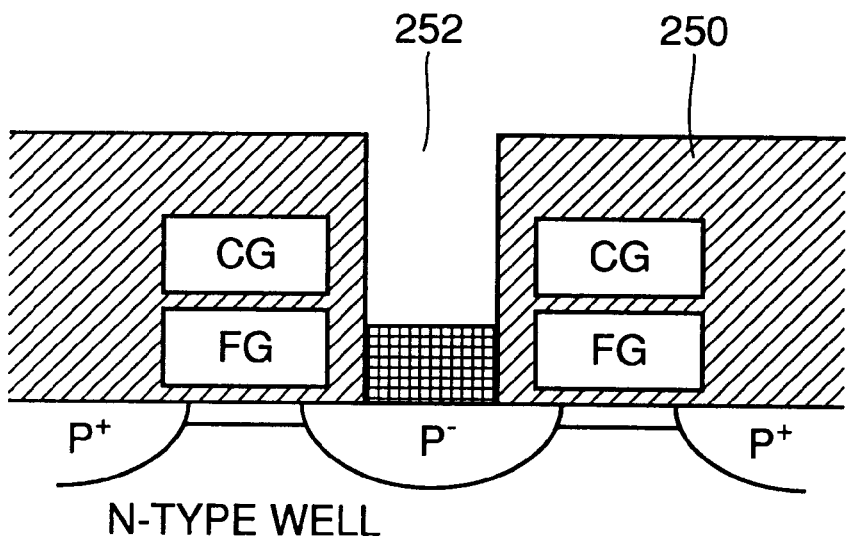
FIG. 34 is a second sectional view showing the method of fabricating the memory cell transistor part of the nonvolatile semiconductor memory device according to the embodiment 5 of the present invention.

FIGS. 33 and 34 illustrate a process of forming a bipolar transistor according to an embodiment 5 of the present invention.

Similarly to the case shown in FIG. 31, an interlayer isolation film 250 is formed after ion implantation into source/drain regions of memory cell transistors is completed, and a contact hole 252 opening on the source region is formed in the interlayer isolation film 250.

Referring to FIG. 34, the interlayer isolation film 250 is employed as a mask for selectively epitaxially growing an N-type silicon layer in the contact hole 252 opening on the source region shared by two adjacent memory cell transistors by CVD or the like, for example.

Namely, the selectively grown N-type Si epitaxial layer defines an emitter layer of a bipolar transistor, the P-type source region present under the same defines a base region of the bipolar transistor, and an N-type well region provided with the source region defines a collector region of the bipolar transistor.

Also through the aforementioned process, it is possible to form a bipolar transistor having a base layer defined by a source region shared by an adjacent pair of memory cell transistors.

Due to the aforementioned process, it is possible to form a bipolar transistor shared by each pair of memory cell transistors while suppressing increase of memory cell areas.

Embodiment 6

Figure 35:
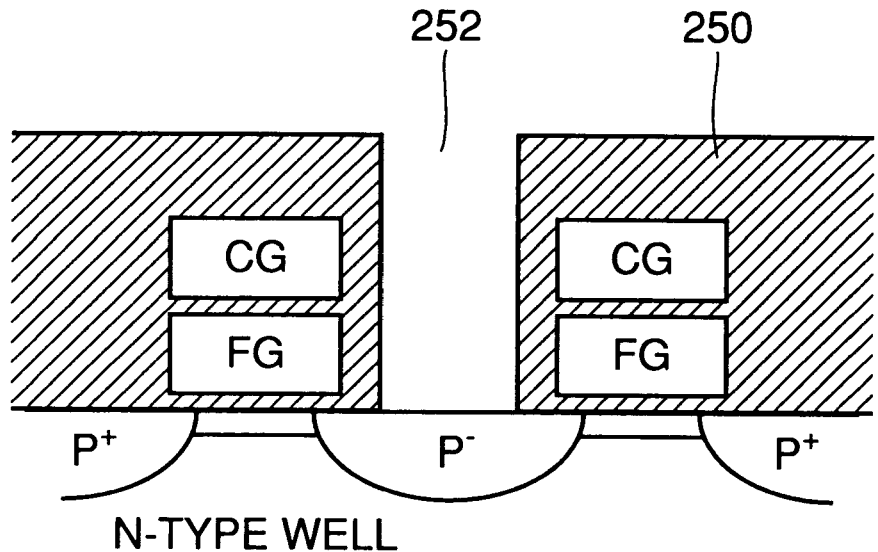
FIG. 35 is a first sectional view showing a method of fabricating a memory cell transistor part of a nonvolatile semiconductor memory device according to an embodiment 6 of the present invention.
Figure 36:
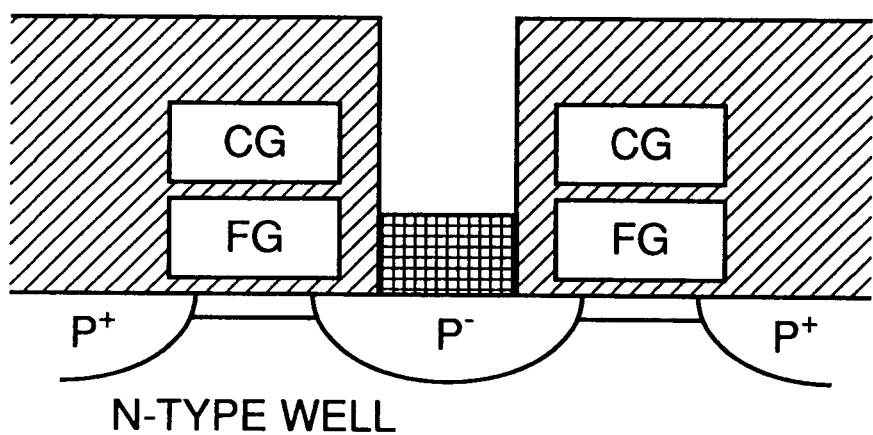
FIG. 36 is a second sectional view showing the method of fabricating the memory cell transistor part of the nonvolatile semiconductor memory device according to the embodiment 6 of the present invention.

FIGS. 35 and 36 illustrate a method of forming a bipolar transistor according to an embodiment 6 of the present invention.

Referring to FIG. 35, an interlayer isolation film 250 is formed after ion implantation into source/drain regions of memory cell transistors is completed, similarly to FIG. 31.

Then, a contact hole 252 opening on the source region shared by an adjacent pair of memory cell transistors is formed in the interlayer isolation film 250.

Referring to FIG. 36, a polysilicon layer having a conductivity type different from a source diffusion layer is deposited on a silicon substrate of an exposed source part, to define an emitter region of a bipolar transistor.

A cell selector line is further deposited on the emitter region and patterned.

While an N-type polysilicon layer deposited on a semiconductor substrate surface directly operates as an emitter in the above description, a heat treatment may be performed in the stage of formation of the N-type polysilicon layer for diffusing an N-type impurity contained in the N-type polysilicon layer into the source region surface side, thereby defining an emitter layer of a bipolar transistor by an N-type layer formed by the diffusion.

Also in the aforementioned step, it is possible to form a bipolar transistor shared by each pair of memory cell transistors without increasing memory cell areas.

Embodiment 7

Figure 37:
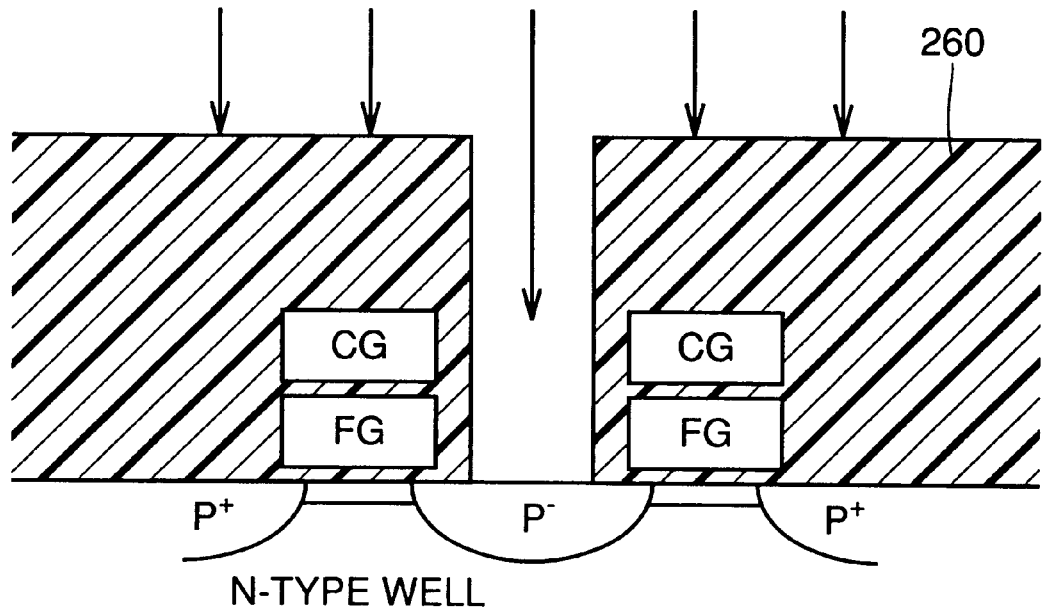
FIG. 37 is a first sectional view showing a method of fabricating a memory cell transistor part of a nonvolatile semiconductor memory device according to an embodiment 7 of the present invention.
Figure 38:
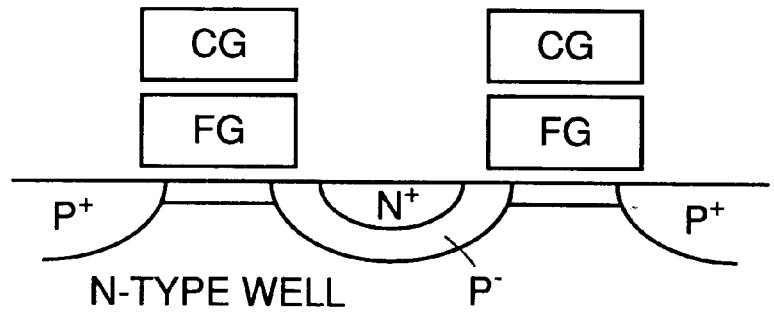
FIG. 38 is a second sectional view showing the method of fabricating the memory cell transistor part of the nonvolatile semiconductor memory device according to the embodiment 7 of the present invention.

FIGS. 37 and 38 show another step of forming an emitter layer of a bipolar transistor on a surface side of a source region shared by a pair of memory cell transistors.

Referring to FIG. 37, a resist mask pattern 260 opening on the source region is formed when ion implantation into source and drain regions of the memory cell transistors is completed.

Then, the resist mask pattern 260 is employed as a mask for ion-implanting an impurity (N-type impurity in this case) having a conductivity type different from that of the source region into the semiconductor substrate surface side of the source region.

Then, the resist mask pattern 260 is removed, so that an N-type emitter layer is formed on the semiconductor substrate surface side of the source region shared by the adjacent pair of memory cell transistors.

Also through the aforementioned process, it is possible to form a bipolar transistor shared by each pair of memory cell transistors while suppressing increase of memory cell areas.

[Well Structure]

In the above description, it is assumed that P-channel memory cell transistors are formed in an N-type well formed on a P-type substrate.

Figure 39:
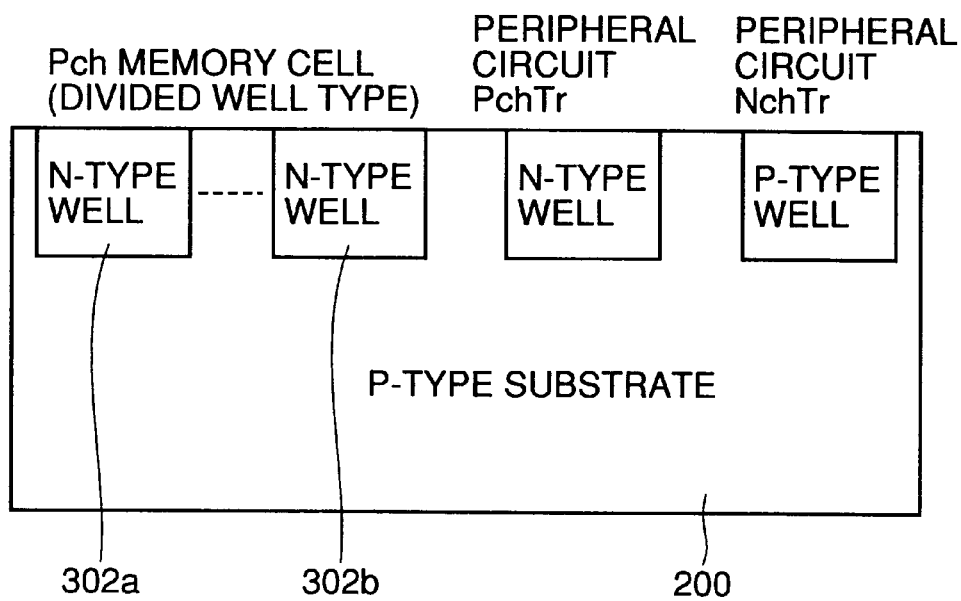
FIG. 39 is a sectional view showing an exemplary well structure of the nonvolatile semiconductor memory device.

However, wells may be formed in a P-type substrate as follows:

Referring to FIG. 39, N-type wells 302a to 302b are independently formed in the units of erase blocks in a memory cell transistor region on a surface of a P-type substrate 200.

On the other hand, a P-channel transistor and an N-channel transistor of a peripheral circuit are formed in an N-type well and a P-type well formed on the surface side of the P-type substrate 200 respectively.

Namely, a CMOS circuit forming the peripheral circuit has the so-called twin well structure.

Figure 40:
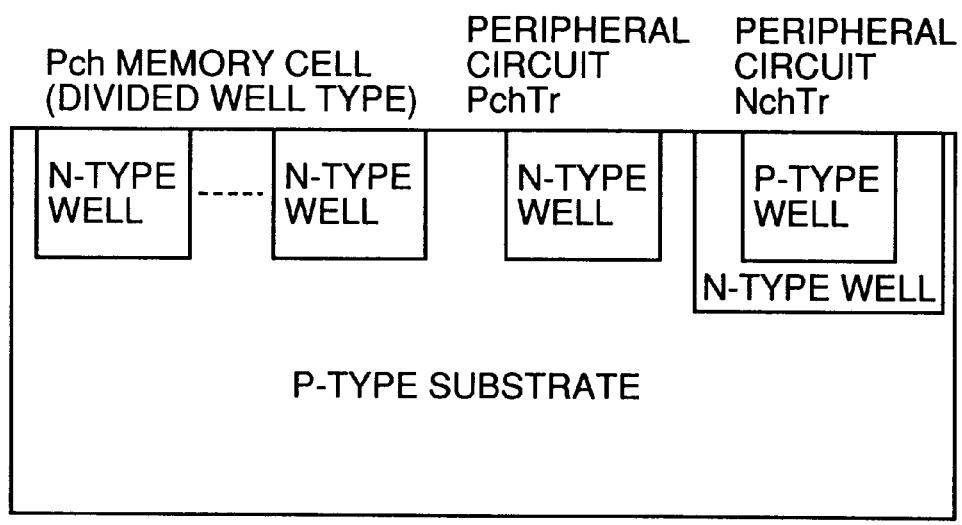
FIG. 40 is a sectional view showing a second exemplary well structure of the nonvolatile semiconductor memory device.

FIG. 40 is a sectional view showing another exemplary structure of wells formed on a surface side of a P-type substrate.

In the well structure shown in FIG. 39, CMOS transistors of the peripheral circuit are formed in twin wells.

In the structure shown in FIG. 40, on the other hand, an N-channel transistor of a peripheral circuit is formed in a P-type well formed in an N-type well formed on a surface side of the P-type substrate.

Therefore, CMOS transistors forming the peripheral circuit are formed in the so-called triple wells.

Due to such a well structure, resistance against a latch-up phenomenon of the peripheral circuit or the like is improved.

Figure 41:
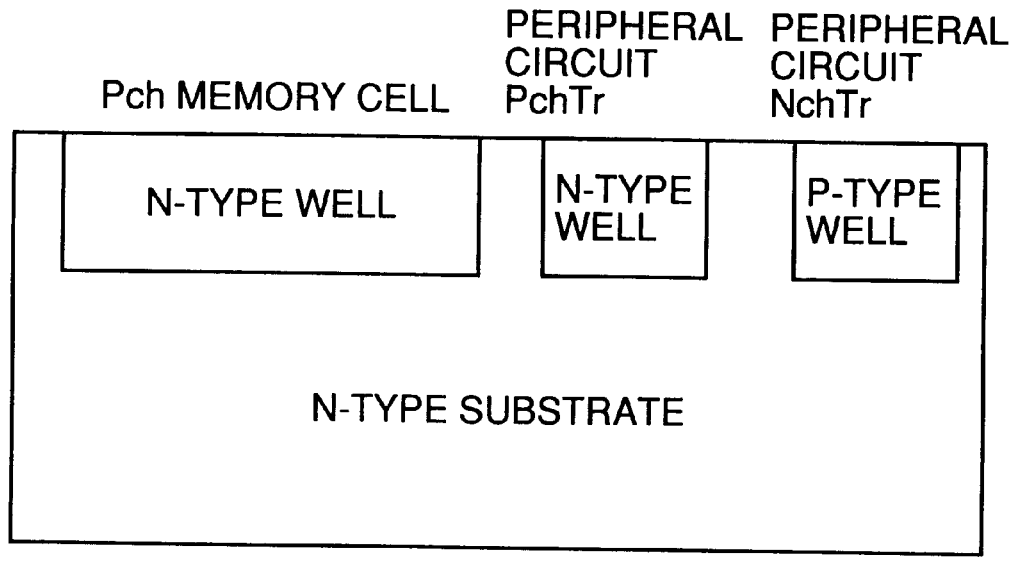
FIG. 41 is a sectional view showing a third exemplary well structure of the nonvolatile semiconductor memory device.

FIG. 41 is a sectional view showing a well structure in case of forming the nonvolatile semiconductor memory device 1000 shown in FIG. 1 on an N-type substrate.

The memory cell array part of the nonvolatile semiconductor memory device 1000 is formed in an N-type well formed on a surface side of the N-type substrate.

On the other hand, a P-channel transistor in a CMOS circuit forming a peripheral circuit is formed in an N-type well formed on the surface side of the N-type substrate.

Further, an N-channel transistor of the CMOS circuit forming the peripheral circuit is formed in a P well formed on the surface of the N-type substrate.

In such a well structure, therefore, it is difficult to divide the wells provided with the memory cell transistors in erase units.

Figure 42:
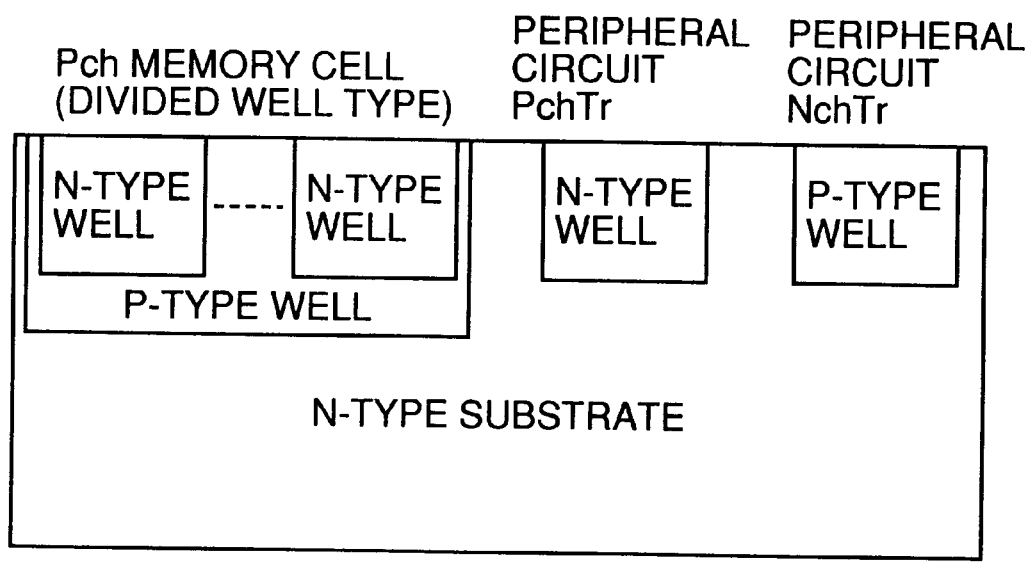
FIG. 42 is a sectional view showing a fourth exemplary well structure of the nonvolatile semiconductor memory device.

FIG. 42 is a sectional view showing another well structure in case of forming the nonvolatile semiconductor memory device 1000 shown in FIG. 1 on an N-type substrate.

Referring to FIG. 42, the memory cell array is formed in a region of an N-type well further formed in a P well formed on a surface of the N-type substrate.

In this case, therefore, the N-type well provided with the memory cell transistors can be divided in the units of erase blocks.

Further, a P-channel transistor of a CMOS circuit forming a peripheral circuit is formed in an N-type well region formed on the surface of the N-type substrate. An N-channel MOS transistor of the CMOS circuit forming the peripheral circuit is formed in a P-type well region formed on the surface of the N-type substrate.

It is possible to form the nonvolatile semiconductor memory device 1000 shown in FIG. 1 on each of P-type and N-type substrates by employing any of the aforementioned well structures shown in FIGS. 39 to 42.

Particularly when a P-type substrate is employed, it is possible to advantageously readily divide a well formed with P-channel memory cell transistors into the units of erase blocks in case of forming P-channel memory cells.

Embodiment 8

Figure 43:
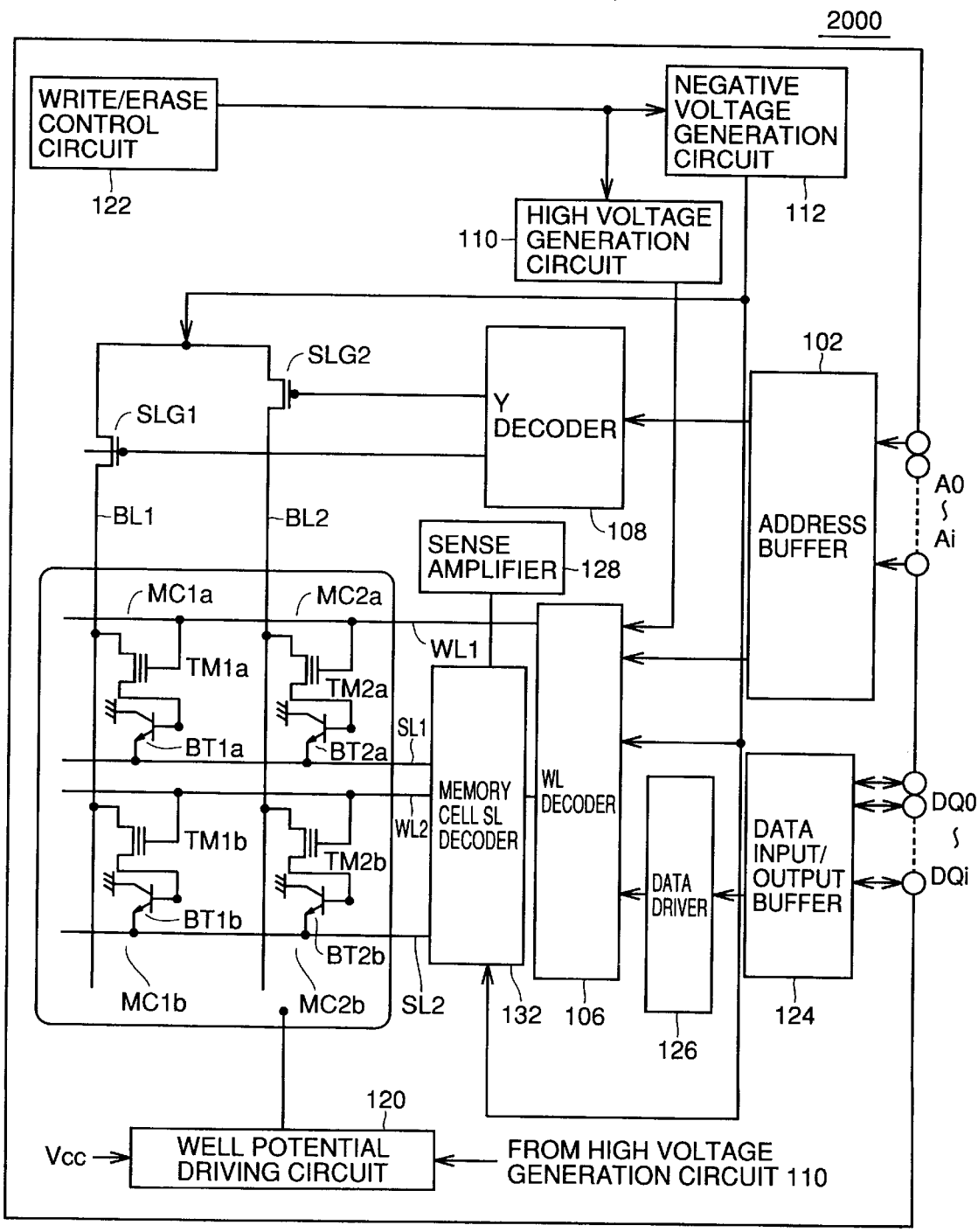
FIG. 43 is a schematic block diagram showing the structure of a nonvolatile semiconductor memory device 2000 according to an embodiment 8 of the present invention.

FIG. 43 is a schematic block diagram showing the structure of a nonvolatile semiconductor memory device 2000 according to an embodiment 8 of the present invention.

This nonvolatile semiconductor memory device 2000 is different in structure from the nonvolatile semiconductor memory device 1000 according to the embodiment 1 shown in FIG. 1 in the following point:

Referring to FIG. 43, it is assumed that a memory cell array 104 includes two rows by two columns of memory cells, for simplifying the illustration.

The structure of this nonvolatile semiconductor memory device 2000 according to the embodiment 8 is different from the nonvolatile semiconductor memory device 1000 according to the embodiment 1 in a point that the same includes bipolar transistors in one-to-one correspondence to memory cell transistors included in the respective memory cells.

In the memory cell array 104 of the nonvolatile semiconductor memory device 2000, a memory cell MC1a includes a memory cell transistor TM1a having a floating gate, a control gate connected to a word line WL1 and a drain connected to a bit line BL1, and a bipolar transistor BT1a having a base connected to the source of the memory cell transistor TM1a, a collector receiving a ground potential and an emitter connected to a cell selector line SL1 is provided in correspondence to the memory cell transistor TM1a.

The remaining memory cells MC1b, MC2a and MC2c are similar in basic structure to the memory cell MC1a.

Namely, each word line WL and each cell selector line SL are arranged in correspondence to each row of the memory cell array 104 in the nonvolatile semiconductor memory device 2000 according to the embodiment 8.

The remaining structural parts of this semiconductor memory device 2000 are similar to those of the nonvolatile semiconductor memory device 1000 according to the embodiment 1 shown in FIG. 1, and hence identical parts are denoted by the same reference numerals, to omit redundant description.

Figure 44:
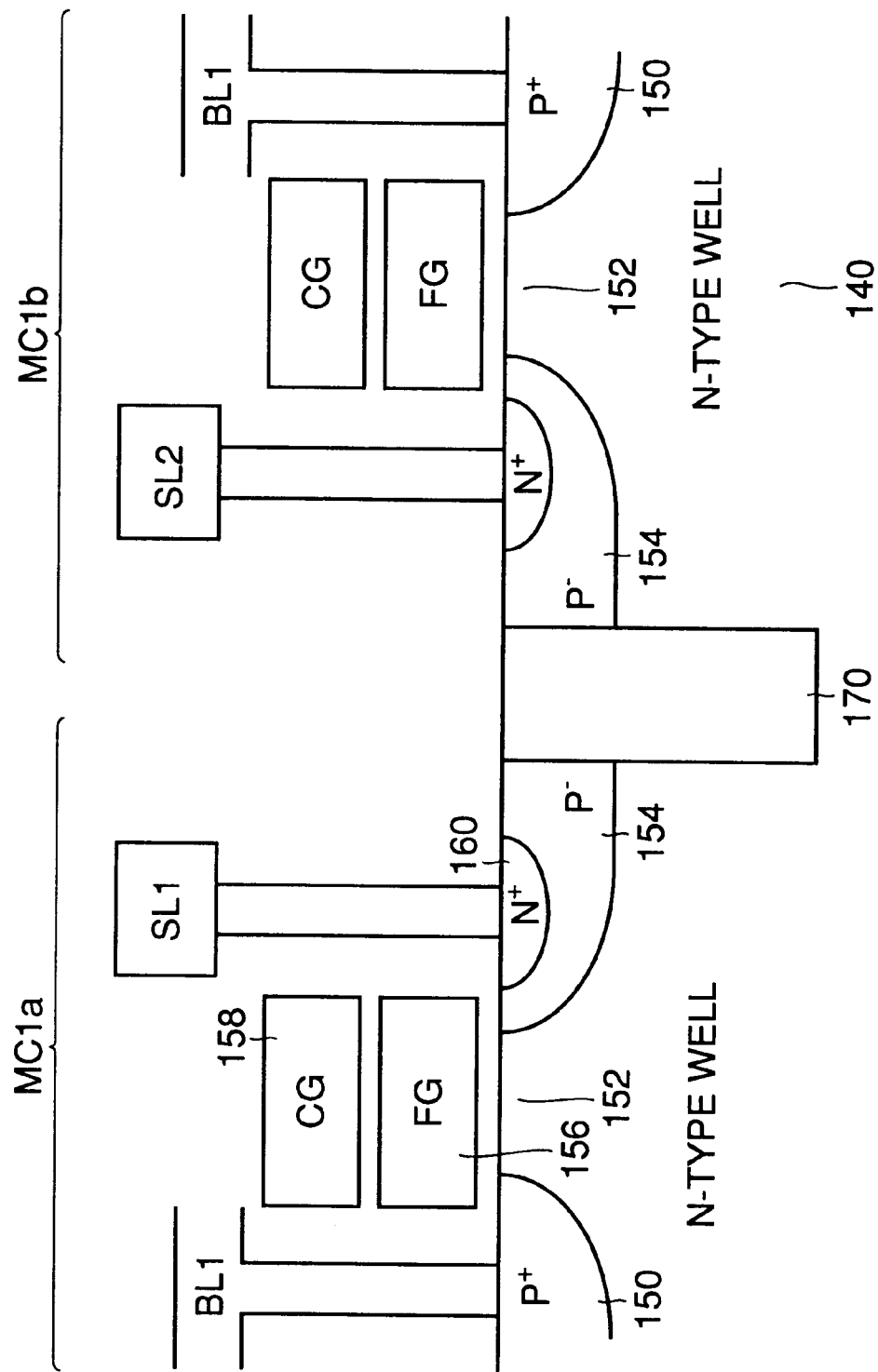
FIG. 44 is a sectional view showing the structure of a memory cell part according to the embodiment 8 of the present invention.

FIG. 44 is a sectional view showing the structures of the memory cells MC1a and MC1b shown in FIG. 43.

With reference to FIG. 44, the structure of the memory cell MC1a is described in further detail.

The memory cell transistor TM1a included in the memory cell MC1a includes an N-type well 140 formed on a surface side of a semiconductor substrate, a P-type drain region 150 and a P-type source region 154 formed on a surface side of the N-type well 140, a channel region 152 held between the drain region 150 and the source region 154, a floating gate 156 formed on the channel region 152 through a tunnel oxide film, and a control gate 158 formed above the floating gate 156 through an insulating film.

An N-type emitter region 160 is formed on a surface side of the source region 154 of the memory cell MC1a, to be enclosed with the source region 154 except the surface side of the semiconductor substrate.

Namely, a bipolar transistor is formed to have an emitter defined by the N-type emitter region 160, a base region defined by the source region 154 and a collector region defined by the N-type well 140.

The drain region 150 is connected to a bit line BL1, and the emitter region 160 is connected to a cell selector line SL1.

An element isolation region 170 is formed on the boundary between the memory cells MC1a and MC1b.

This element isolation region 170 can be prepared from the so-called trench type element isolation region by forming a buried oxide film in a trench region etched from the surface side of the semiconductor substrate.

Alternatively, the so-called LOCOS (local oxidation of silicon) isolation can be employed.

The emitter region 160 can be formed in the source region 154 by a method similar to those described with reference to the embodiments 2 to 7.

Figure 45:
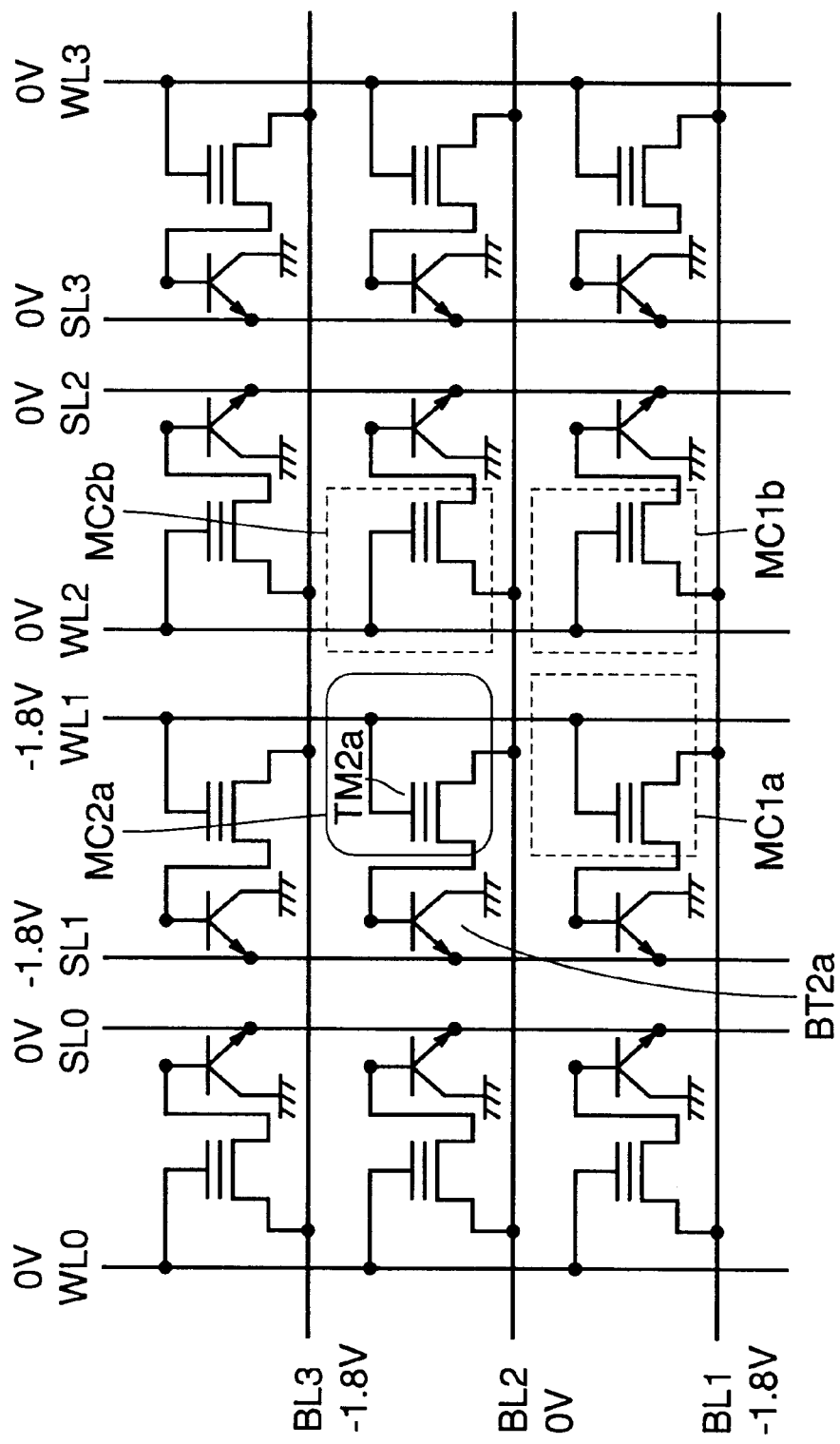
FIG. 45 is a circuit diagram showing the structure of a memory cell array 104 according to the embodiment 8 of the present invention in detail.

FIG. 45 is a circuit diagram showing the structure of the memory cell array 104 shown in FIG. 43 in further detail.

FIG. 45 shows the potential arrangement of bit lines BL1 to BL3, word lines WL0 to WL3 and cell selector lines SL0 to SL3 in case of selecting the memory cell MC2a.

The bit line BL2 connected with the drain of the memory cell transistor TM2a of the memory cell MC2a is held at a potential level of 0 V.

The potential levels of the remaining bit lines BL1 and BL3 are held at −1.8 V, for example.

On the other hand, the word line WL1 connected with the gate of the memory cell transistor TM2a of the memory cell MC2a is held at a potential level of −1.8 V, and the potential levels of the remaining word lines WL0, WL2 and WL3 are held at 0 V.

Further, the potential level of the cell selector line SL1 connected with the emitter of a bipolar transistor BT2a of the memory cell MC2a is held at −1.8 V, for example, and those of the remaining cell selector lines SL0, SL2 and SL3 are held at 0 V.

When the memory cell transistor TM2a is in a conducting state since the potential level of the word line WL1 is −1.8 V, for example, the potential level of the bit line BL2 is at 0 V due to the aforementioned potential arrangement, whereby the base of the bipolar transistor BT2a is biased to a positive side by the cell selector line SL1 as compared with the emitter brought into the potential level of −1.8 V.

Namely, the base-emitter junction of the bipolar transistor BT2a is forward-biased. Therefore, the channel region 152 of the memory cell transistor MT2a supplies a base current to the base of the bipolar transistor BT2a, whose collector responsively feeds an emitter current obtained by amplifying the base current by a quantity corresponding to a current amplification factor to the cell selector line SL1 held at −1.8 V.

Therefore, it is possible to read information held in the memory cell transistor TM2a by detecting the value of the current flowing through the cell selector line SL1 by a sense amplifier 128 which is connected with a memory cell SL decoder 132, similarly to the nonvolatile semiconductor memory device 1000 according to the embodiment 1.

In the above description, it is assumed that the memory cell transistor TM2a is in a "Low Vth" state. If the memory cell transistor TM2a is in a "High Vth" state, however, no current flows to the memory cell transistor TM2a even if the potential level of the word line WL1 is −1.8 V. Therefore, no base current is supplied to the bipolar transistor BT2a, and hence no current flows to the cell selector line SL1 either.

Namely, it is possible to detect whether the memory cell transistor TM2a is in a "Low Vth" state or a "High Vth" state by detecting the value of the current flowing in the cell selector line SL1 by the sense amplifier 128.

Also in the memory cells MC1a to MC2b shown in FIG. 43, it is possible to perform a write operation in the potential arrangement described with reference to FIGS. 7 and 8 in relation to the embodiment 1, except the point that the bipolar transistors are arranged in one-to-one correspondence to the memory cells.

Also in this embodiment, further, it is possible to prevent the so-called drain disturb failure by bringing potentials of non-selected control gates to a level relaxing gate-to-drain electric fields.

Namely, a negative potential of −3 V or the like is preferably applied to the non-selected control gates in correspondence to the fact that the potential level of a bit line connected to a selected bit is −6 V.

Namely, it is possible to further prevent occurrence of a drain disturb failure by applying a negative voltage to the control gates (word lines) of non-selected memory cell transistors in a write operation state.

Figure 46A:
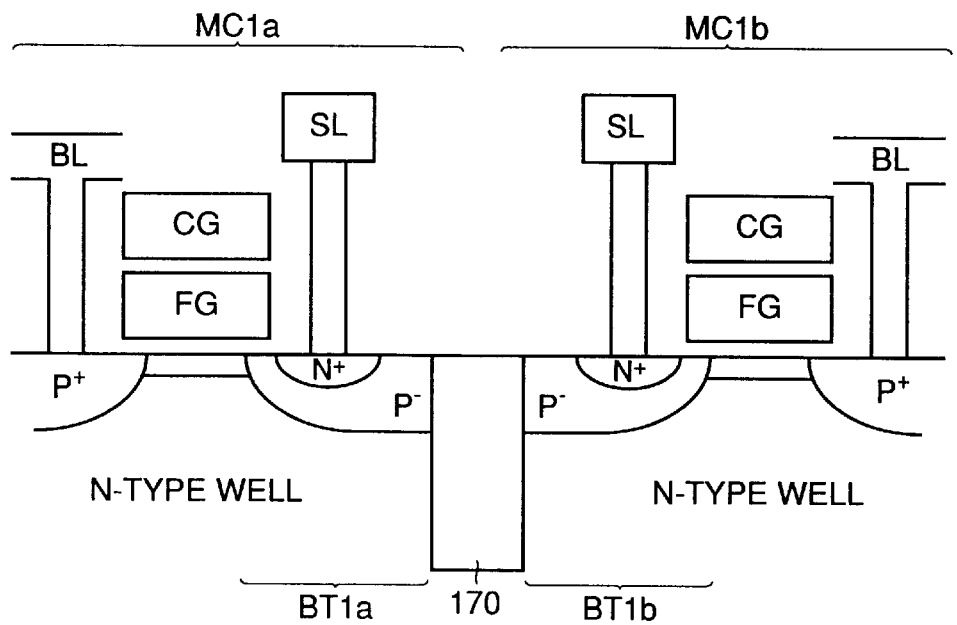
FIGS. 46A and 46B are sectional views showing exemplary structures of memory cells according to the embodiment 8 of the present invention.
Figure 46B:
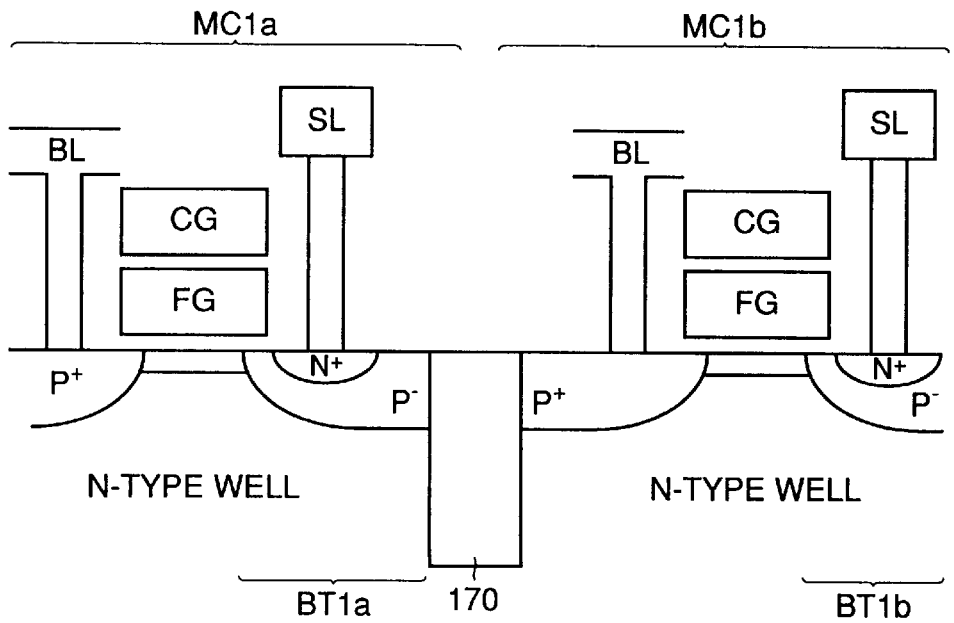

FIGS. 46A and 46B show two exemplary sectional structures of the memory cells MC1a and MC1b shown in FIG. 43.

The structure shown in FIG. 46A is identical to that of FIG. 44. The source regions of the memory cell transistors TM1a and TM1b of the memory cells MC1a and MC1b are arranged in proximity to each other, and the element isolation region 170 is provided on the boundary between the source regions.

In the structure shown in FIG. 46B, on the other hand, the drain region of the memory cell transistor TM1b is formed in proximity to the source region of the memory cell transistor TM1a.

Therefore, the element isolation region 170 is provided on the boundary between the source region of the memory cell transistor TM1a and the drain region of the memory cell transistor TM1b.

The structure shown in FIG. 46A has such an advantage that resist masks can be readily formed since regions having the same injection conditions are in proximity to each other with reference to two memory cells in case of changing varying injection conditions with the source regions and the drain regions of the memory cell transistors TM1a and TM1b, for example.

Namely, in case of forming resist masks for ion implantation for the source regions and the drain regions independently of each other, the opening areas of the resist masks can be increased, whereby it is possible to largely provide margins with respect to resolution required in a photolithography step.

On the other hand, the structure shown in FIG. 46B has such an advantage that the wiring space between the cell selector lines SL1 and SL2 connected with the emitter regions of the bipolar transistors BT1a and BT1b formed adjacently to each other can be increased.

While the cell selector lines SL1 and SL2 are generally formed by the same wiring layer, margins for photolithography etc. in a cell selector line forming step can be largely provided if the wiring pitch of this wiring layer can be increased.

Figure 47:
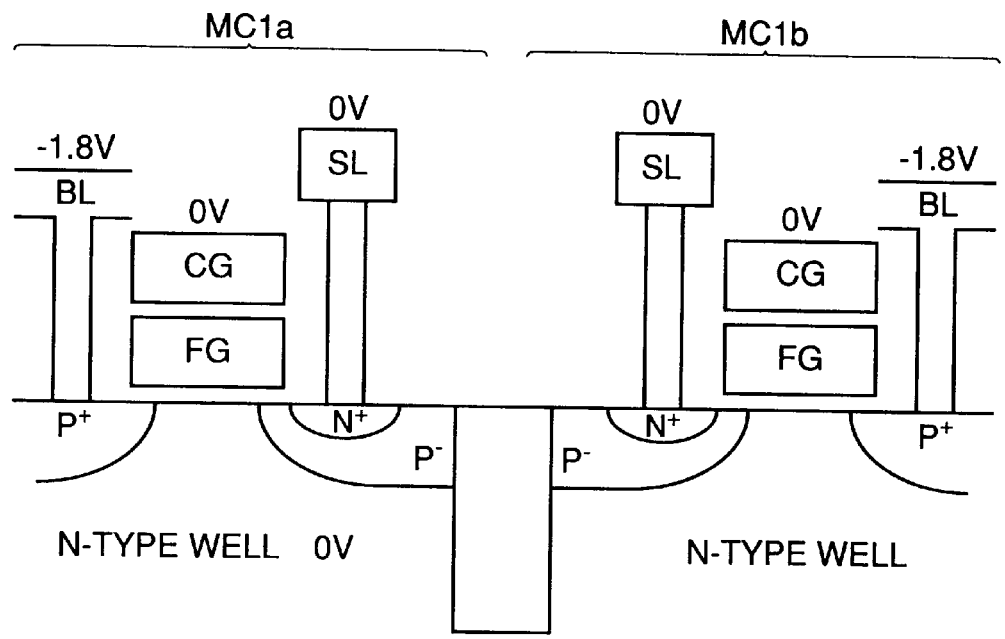
FIG. 47 is a first diagram showing an exemplary potential arrangement in a standby state of a memory cell part according to the embodiment 8 of the present invention.
Figure 48:
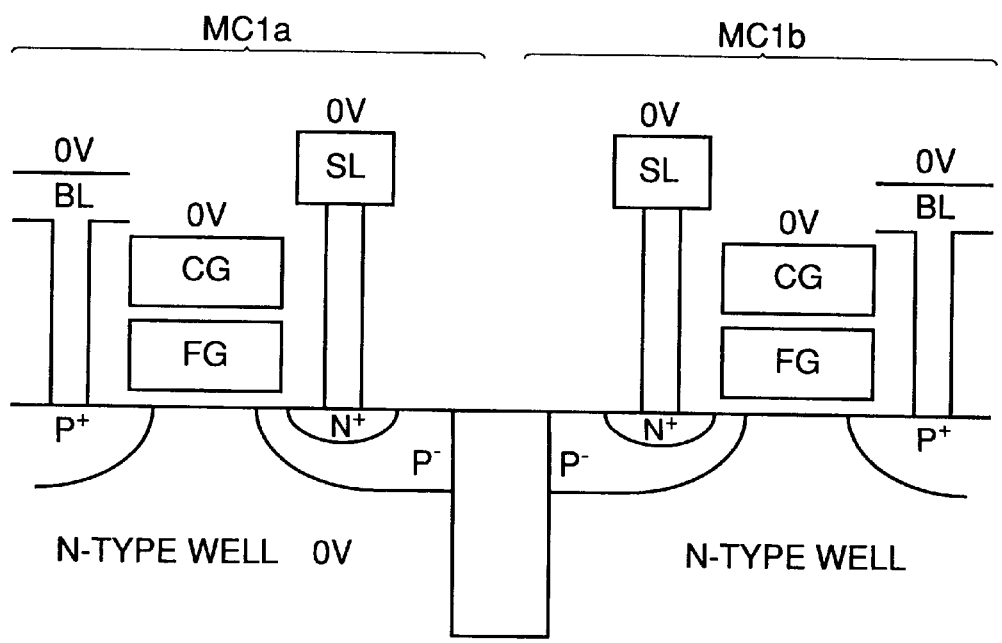
FIG. 48 is a second diagram showing another exemplary potential arrangement in the standby state of the memory cell part according to the embodiment 8 of the present invention.
Figure 49:
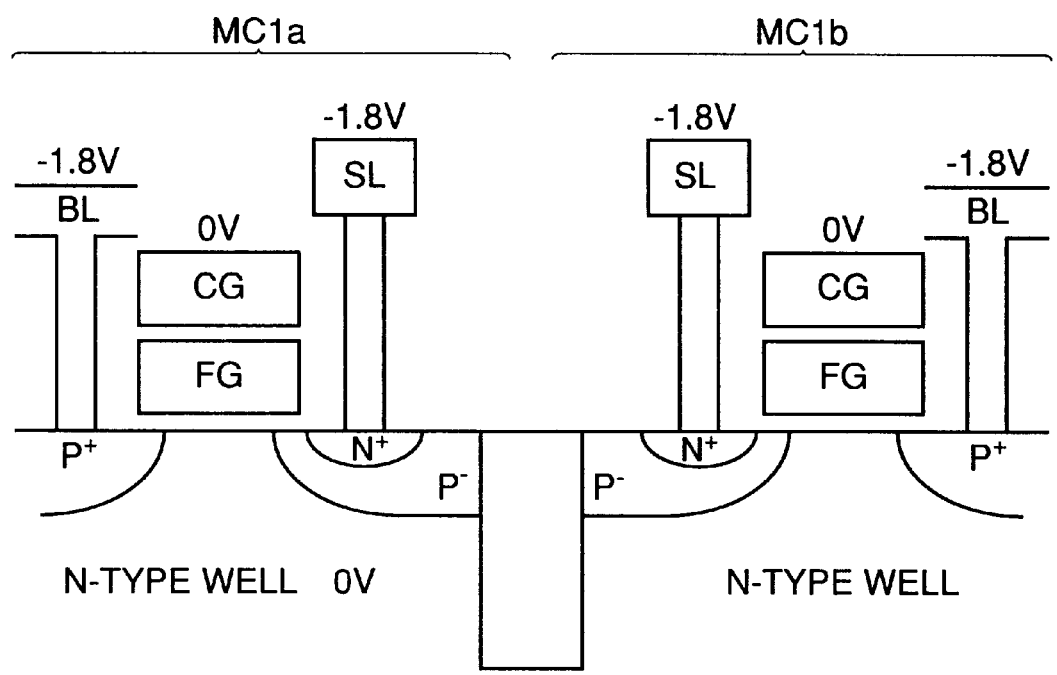
FIG. 49 is a third diagram showing potential arrangement in the standby state of the memory cell part according to the embodiment 8 of the present invention.

FIGS. 47 to 49 are model diagrams showing exemplary potential arrangements in a standby state of the memory cells MC1a and MC1b described with reference to FIG. 44 respectively.

With reference to FIG. 47, the first exemplary potential arrangement in the standby state of the memory cells MC1a and MC1b is now described.

Referring to FIG. 47, the bit lines BL, the control gates CG, the cell selector lines SL and the N-type wells are held at −1.8 V, 0 V, 0 V and 0 V respectively, for example.

Even if a current is flowable through the channel of the memory cell transistor TM1a, for example, no current flows to the bipolar transistor BT1a since its base region, i.e., the source region 154 of the memory cell transistor TM1a, and the emitter region 160 of the bipolar transistor BT1a are reverse-biased, due to the aforementioned structure.

In the potential arrangement shown in FIG. 47, therefore, no current flows to the cell selector lines SL in the standby state, regardless of the threshold voltages Vth of the memory cell transistors TM1a and TM1b.

FIG. 48 shows the second exemplary potential arrangement in the standby state of the memory cells MC1a and MC1b shown in FIG. 44.

Referring to FIG. 48, the potential levels of the bit lines BL, the control gates CG, the cell selector lines SL and the N-type wells are held at 0 V, 0 V, 0 V and 0 V respectively.

When the memory cells MC1a and MC1b are in the standby state with the aforementioned potential arrangement, the base and the emitter of the bipolar transistor BT1a are not forward-biased even if the memory cell transistor TM1a is in a conducting state, for example. Thus, no current flows to the cell selector lines SL.

FIG. 49 is a conceptual diagram showing the third exemplary potential arrangement in the standby state of the memory cells MC1a and MC1b illustrated in FIG. 44.

Referring to FIG. 49, the potential levels of the bit lines BL, the control gates CG, the cell selector lines SL and the N-type wells are held at −1.8 V, 0 V, −1.8 V and 0 V respectively, for example.

The base and the emitter of the bipolar transistor BT1a are not forward-biased in the potential arrangement shown in FIG. 49 either, and hence no current flows to the cell selector lines SL.

In the above description, it is assumed that the potential levels of the control gates CG of the memory cell transistors TM1a and TM1b are held at 0 V in the standby state.

However, no current flows to the cell selector lines SL unless the emitter and the base of the bipolar transistor BT1a are forward-biased, and hence the potential levels of the control gates CG, i.e., those of the word lines WL may not necessarily be held at 0 V in the standby state.

Therefore, the following potential arrangements can be further employed in the standby state:

First, the potential levels of the bit lines BL, the word lines WL and the cell selector lines are set at −1.8 V, an arbitrary voltage and 0 V respectively in the standby state, for example.

It is assumed that the memory cell transistor TM1a, for example, is in a conducting state since the potential levels of the word lines WL are set at an arbitrary voltage in this case. However, the base region of the bipolar transistor BT1a, i.e., the source region of the memory cell transistor TM1a is biased to a negative side due to the potential level of the bit line BL, through the channel of the memory cell transistor TM1a. On the other hand, the emitter region of the bipolar transistor BT1a is held at 0 V by the cell selector line SL, and hence the emitter and the base are reverse-biased.

Also in this potential arrangement, therefore, no current flows to the cell selector lines SL in the standby state.

Second, an arrangement of holding the potential levels of the bit lines BL, the word lines WL and the cell selector lines SL at 0 V, an arbitrary voltage and 0 V respectively in the standby state is also possible.

Also in this case, the emitter and the base of the bipolar transistor BT1a formed in the source region of the memory cell transistor TM1a are not forward-biased even if the memory cell transistor TM1a is in a conducting state, for example.

Thus, no current flows to the cell selector lines SL in the standby state in this potential arrangement either.

Third, an arrangement of holding the potential levels of the bit lines BL, the word lines WL and the cell selector lines SL at −1.8 V, an arbitrary voltage and −1.8 V respectively in the standby state is also possible.

Also in this case, the emitter and the base of the bipolar transistor BT1a are not forward-biased even if the memory cell transistor TM1a is in a conducting state.

Thus, no current flows to the memory cell selector lines SL.

Fourth, it is also possible to employ a potential arrangement of applying the power supply potential Vcc to the N-type wells and setting the potential levels of the bit lines BL, the word lines WL (control gates CG) and the cell selector lines SL in accordance with any of the potential arrangements described with reference to FIGS. 47 to 49 or the aforementioned first to third potential arrangements.

Thus, it is possible to readily set the threshold voltages Vth of the memory cell transistors TM1a and TM1b in excess of 0 V, for example. Namely, no negative potential may be applied in case of selecting the word lines WL when the memory cell transistors TM1a and TM1b are P-channel transistors.

In the aforementioned first to fourth potential arrangements, further, it is possible to set the potential levels of the word lines WL at an arbitrary voltage in the standby state.

When the potential levels of the word lines WL are previously set at a read voltage also in the standby state, therefore, data can be read by driving only the potential levels of the bit lines BL and the cell selector lines SL, whereby the speed of the read operation can be increased.

The potential levels of the word lines WL can be set at an arbitrary voltage in the standby state. In other words, the absolute values of the threshold voltages Vth in "High Vth" and "Low Vth" states of the memory cell transistors TM1a and TM1b can be adjusted to have arbitrary values so far as a sufficient level difference is present therebetween as an operation margin.

This means that the read voltage may not necessarily be set at a negative voltage but can be set at 0 V or even a positive voltage in P-channel memory cell transistors.

Therefore, if the potential levels of the word lines WL can be set at 0 V in reading, for example, the potential levels of the word lines WL may be fixed at the ground potential and may not particularly be driven.

This means that the speed of the read operation can be increased and the circuit for driving the potential levels of the word lines WL can be simplified.

Figure 50:
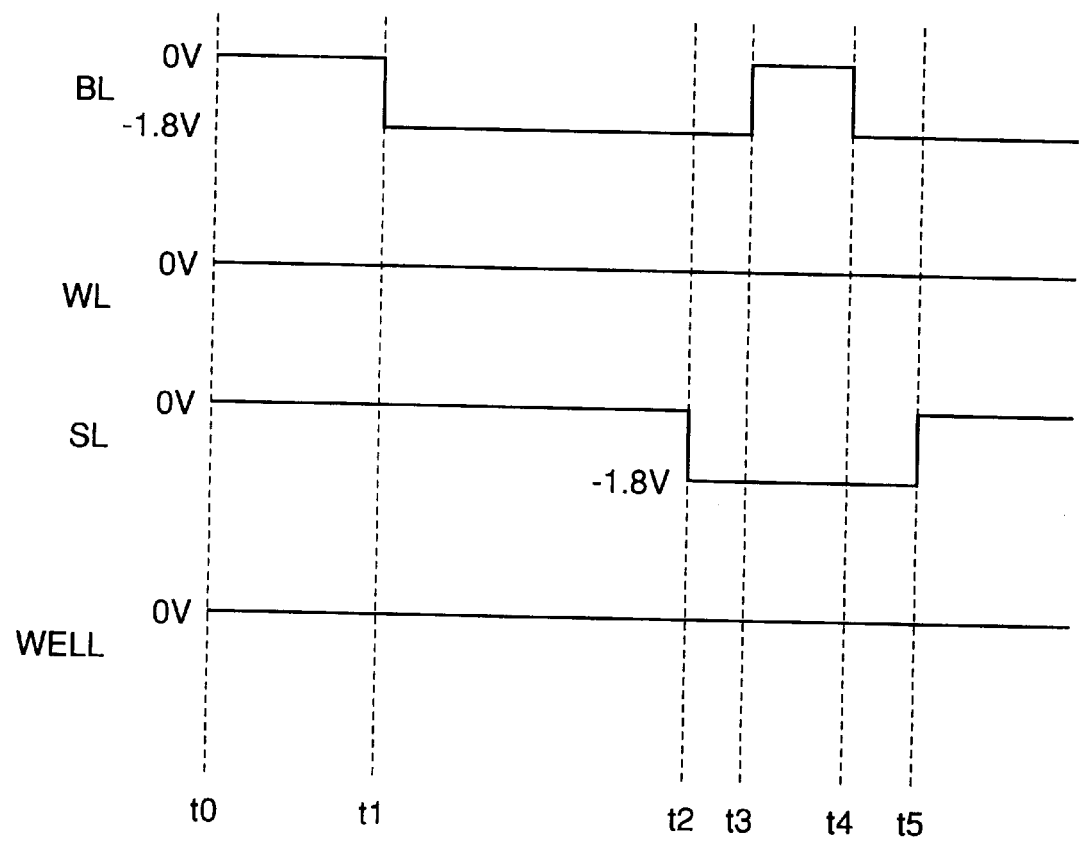
FIG. 50 is a timing chart for illustrating a read operation of the nonvolatile semiconductor memory device according to the embodiment 8 of the present invention.

FIG. 50 is a timing chart for illustrating time changes of the potential levels of the bit line BL, the word line WL, the cell selector line SL and the N-type well in the nonvolatile semiconductor memory device 2000 performing a read operation from the standby state described with reference to FIG. 47.

At a time t0, power is applied to the nonvolatile semiconductor memory device 2000.

It is assumed that the potential levels of the bit line BL, the word line WL, the cell selector line SL and the N-type well are set at −1.8 V, 0 V, 0 V and 0 V respectively at a time t1, to attain a potential arrangement in the standby state.

At a time t2, the potential level of the cell selector line SL is converted to that in an active state, i.e., −1.8 V.

At a time t2, the potential level of the bit line BL is converted to that in an active state, i.e., 0 V.

It is assumed that reading is performed when the potential level of the word line WL is at 0 V by adjusting threshold values of the memory cell transistor before and after writing.

Namely, it is assumed that data are so written that the threshold value of the memory cell is not more than 0 V in a "High Vth" state and in excess of 0 V in a "Low Vth" state respectively.

Due to the potential arrangement at the time t3, a current flows to the cell selector line SL in the memory cell of a "High Vth" state while no current flows in the memory cell of a "Low Vth" state. The sense amplifier 128 shown in FIG. 43 amplifies the value of this current.

At a time t4, the potential level of the bit line BL returns to −1.8 V in the standby state again.

At a time t5, the potential level of the cell selector line SL returns to 0 V in the standby state, whereby the potential arrangement also returns to that in the standby state.

In the read operation described with reference to FIG. 50, it is possible to read data held in the memory cell by simply changing the potential levels of the bit line BL and the cell selector line SL, without changing that of the word line WL.

The potential level of the word line WL remains unchanged during the read operation and in the standby state, whereby it is possible to read the data at a high speed with no influence by charge/discharge times for the word line WL.

Figure 51:
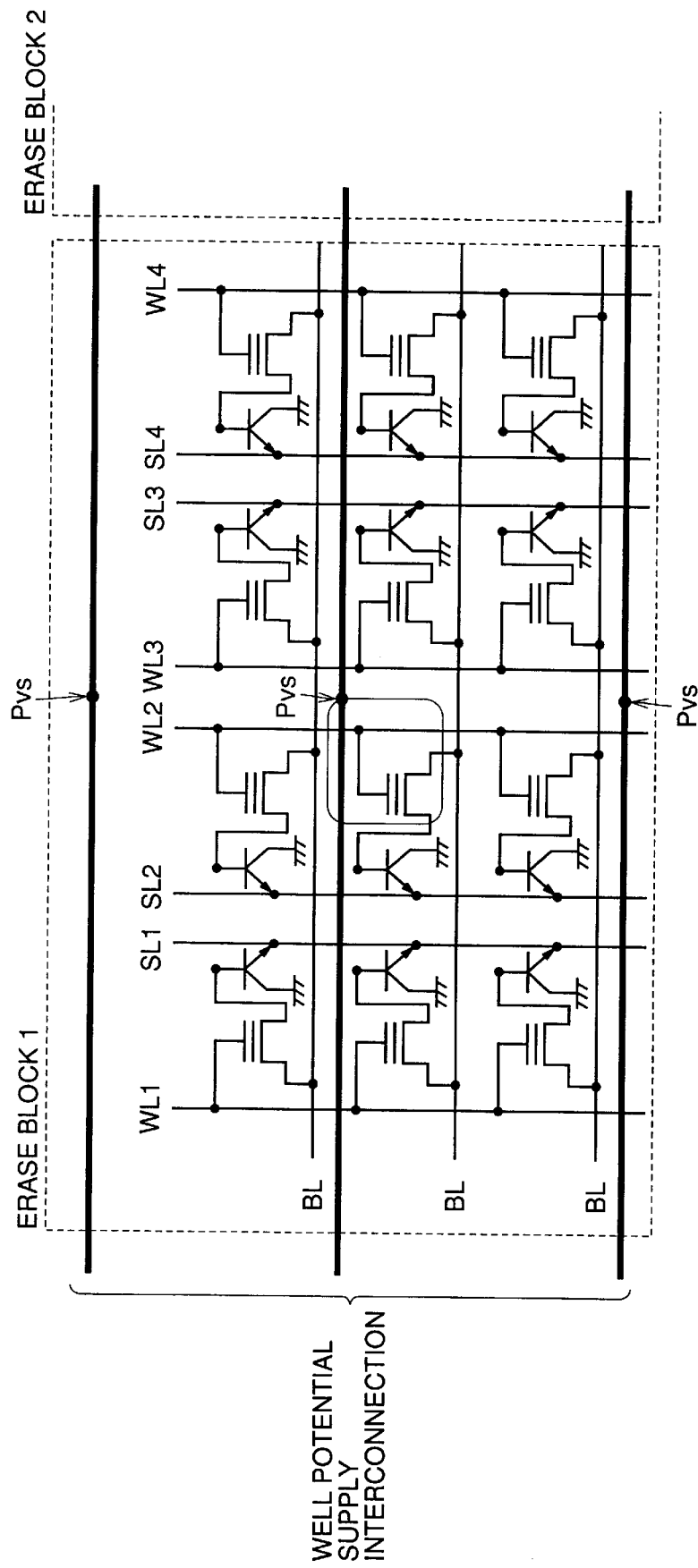
FIG. 51 is a plan view showing the arrangement of well potential supply wires in the memory cell array according to the embodiment 8 of the present invention.

FIG. 51 illustrates the structure of well potential supply interconnections for supplying a well potential to the memory cell array 104 shown in FIG. 43. This figure is compared with FIG. 15 with reference to the embodiment 1.

It is assumed that the memory cell array shown in FIG. 51 is present in the same erase block 1 in case of an erase operation.

Namely, it is assumed that FIG. 51 shows a memory cell array which is present in the same well in case of performing well division every erase block, for example.

In the example shown in FIG. 51, at least two interconnections supplied with a well potential from the well potential driving circuit 120 are present in the same erase block 1.

The well potential supply interconnections supply the ground potential or a positive high potential to the N-type wells, and are in contact with the N-type wells at feeder points Pvs.

The bipolar transistors having emitter regions defined by the source regions of the memory cell transistors have collector regions defined by the well regions, and hence the potential levels supplied by the well potential supply interconnections remarkably influence operations of the bipolar transistors.

When only a single well potential supply interconnection is provided in the erase block, for example, the collector resistance is effectively increased in each bipolar transistor separated from the position where the well.

Thus, there is such a possibility that saturation characteristics of the bipolar transistor are deteriorated to cause difficulty in a correct read operation. potential supply interconnection is in contact with the well surface.

Such saturation of the bipolar transistor can be reduced by arranging a plurality of well potential supply interconnections in the erase block 1, as shown in FIG. 51.

Also in the nonvolatile semiconductor memory device 2000 according to the embodiment 8 of the present invention, it is possible to perform parallel writing of a plurality of data and a parallel verify operation described with reference to FIGS. 16 to 18 in relation to the nonvolatile semiconductor memory device 1000 according to the embodiment 1 of the present invention.

Embodiment 9

Figure 52:
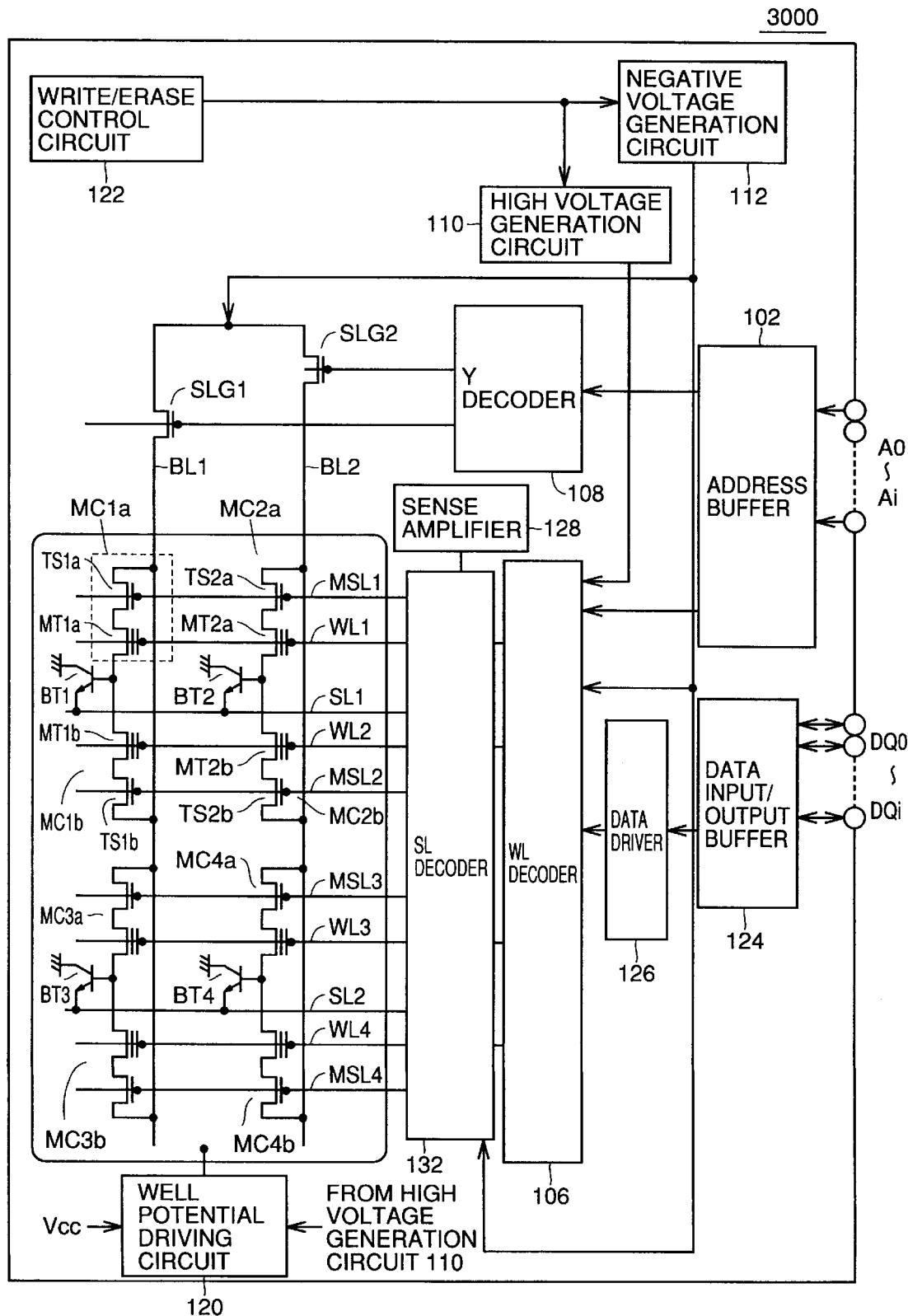
FIG. 52 is a schematic block diagram showing the structure of a nonvolatile semiconductor memory device 3000 according to an embodiment 9 of the present invention.

FIG. 52 is a schematic block diagram showing the structure of a nonvolatile semiconductor memory device 3000 according to an embodiment 9 of the present invention.

This nonvolatile semiconductor memory device 3000 is different in structure from the nonvolatile semiconductor memory device 1000 according to the embodiment 1 in the following points:

Also with reference to FIG. 52, it is assumed here that a memory cell array 104 has memory cells of four rows by two columns, for simplifying the illustration.

First, the nonvolatile semiconductor memory device 3000 is different in structure from the nonvolatile semiconductor memory device 1000 in a point that a cell selector transistor MS1a is connected between a bit line BL1 and a memory cell transistor MT1a as to a memory cell MC1a, for example.

Namely, the gate potential of the cell selector transistor MS1a is controlled by a second cell selector line MSL1 through a memory cell SL decoder 132, to bring connection between the bit line BL1 and the drain of the memory cell transistor MT1a into a conducting or cutoff state.

Cell selector lines for controlling the potential level of the emitters of bipolar transistors are hereinafter referred to as first cell selector lines SL.

Second, the memory cell SL decoder 132 controls the potential levels of both of a first cell selector line SL1 and the second cell selector line MSL1 in case of selecting the corresponding memory cell MC1a in response to address signals A0 to Ai, as described later.

The remaining structure such that each bipolar transistor is provided for two memory cells is similar to that of the nonvolatile semiconductor memory device 1000 shown in FIG. 1, and hence portions corresponding to those in FIG. 1 are denoted by the same reference numerals, to omit redundant description.

Figure 53:
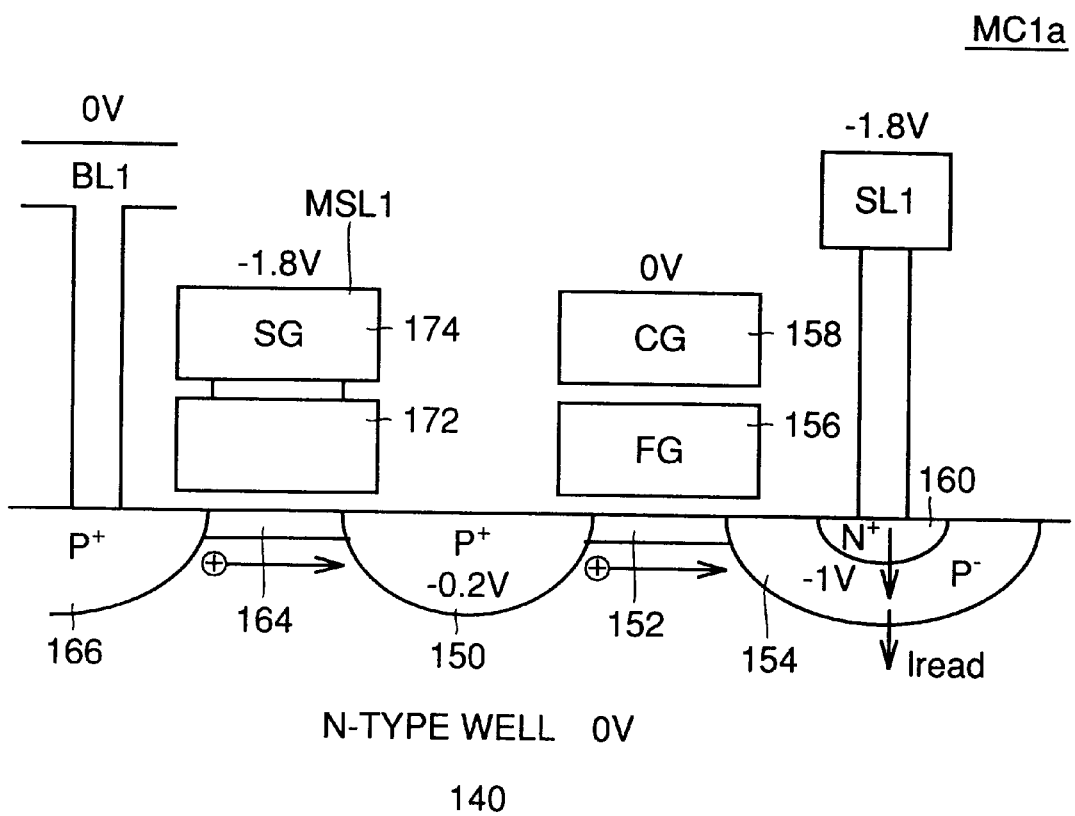
FIG. 53 is a sectional view showing the structure of a memory cell shown in FIG. 52.

FIG. 53 is a sectional view showing the structure of the memory cell MC1a shown in FIG. 52.

The memory cell MC1a includes an N-type well 140 provided on a semiconductor substrate surface, a P-type drain region 150 provided on the semiconductor substrate surface in the N-type well 140, a P-type source region 154, a channel region 152 held between the drain region 150 and the source region 154, a floating gate 156 formed on the channel region 152 through a tunnel oxide film, and a control gate 158 formed on the floating gate 156 through an insulating film.

Although not particularly restricted, it is assumed that the impurity concentration of the source region 154 is rather lowly set as compared with the drain region 150.

The memory cell MC1a further includes another channel region 164 formed on the surface of the N-type well 140 in proximity to the drain region 150, a second drain region 166 formed through the channel region 164 with respect to the drain region 150, a selector gate lower layer 172 formed on the channel region 164 through a tunnel oxide film by the same wiring layer (e.g., a polysilicon layer) as the floating gate 156, and a selector gate upper layer 174 formed to be electrically connected onto the selector gate lower layer 172 by the same wiring layer (e.g., a second polysilicon layer) as the control gate 158.

The selector gate lower and upper layers 172 and 174 are hereinafter generically called a selector gate SG.

The second cell selector line MSL1 controls the potential level of the selector gate SG.

A word line WL1 controls the potential level of the control gate 158.

The memory cell MC1a further includes an N-type emitter region 160 formed in the source region 154 on the semiconductor substrate surface side to be completely enclosed with this source region 154 except the semiconductor substrate surface.

Thus, a bipolar transistor is formed to have an emitter defined by the N-type emitter region 160, a base defined by the source region 154 and a collector defined by the N-type well 140. It is assumed that the N-type well 140 is supplied with a well potential (e.g., 0 V) by a well potential supply wire (not shown).

The emitter region 160 is connected with the first cell selector line SL1, and the second drain region 166 is connected with the bit line BL1.

The impurity concentration of the source region 154 is set to be lower than that of the drain region 150 since injection efficiency of the emitter is reduced if the impurity concentration of the source region 154 serving also as the base region of the bipolar transistor is excessively high.

FIG. 53 also shows an exemplary potential arrangement in the respective parts in a read operation.

In the read operation, the potential levels of the bit line BL1 and the first cell selector line SL1 are held at 0 V and −1.8 V respectively.

On the other hand, it is assumed that the potential levels of the selector gate SG of the cell selector transistor MS1a and the control gate 158 are held at −1.8 V and 0 V respectively.

It is also assumed here that the potential level of the control level 158 is set to be 0 V in reading by adjusting a write threshold value of the memory cell transistor MT1a.

The cell selector transistor MS1a enters a conducting state since the potential level of the selector gate SG is −1.8 V, and the bit line BL1 is connected with the first drain region 150 through the channel region 164.

On the other hand, the emitter region 160 of the bipolar transistor is biased to −1.8 V by the first cell selector line SL1.

Therefore, when the memory cell transistor MT1a holds data bringing the same into a conducting state since the potential level of the control gate 158 is 0 V, for example, the base region of the bipolar transistor, i.e., the source region 154 is biased to a positive side with respect to the emitter region 160 from the first drain region 150 through the channel region 152.

Therefore, the emitter and the base of the bipolar transistor are forward-biased, and an emitter current obtained by amplifying a base current flowing into the first cell selector line SL1 through the channel region 152 by a value corresponding to a current amplification factor flows as a read current Iread.

When the memory cell transistor MT1a holds data not bringing the same into a conducting state even if the potential level of the control gate 158 is 0 V, on the other hand, no bias is applied to the source region 154 which is the base region of the bipolar transistor, and no base current flows either.

Therefore, no read current Iread flows to the first cell selector line SL1.

Namely, the data stored in the memory cell transistor MT1a can be read by amplifying the current value by a sense amplifier 128 shown in FIG. 52.

Figure 54:
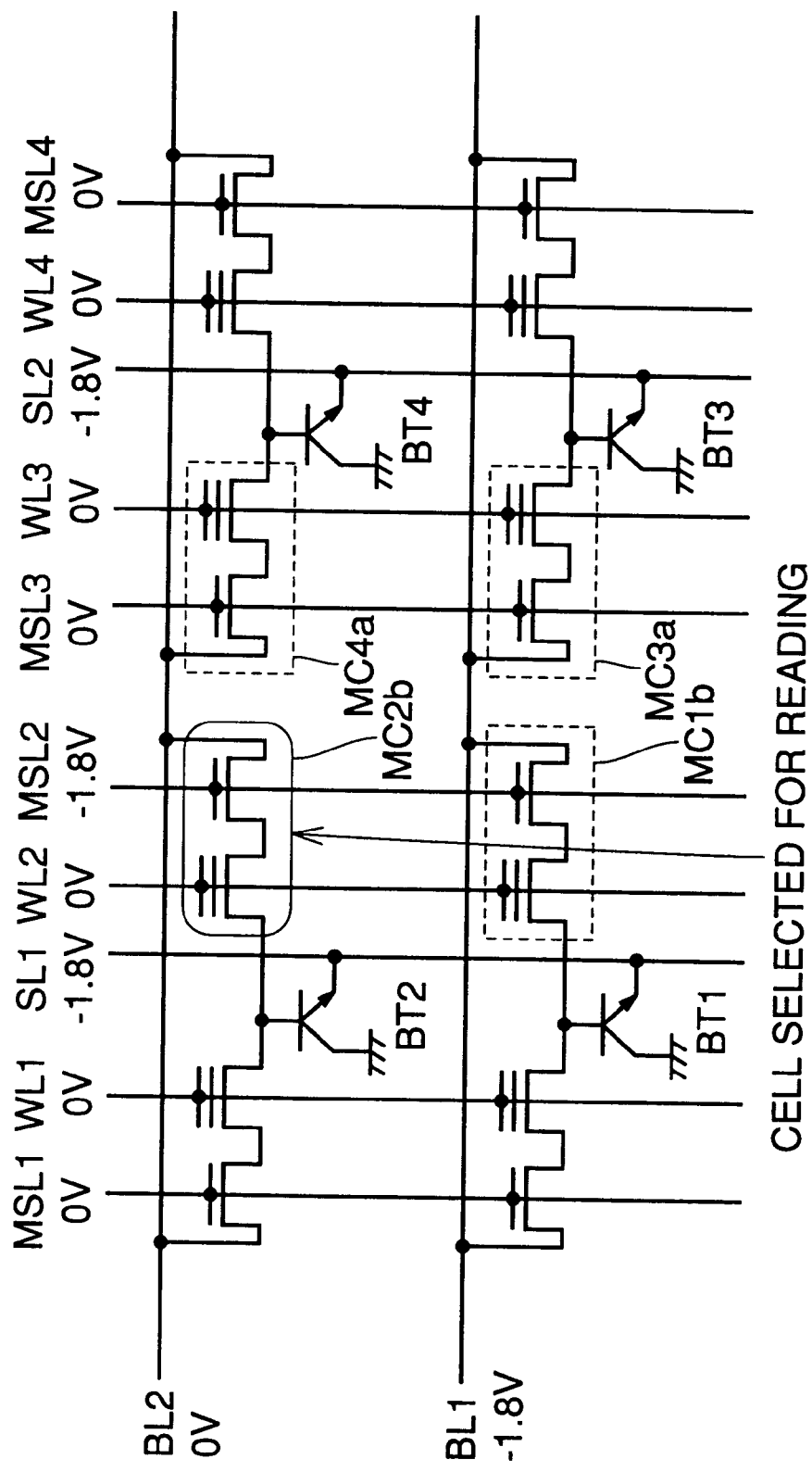
FIG. 54 is a circuit diagram showing the structure of a memory cell array 104 shown in FIG. 52 in more detail.

FIG. 54 is a circuit diagram showing the structure of the memory cell array 104 shown in FIG. 52 in more detail.

Referring to FIG. 54, it is assumed that a potential level bringing a memory cell MC2b into a selected state is applied to bit lines BL1 and BL2, second cell selector lines MSL1 to MSL4 and first cell selector lines SL1 and SL2.

Namely, the potential level of the bit line BL2 connected with the drain of a cell selector transistor MS2b of the memory cell MC2b is held at 0 V, while that of the bit line BL1 is held at −1.8 V.

Further, it is assumed that the potential level of the first cell selector line SL1 connected with the emitter of a bipolar transistor BT2 is held at −1.8 V and that of the second cell selector line MSL2 connected with a selector gate SG of the cell selector transistor MS2b is also held at −1.8 V.

The potential levels of the remaining first and second cell selector lines SL2 and MSL1, MSL3 and MSL4 are held at 0 V.

On the other hand, it is assumed that the potential level of a word line WL2 connected with the gate of a memory cell transistor MT2b of the memory cell MC2b is held at 0 V, and those of the remaining non-selected word lines WL1, WL3 and WL4 are also held at 0 V in the read operation, as described above.

Figure 55:
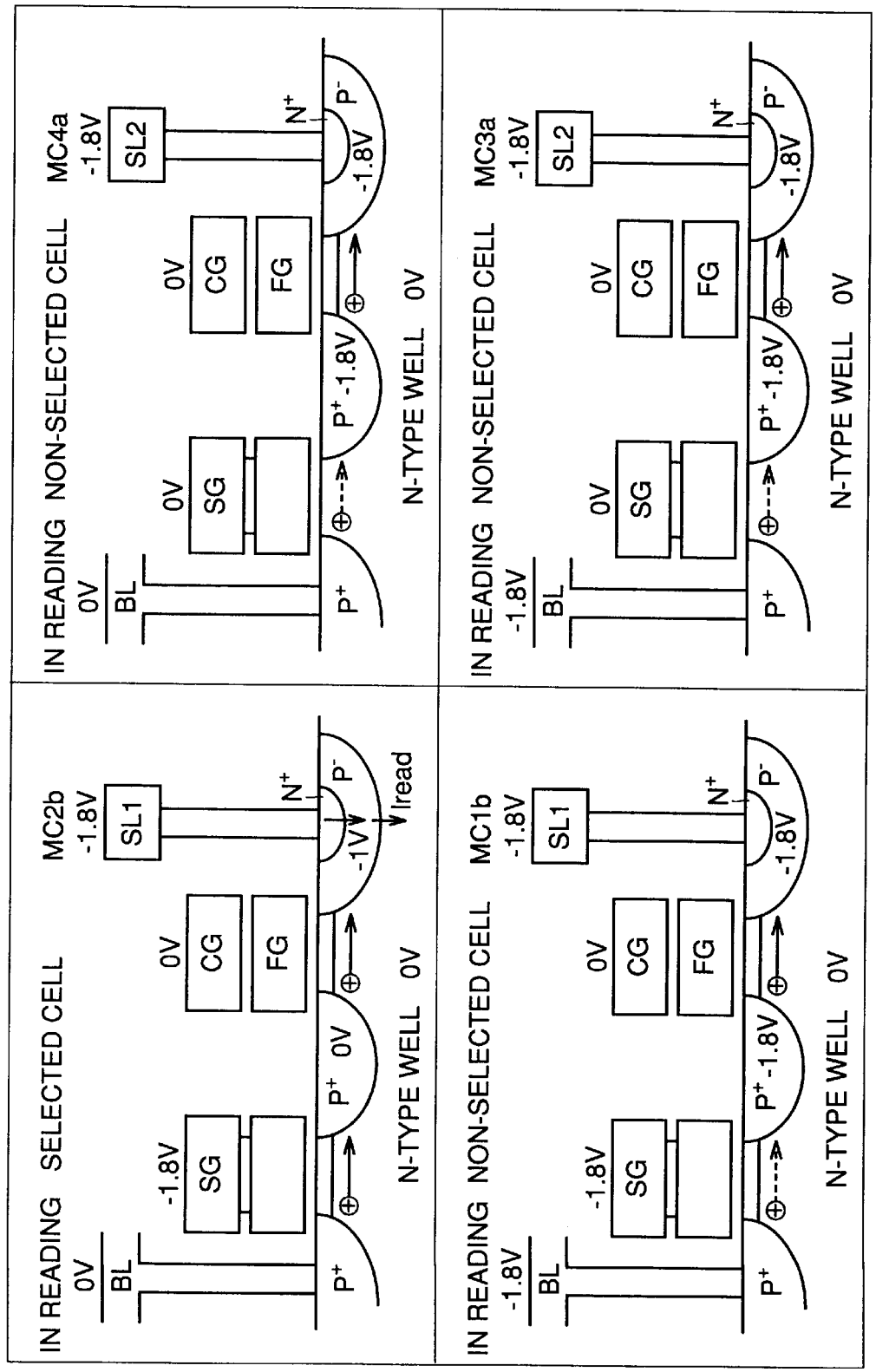
FIG. 55 is a conceptual diagram for illustrating a potential arrangement in selected and non-selected states of memory cells shown in FIG. 54.

FIG. 55 is a conceptual diagram showing potential arrangements and current flows in the respective memory cells MC2b, MC4a, MC1b and MC3a shown in FIG. 54.

As to the selected memory cell MC2b, the potential levels of the bit line BL, the selector gate SG, the control gate CG, the first cell selector line SL1 and the N-type well are held at 0 V, −1.8 V, 0 V, −1.8 V and 0 V respectively, as described with reference to FIG. 53.

When the memory cell transistor MT2b is in a conducting state, therefore, the base region 154 is biased to a positive side as compared with the potential level of the emitter region 160, in response to the potential level of the bit line BL.

In this case, the emitter-base junction is forward-biased, and a read current Iread flows to the first cell selector line SL1.

In the non-selected memory cell MC4a, on the other hand, the potential levels of the bit line BL, the selector gate SG, the control gate CG and the first cell selector line SL2 are 0 V, 0 V, 0 V and −1.8 V respectively.

Thus, a cell selector transistor is in a cutoff state, and the bit line BL supplies no base current to the base region 154.

Therefore, no current flows to the first cell selector line SL2 regardless of data stored in the memory cell MC4a.

In the non-selected memory cell MC1b, the potential levels of the bit line BL, the selector gate SG, the control gate CG, the first cell selector line SL1 and the N-type well are held at −1.8 V, −1.8 V, 0 V, −1.8 V and 0 V respectively.

In this case, a cell selector transistor MS1b is in a conducting state.

Even if a memory cell transistor MT1b is in a conducting state since the potential level of the control gate CG is 0 V, the base region of the bipolar transistor, i.e., the source region of the memory cell transistor MT1b is not positively biased with respect to the emitter region biased at −1.8 by the first cell selector line SL1 since the potential level of the bit line BL is −1.8 V.

Therefore, the emitter-base junction of the bipolar transistor is not forward-biased, and hence no emitter current flows to this bipolar transistor.

Namely, no current flows to the first cell selector line SL1 of the non-selected memory cell MC1b regardless of storage information held in the memory cell transistor MT1b.

In the non-selected memory cell MC3a, the potential levels of the bit line BL, the selector gate SG, the control gate CG, the first cell selector line SL2 and the N-type well are held at −1.8 V, 0 V, 0 V, −1.8 V and 0 V respectively.

Thus, a cell selector transistor MS3a is in a cutoff state, and hence the source region of a memory cell transistor MT3a, i.e., the base region of a bipolar transistor is electrically cut off from the bit line BL.

Namely, no base current is supplied to the bipolar transistor, and hence no current flows to the first cell selector line SL2 connected with the non-selected memory cell MC3a.

Due to the aforementioned arrangements of the potential levels of the bit lines BL, the word lines WL, the first cell selector lines SL and the second cell selector lines MSL, a current flows to the first cell selector line SL in the selected memory cell in response to the data stored therein while no currents flow to the first cell selector lines SL in the non-selected memory cells.

Thus, it is possible to read storage information from the selected memory cell to the exterior by reading the value of the current flowing to the first cell selector line SL.

Exemplary potential arrangements in the standby state of the memory cell MC1a described with reference to FIG. 53 are now described.

Figure 56:
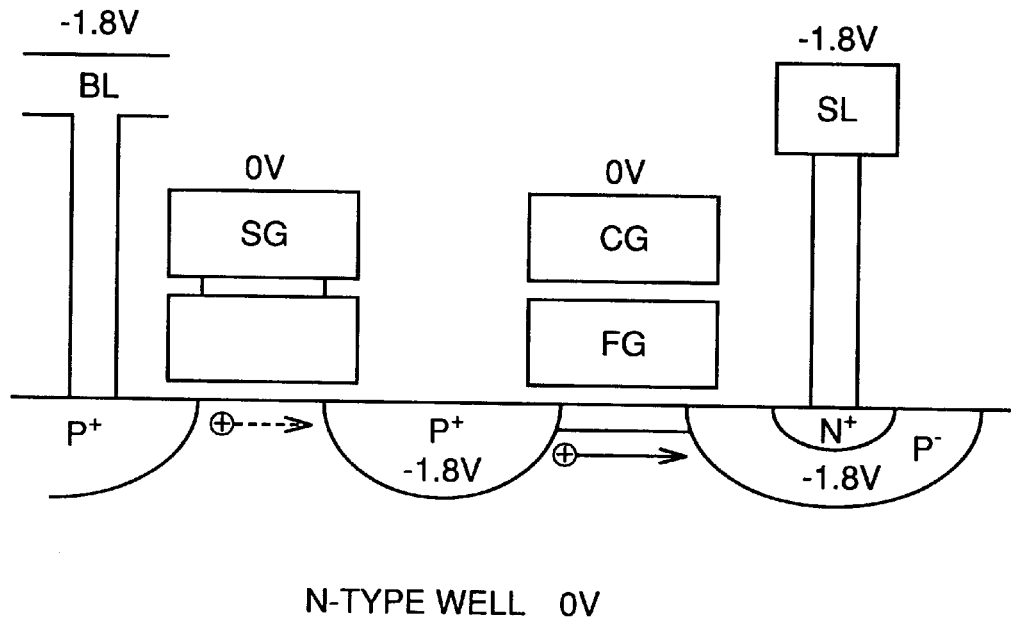
FIG. 56 is a first conceptual diagram for illustrating the potential arrangement in a standby state of the memory cell shown in FIG. 53.

FIG. 56 illustrates an exemplary potential arrangement in the standby state of the memory cell MC1a illustrated in FIG. 53.

Referring to FIG. 56, the potentials of the bit line BL, the selector gate SG, the control gate CG, the first cell selector line SL and the N-type well are held at −1.8 V, 0 V, 0 V, −1.8 V and 0 V respectively.

The cell selector transistor MS1a is in a cutoff state due to this potential arrangement, and hence no base current is supplied to the bipolar transistor having a base layer defined by the source region of the memory cell transistor MT1a.

Thus, no current flows to the first cell selector line SL in the standby state.

In order to attain a read state potential arrangement from this state, the potential levels of the bit line BL and the selector gate SG may be converted to 0 V and −1.8 V respectively.

Figure 57:
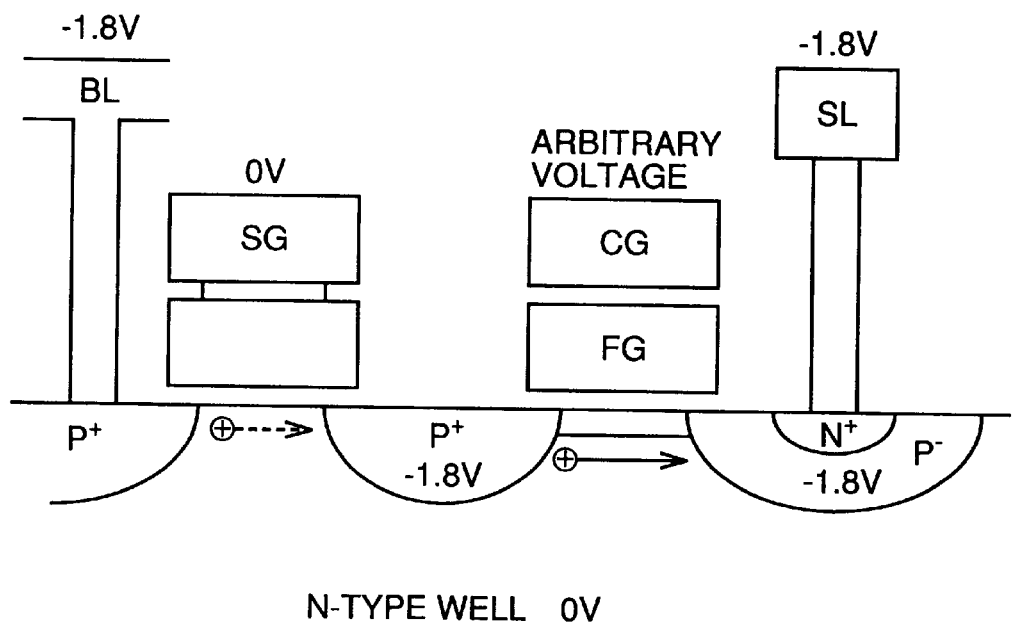
FIG. 57 is a second conceptual diagram for illustrating another potential arrangement in the standby state of the memory cell shown in FIG. 53.

FIG. 57 is a conceptual diagram for illustrating another exemplary potential arrangement in the standby state of the memory cell MC1a illustrated in FIG. 53.

Referring to FIG. 57, the potentials of the bit line BL, the selector gate SG, the first cell selector line SL and the N-type well are held at −1.8 V, 0 V, −1.8 V and 0 V respectively.

In this case, the selector gate SG of the cell selector transistor MS1a is held at a potential level attaining a cutoff state as described with reference to FIG. 56, and hence the potential level of the word line WL may not necessarily be set at 0 V.

Referring to FIG. 57, therefore, the potential level of the word line WL, i.e., that of the control gate CG of the memory cell transistor MT1a is set at an arbitrary voltage.

In order to attain a read state potential arrangement from this state, the potential levels of the bit line BL and the selector gate SG may be converted to 0 V and −1.8 V respectively.

Also in this case, the potential level of the word line WL, i.e., that of the control gate CG can be set at an arbitrary voltage in a read operation by adjusting the threshold voltage of the memory cell transistor MT1a shifted in response to write data.

Therefore, the potential level of the word line WL may not be changed in shifting from the standby state to a read state.

Similarly to the embodiment 1 or 8, it is also possible to employ a structure of applying a power supply potential Vcc to the N-type well while holding the remaining parts at the potential levels shown in FIG. 56 or 57 for attaining a standby state.

Figure 58:
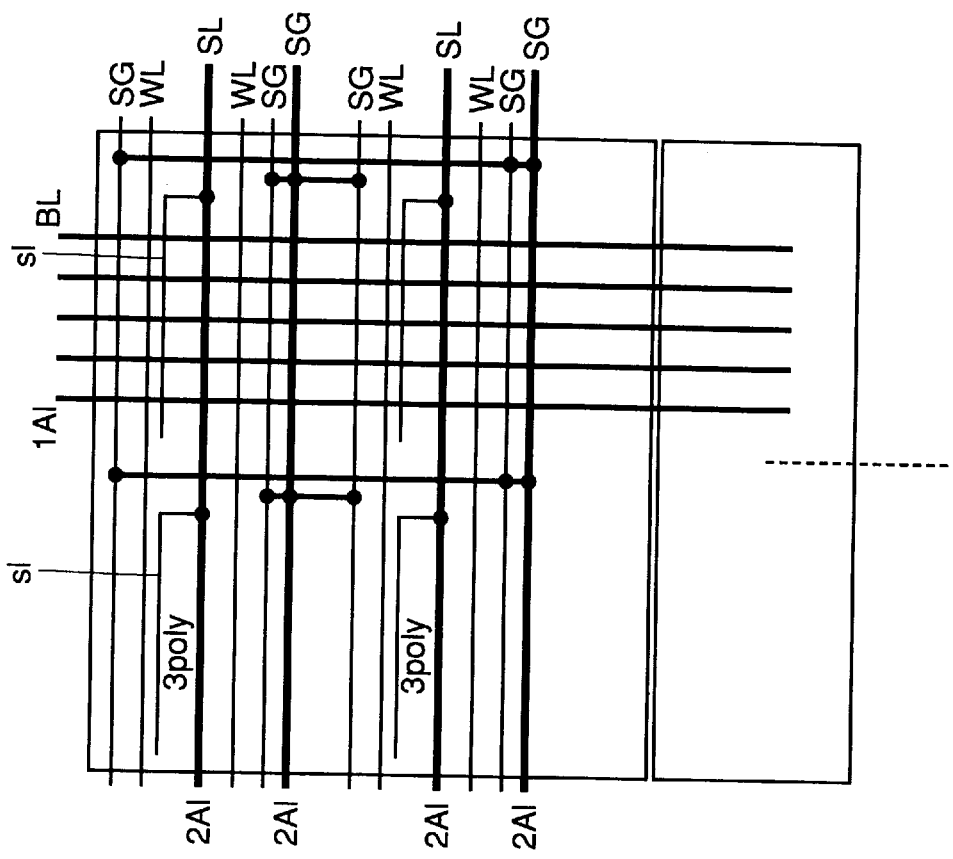
FIG. 58 is a plan view showing a first exemplary wiring pattern in the memory cell array shown in FIG. 52.

FIG. 58 is a conceptual diagram showing a plane pattern of the bit lines BL, the word lines WL, the first cell selector lines SL and the second cell selector lines MSL in the memory cell array 104 shown in FIG. 52.

Referring to FIG. 58, it is assumed that the first cell selector lines SL have a hierarchical structure, and the second cell selector lines MSL (wires controlling the selector gates SG) have the so-called pile structure by metal wires.

In the example shown in FIG. 53, it is assumed that a first polysilicon layer forming the floating gate 156 of the memory cell transistor MT1a and the selector gate lower layer 172 of the cell selector transistor MS1a are formed by the same polysilicon layer and a second polysilicon layer forming the control gate CG of the memory cell transistor MT1a and the selector gate upper layer 174 of the cell selector transistor MS1a are formed by the same polysilicon layer.

However, it is also possible to employ such a structure that a gate of a selector gate transistor is prepared only from the first polysilicon layer forming the floating gate 156, for example.

Referring to FIG. 58, the selector gates SG are formed by first and second polysilicon layers which are stacked to be electrically coupled with each other.

The word lines WL are formed by the second polysilicon layers forming the control gate CG of the memory cell transistor MT1a and the like.

Further, it is assumed that subwires s1 of the first cell selector lines SL are formed by third polysilicon layers over a plurality of columns.

The bit lines BL are arranged in the column direction by first aluminum wires.

Further, it is assumed that the subwires s1 of the first cell selector lines SL formed by the third polysilicon layers and main wires of the first cell selector lines SL formed by second aluminum wires are connected with each other with respect to a plurality of memory cell columns by the second aluminum wires.

On the other hand, it is assumed that the second cell selector lines MSL also have the so-called pile structure of connecting the second aluminum wires and the second polysilicon layers forming the selector gates SG for the plurality of memory cell columns.

The read operation is generally performed for eight bits at the same time, and hence eight selector gates SG are simultaneously selected. Therefore, it is possible to relax the wiring pitch of pile wires by providing the pile wires (denoted by symbol SG for thick lines 2A1 in FIG. 58) of the second cell selector lines MSL in correspondence to a set of a plurality of (two to eight) selector gates SG.

Also in this case, the potential levels of the word lines WL are held at 0 V in both read and standby states as described with reference to FIG. 53, whereby no influence is exerted on the reading speed even if the word lines WL are formed by the second polysilicon layers and have high wiring resistance.

The point that no influence is exerted on the reading speed even if the word lines WL are formed by the second polysilicon layers also applies to the case of holding the potential levels of the word lines WL at an arbitrary voltage in both standby and read states, as described with reference to FIG. 57.

Due to the aforementioned structure, changes of the potential levels of the bit lines BL, the first cell selector lines SL and the second cell selector lines MSL which must be changed in case of the read operation can be transmitted through the aluminum wires, whereby a high-speed read operation can be implemented.

Figure 59:
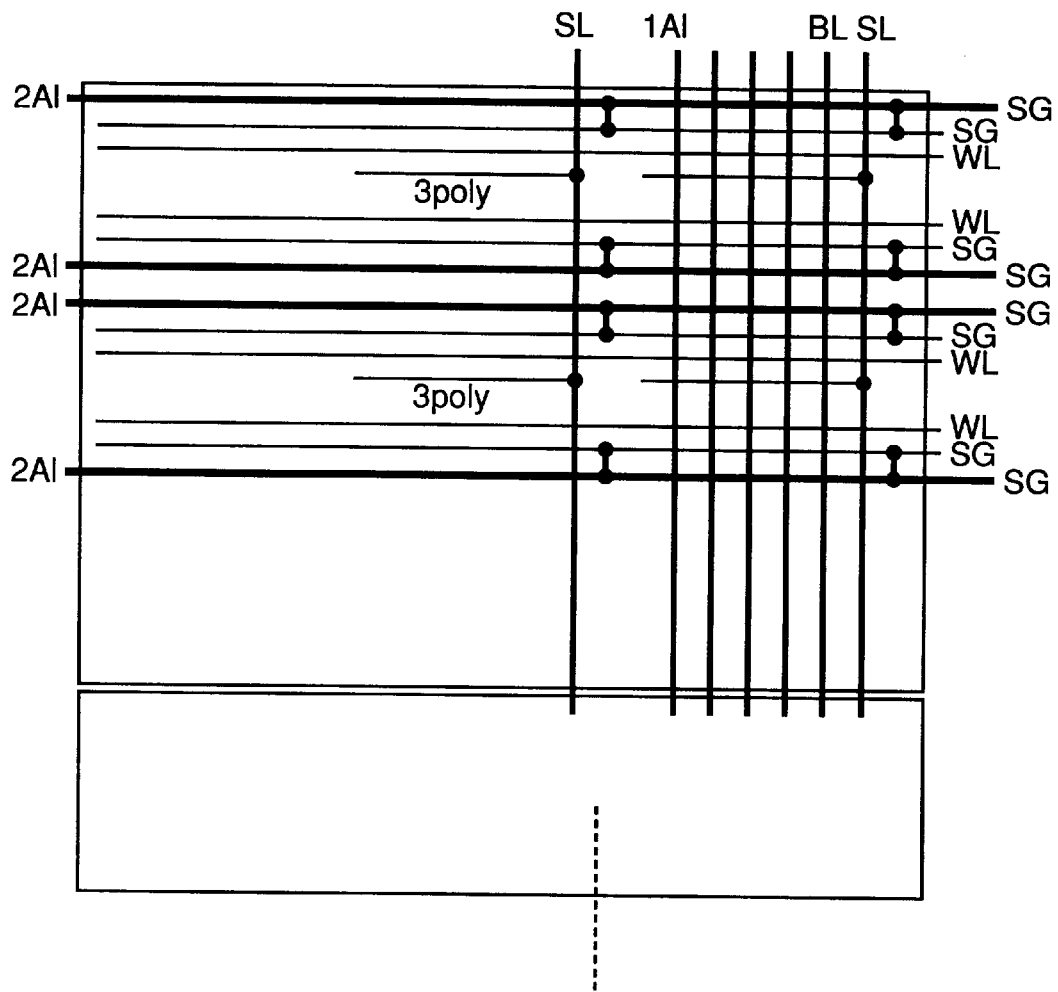
FIG. 59 is a plan view showing a second exemplary wiring pattern in the memory cell array shown in FIG. 52.

FIG. 59 is a plane pattern diagram showing another exemplary wiring pattern of the bit lines BL, the word lines WL, the first cell selector lines SL and the second cell selector lines MSL for the memory cell array 104 shown in FIG. 52.

This wiring pattern is different from that shown in FIG. 58 in the following point:

Referring to FIG. 58, the main wires of the first cell selector lines SL are arranged in parallel with the word lines WL, i.e., along the row direction.

In the example shown in FIG. 59, on the other hand, the main wires of the first cell selector lines SL are formed by first aluminum wires, to be in parallel with the bit lines BL.

Due to this structure, the wiring pitch of second aluminum wires can be formed with an allowance, whereby the second aluminum wires can be more simply formed as compared with the example shown in FIG. 58.

Figure 60:
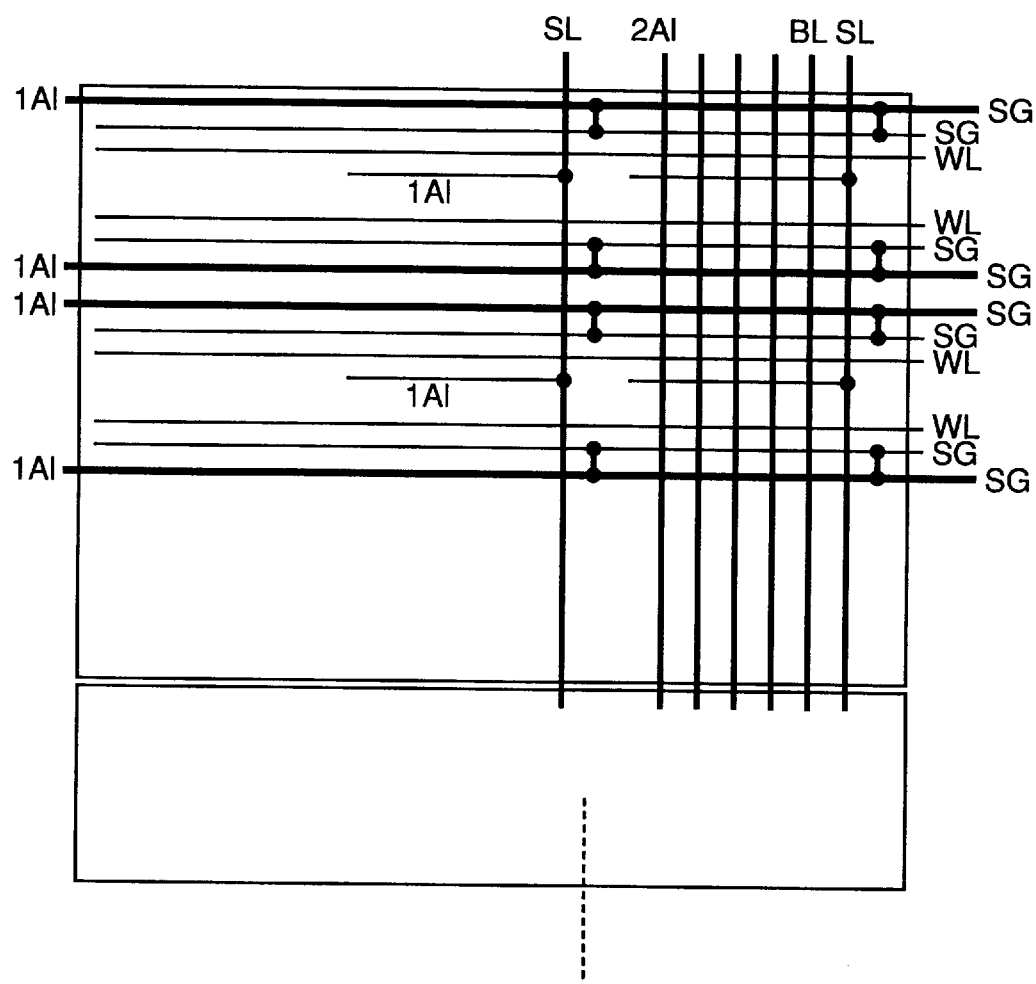
FIG. 60 is a plan view showing a third exemplary wiring pattern in the memory cell array shown in FIG. 52.

FIG. 60 is a plane pattern diagram showing a third exemplary wiring pattern of the bit lines BL, the word lines WL, the first cell selector lines SL and the second cell selector lines MSL for the memory cell array 104.

This plane pattern is different from that shown in FIG. 59 in a point that subwires of the first cell selector lines SL are formed by first aluminum wires, and pile wires of the second cell selector lines MSL are also formed by the first aluminum wires.

This is because the first cell selector lines SL may be provided in correspondence to the number of bits for simultaneously performing a read operation at the minimum, and the remaining ones can be simultaneously piled.

In response to this, the bit lines BL are formed by second aluminum wires, and the main wires of the first cell selector lines SL are also formed by the second aluminum wires.

Due to this structure, the resistance of subwires of the first cell selector lines SL can be reduced, whereby the operating speed is not reduced even if the number of columns of memory cells connected by the subwires of the first cell selector lines SL is increased.

In other words, it is possible to more largely provide the wiring pitch of the main wires of the first cell selector lines SL as compared with the case shown in FIG. 59.

FIG. 61 illustrates an exemplary potential arrangement on respective parts in the read operation of the memory cell MC1a described with reference to FIG. 53.

In the selected memory cell MC1a, the potential levels of the bit line BL, the word line WL, the first cell selector line SL and the second cell selector line MSL are 0 V, 0 V, −1.8 V and −1.8 V respectively.

On the other hand, the potential levels of the bit line BL, the word line WL, the first cell selector line SL and the second cell selector line MSL, i.e., the selector gate SG, which are in non-selected states are −1.8 V, 0 V, −1.8 V and 0 V respectively.

The potential levels of the N-type wells are held at 0 V.

Therefore, a potential responsive to storage information of only the selected memory cell flows to the first cell selector line SL, as described with reference to FIG. 55.

FIG. 62 illustrates exemplary potentials applied to the respective parts in case of writing data in the memory cell MC1a described with reference to FIG. 53.

In the memory cell MC1a which is so selected that data are written therein, the potential levels of the bit line BL, the word line WL, the selector gate SG, i.e., the second cell selector line MSL, and the first cell selector line SL are held at −6 V, 10 V, −7 V and 0 V respectively.

Due to the aforementioned potential arrangement, electrons generated by a band-to-band tunnel current are injected into the floating gate 156 of the selected memory cell MC1a so that the data are written therein.

In each non-selected memory cell, on the other hand, the potential levels of the bit line BL, the word line WL, the selector gate SG and the first cell selector line SL are held at −1.8 V, 0 V, 0 V and −1.8 V respectively.

Since the potential level of the selector gate SG is held at 0 V, the negative high voltage (i.e., −6 V) applied to the bit line BL in the write operation is not directly applied to the drain region of the memory cell transistor.

Therefore, it is possible to completely avoid the so-called drain disturb.

FIG. 63 illustrates an exemplary potential arrangement of potentials applied in an erase operation.

In the selected memory cell MC1a, the bit line BL and the potential levels of the word line WL, the selector gate SG and the first cell selector line SL are held in an open state and at −18 V, −1.8 V and 0 V respectively.

Due to this potential arrangement, the so-called F-N tunnel current flows from the floating gate 156 to the channel side for extracting electric charges, thereby erasing written data.

Figure 64:
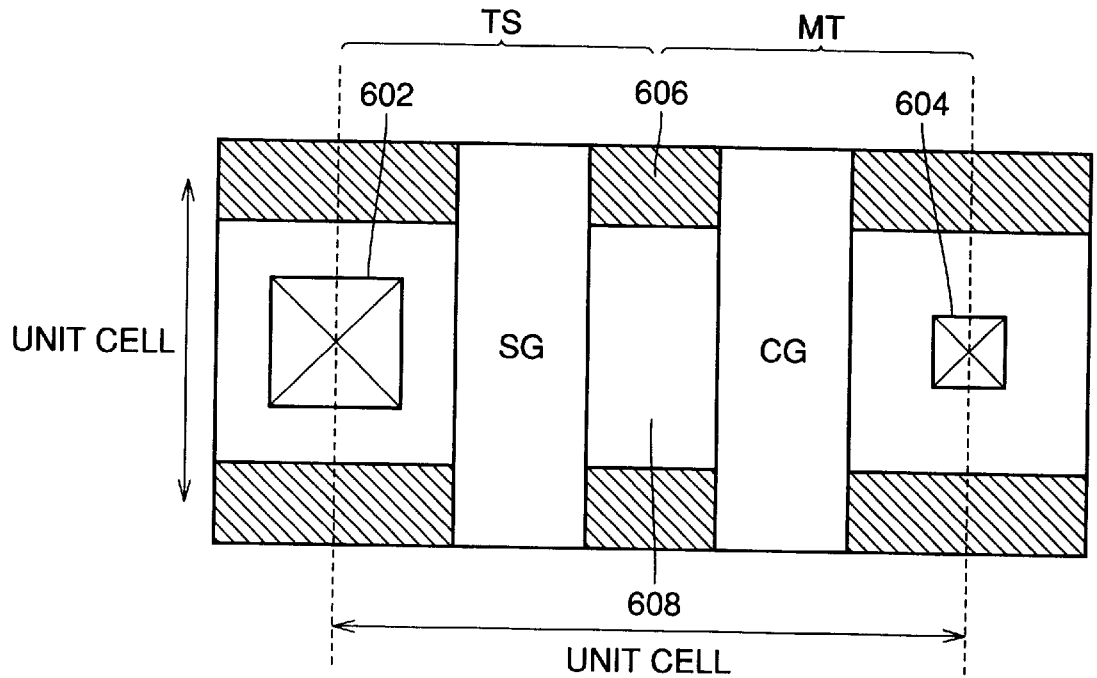
FIG. 64 is a plan view showing a first exemplary plane pattern of the memory cell illustrated in FIG. 53.

FIG. 64 illustrates the plane pattern of the memory cell MC1a described with reference to FIG. 53.

Referring to FIG. 64, a cell selector transistor TS and a memory cell transistor MT are formed to have the same channel width.

Namely, an active region 608 defined by an element isolation insulating film 606 has the same width in the cell selector transistor TS and the memory cell transistor MT.

A bit line contact hole 602 for connection with the bit line BL is formed in a drain region of the cell selector transistor TS, and a contact hole 604 for connection between the emitter of the bipolar transistor and the first cell selector line SL is formed in a source region of the memory cell transistor MT.

Figure 65:
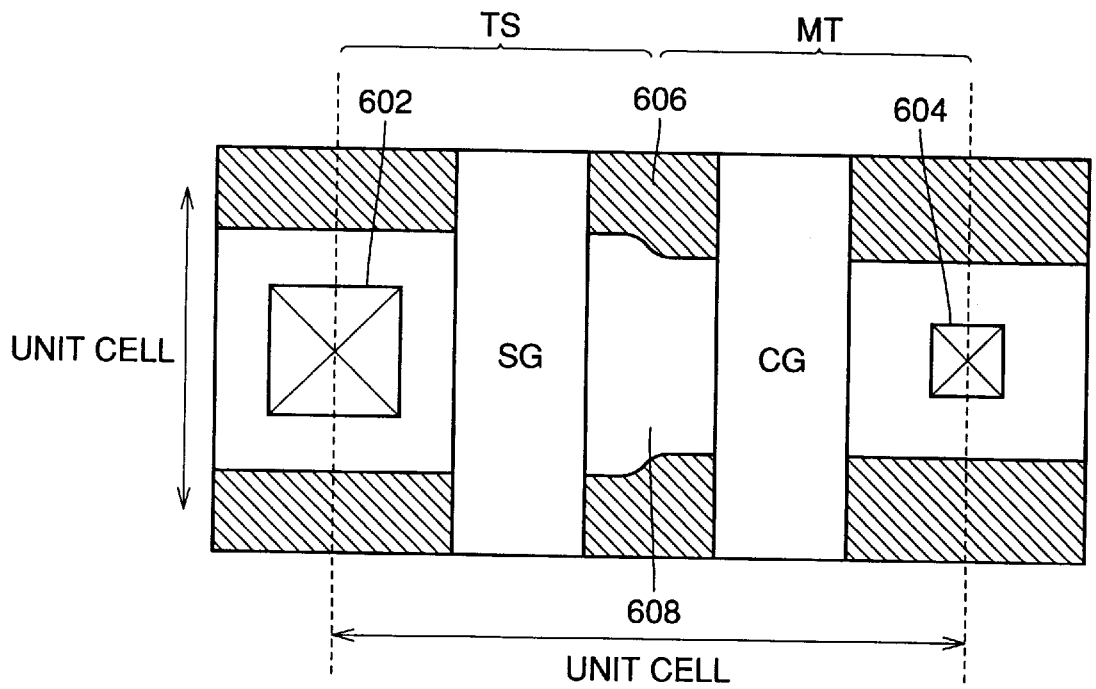
FIG. 65 is a plan view showing a second exemplary plane pattern of the memory cell illustrated in FIG. 53.

FIG. 65 is a pattern diagram showing a second exemplary plane pattern of the memory cell MC1a shown in FIG. 53.

This pattern is different from that shown in FIG. 64 in a point that the pattern for forming an element isolation insulating film 606 is changed to reduce the gate width of a memory cell transistor MT as compared with that of a cell selector transistor MS.

Due to this structure, the coupling ratio of the memory cell transistor MT can be increased while current drivability of the cell selector transistor MS can be highly maintained to ensure a read current value.

The coupling ratio of the memory cell transistor MT is a rate of effectively transmitting a voltage applied to a control gate electrode to a floating gate electrode.

The relation between an active region width and an applied voltage is now described.

First, a tunnel oxide film electric field Eox in an erase operation is described. In the erase operation, source, drain and substrate potentials in each memory cell transistor are equal to each other. If the quantity of electric charges stored in the memory cell transistor is zero, therefore, the following equation (1) holds due to the law of electric charges:

$$0 = (Vcg - Vfg) \times Cono + (Vsub - Vfg) \times (Cs + Cd + Csub) \quad (1)$$

where Vcg and Vfg represent the potentials of the control gate electrode and the floating gate electrode respectively, Cono and Csub represent the capacitances between the control gate electrode and the floating gate electrode and between the floating gate electrode and the substrate respectively, and Cd and Cs represent the capacitances between the floating gate electrode and the drain region and between the floating gate electrode and the source region respectively.

Due to the equation (1), the relations of the following equations (2) and (3) hold:

$$\alpha cg = Cono/(Cono + Cd + Csub + Cs) \quad (2)$$

$$Cfg = \alpha cg \times Vcg + (1 - \alpha cg) \times Vsub \quad (3)$$

where $\alpha cg$ represents the coupling ratio.

Therefore, the tunnel oxide film electric field Eox satisfies the relations of the following equations (4) and (5):

$$Eox = |Vfg - Vsub|/tox \quad (4)$$

$$= \alpha cg \times |Vcg - Vsub|/tox \quad (5)$$

where tox represents the tunnel oxide film thickness, and |Vcg−Vsub| represents an erase voltage.

Thus, the tunnel oxide film electric field Eox is increased when the coupling ratio $\alpha cg$ is increased. Thus, the erase voltage |Vcg−Vsub| can be reduced.

The capacitances Cono and (Cd+Csub+Cs) satisfy the relations of the following equations (6) and (7) respectively:

$$Cono = Eox \times Lcg\text{-}fg \times L/teff \quad (6)$$

$$(Cd + Csub + Cs) = Eox \times Weff \times L/tox \quad (7)$$

where L represents the gate length, teff represents the thickness of an ONO film in terms of oxide films, Weff represents the active region width, and Lcg-fg represents the overlapping length of the control gate electrode and the floating gate electrode respectively.

On the basis of the equations (2), (6) and (7), therefore, the following equation (8) holds as to the coupling ratio $\alpha cg$:

$$\alpha cg = 1/\{1 + teff \times Weff/(tox \times Lcg\text{-}fg)\} \quad (8)$$

Namely, the coupling ratio $\alpha cg$ is increased if the active region width Weff is reduced, due to the equation (8).

Due to the above relations, the erase voltage |Vcg−Vsub| can be reduced by reducing the active region width Weff. Namely, the voltage necessary for erasing can be reduced.

Also in the write operation, it is possible to reduce a write/erase voltage by reducing the active region width Weff and increasing the coupling ratio $\alpha cg$.

On the other hand, the current drivability of the cell selector transistor is increased due to increase of the active region width of the cell selector transistor, so that a gate applied voltage necessary for bringing the cell selector transistor into a conducting state in reading or the like can be reduced. Thus, these effects can be simultaneously attained by reducing and increasing the sizes of isolation oxide film forming masks in the memory cell transistor part and the cell selector transistor part respectively.

Figure 66:
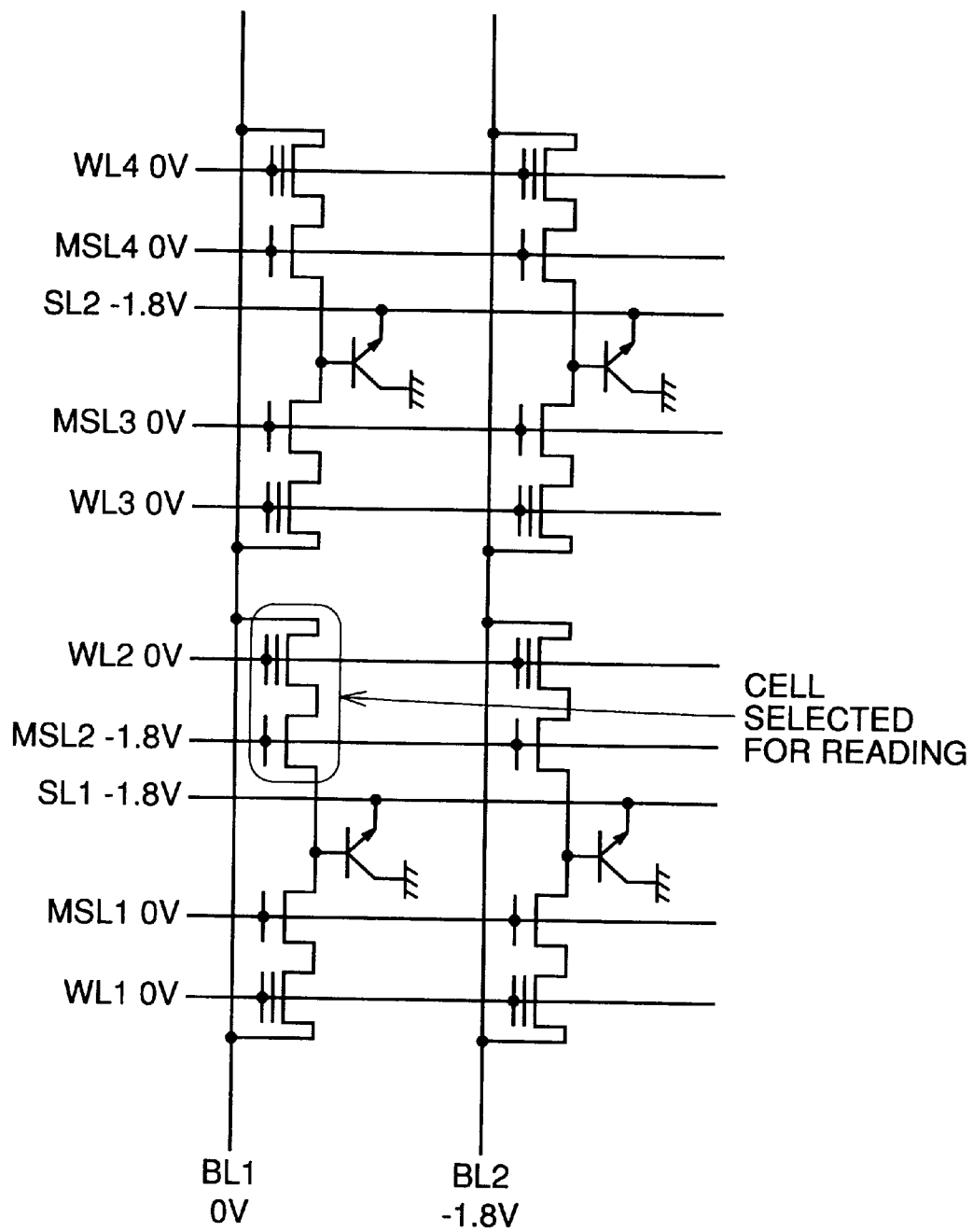
FIG. 66 is a circuit diagram showing a second exemplary structure of the memory cell array illustrated in FIG. 52.
Figure 67:
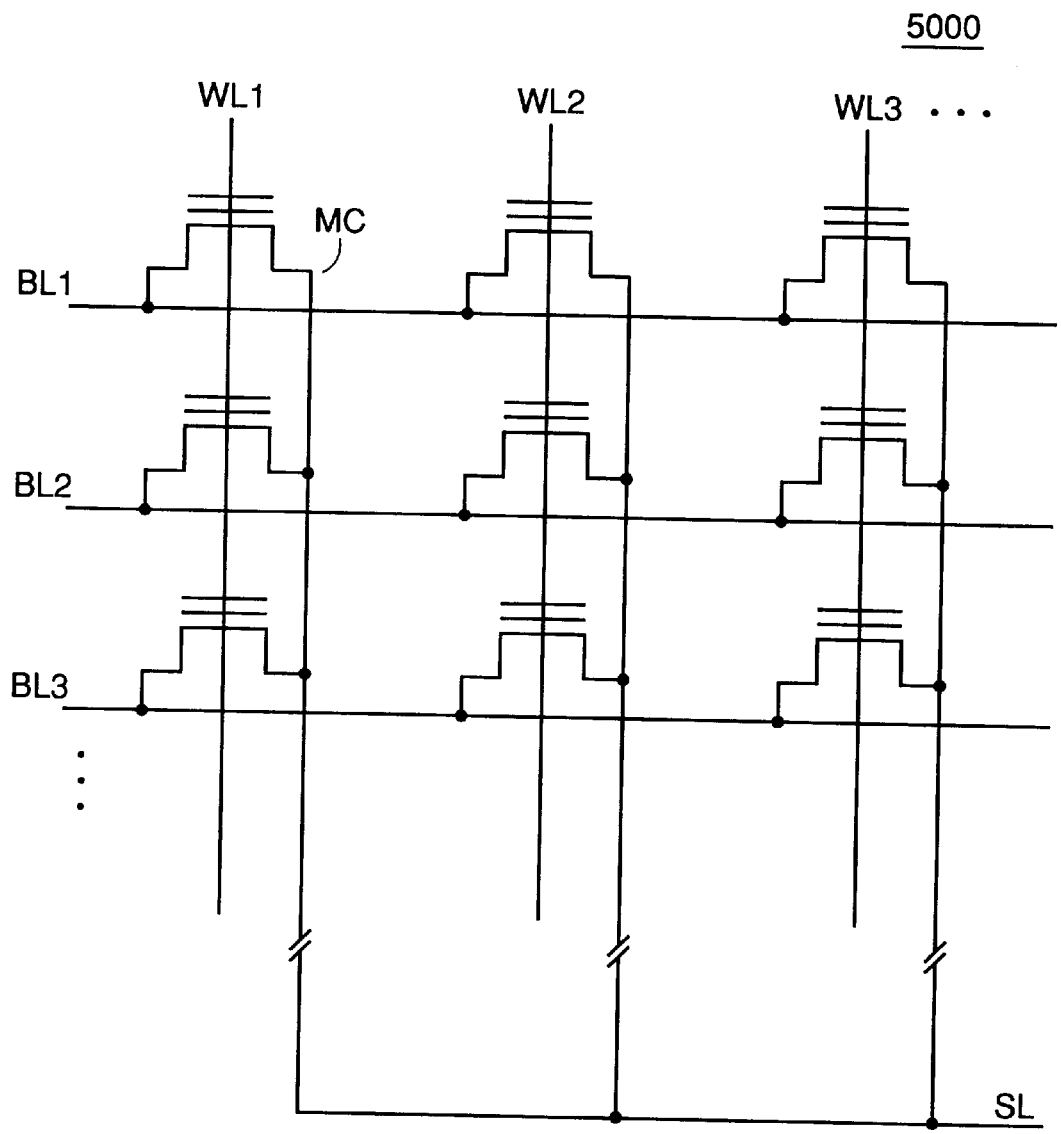
FIG. 67 is a circuit diagram showing the structure of a memory cell array of a conventional NOR flash memory.
Figure 68:
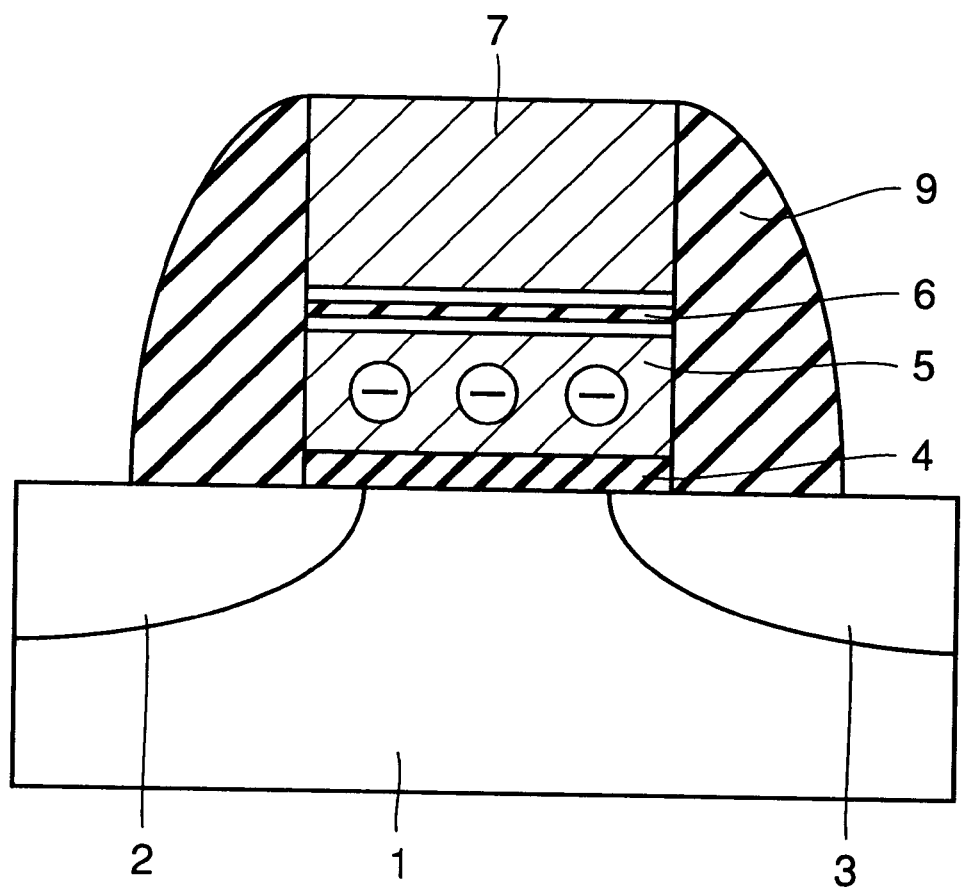
FIG. 68 is a model sectional view for illustrating the structure of a memory cell transistor of the conventional nonvolatile semiconductor memory device.
Figure 69:
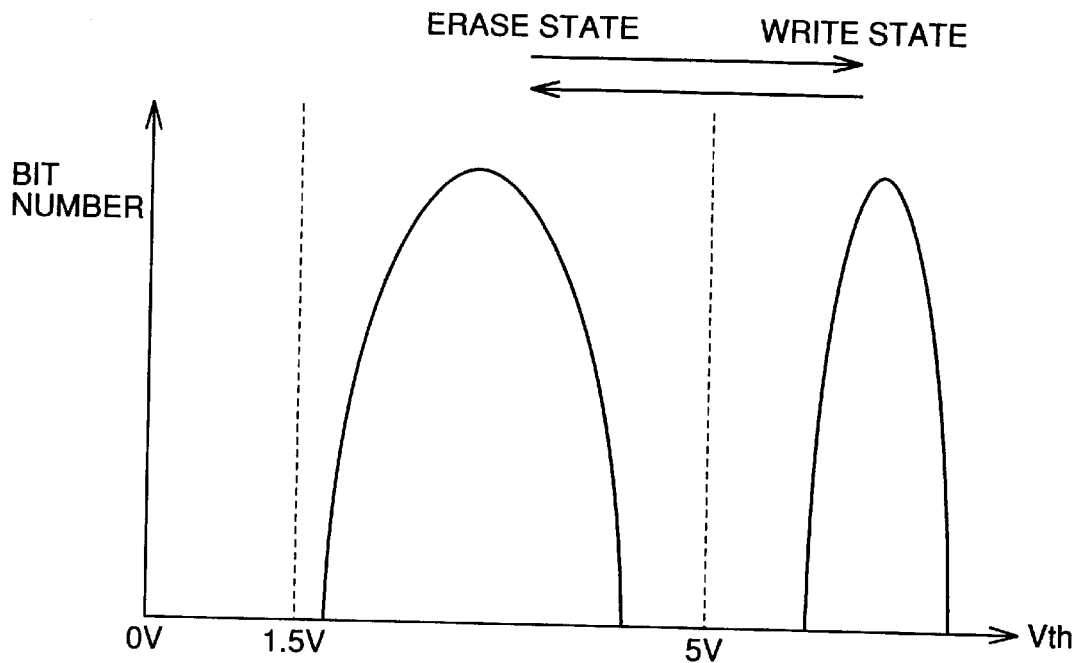
FIG. 69 illustrates threshold voltage distributions of memory cells in the conventional NOR flash memory.
Figure 70:
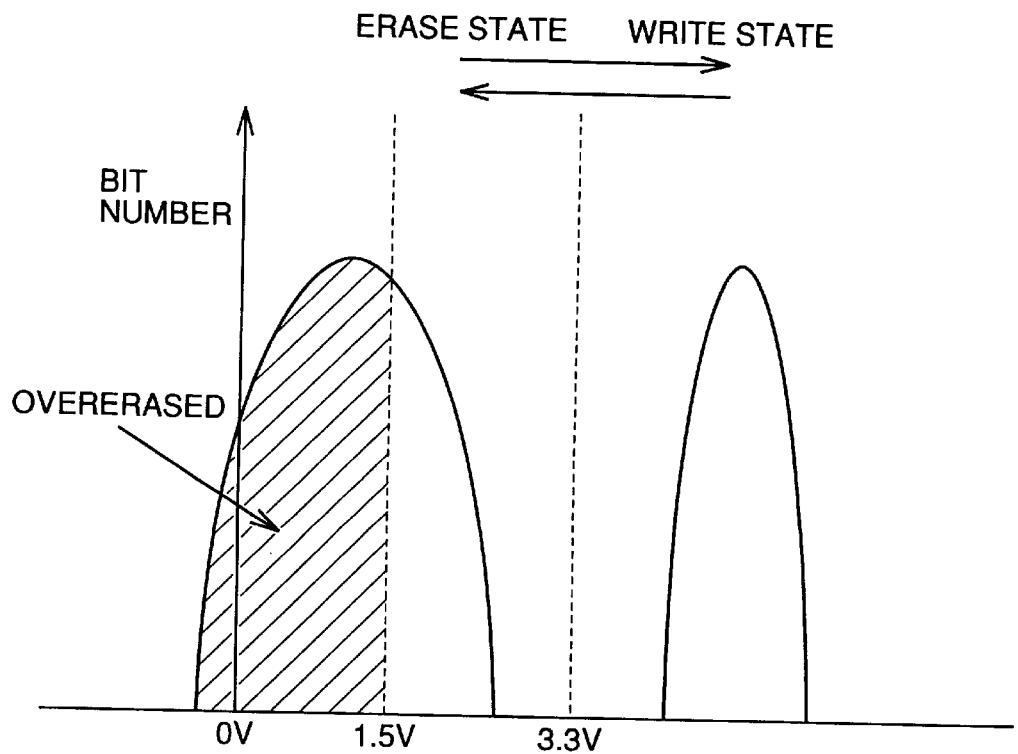
FIG. 70 illustrates threshold voltage distributions of the memory cells in the conventional NOR flash memory.
Figure 71:
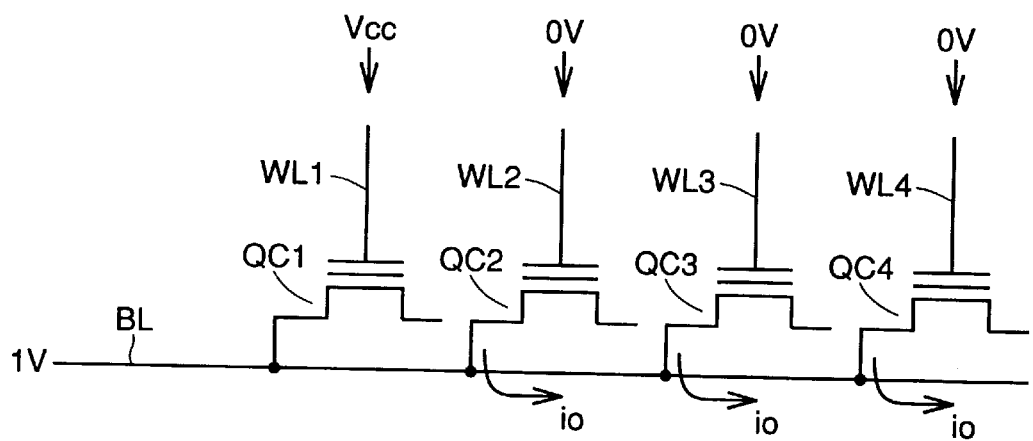
FIG. 71 is adapted to illustrate the problem of overerased cells in the conventional NOR flash memory.
Figure 72:
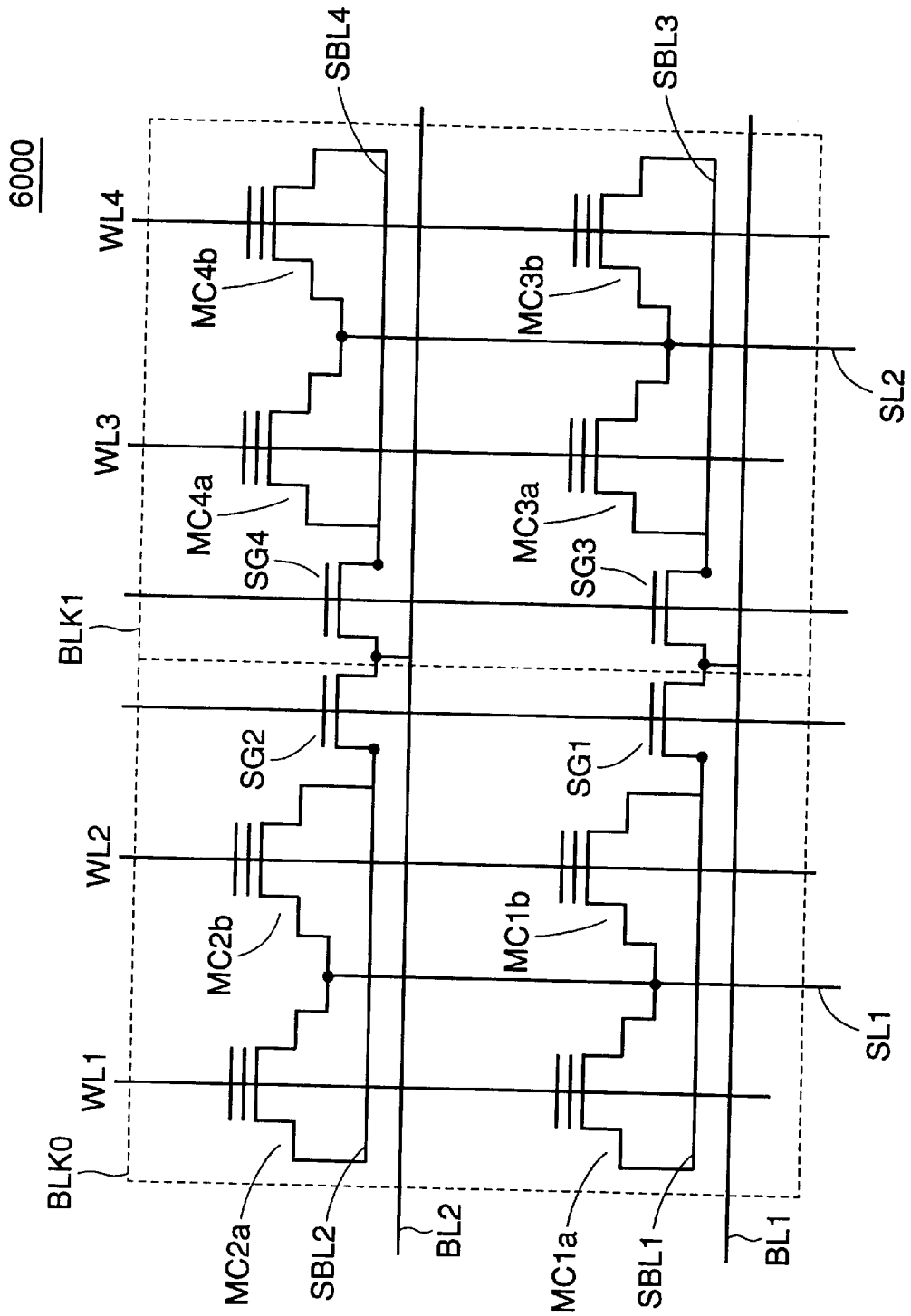
FIG. 72 is a circuit diagram showing the memory structure of a conventional DINOR flash memory.
Figure 73:
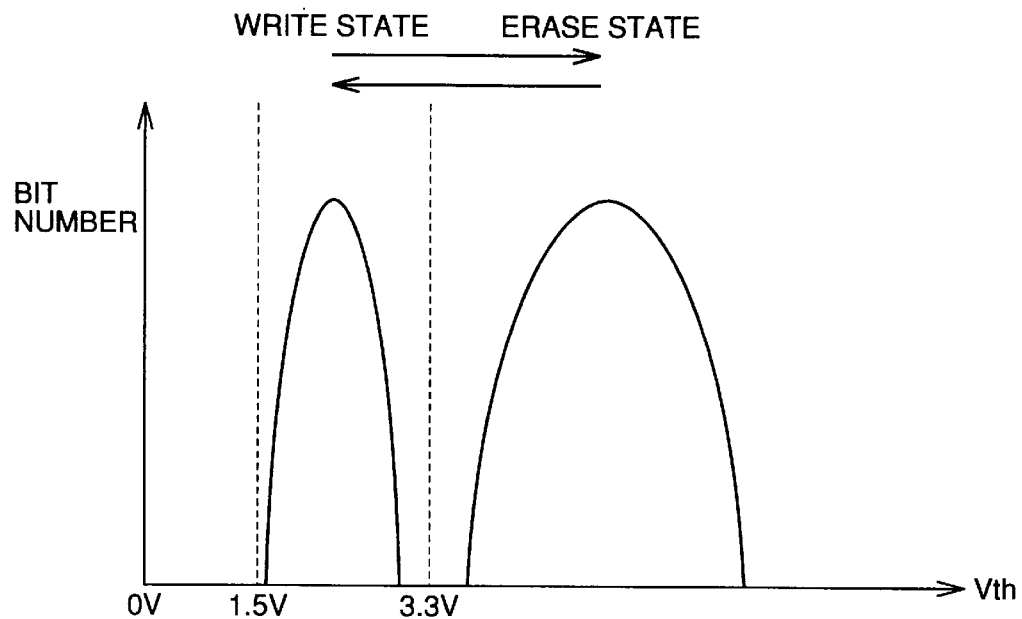
FIG. 73 illustrates threshold voltage distributions of memory cells in the conventional DINOR flash memory.
Figure 74:
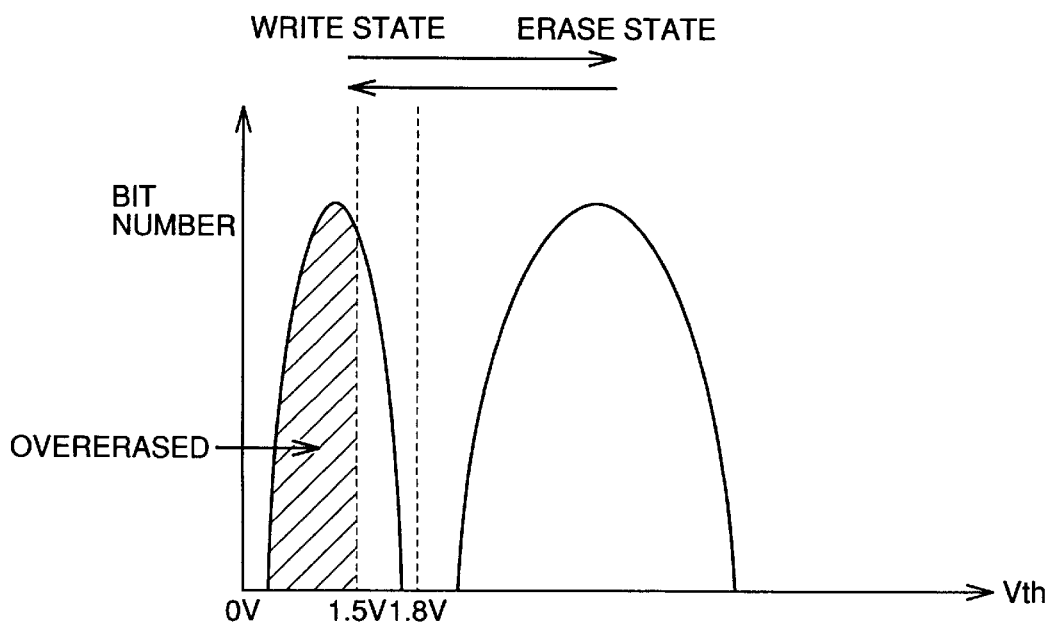
FIG. 74 illustrates threshold voltage distributions of the memory cells in the conventional DINOR flash memory.

FIG. 66 is a circuit diagram for illustrating another structure of the memory cell array 104 shown in FIG. 52 in more detail, in comparison with FIG. 54.

This structure is different from that shown in FIG. 54 in a point that the drain of the memory cell transistor MT1a is directly connected with the bit line BL1 and the cell selector transistor MS1a is arranged between the source region of the memory cell transistor MT1a and the base region of the bipolar transistor in the memory cell MC1a, for example.

In the structure shown in FIG. 66, therefore, the bipolar transistor is formed by providing its emitter region on a surface side of the source region of the cell selector transistor MS1a.

Due to the structure shown in FIG. 66, data can be written in the memory cell transistor MT1a or the like with no influence by a voltage drop by the cell selector transistor MS1a.

Also in the nonvolatile semiconductor memory device 3000 according to the embodiment 9 of the present invention, at least two wires supplied with a well potential from a well potential driving circuit 120 can be present in the same erase block.

Also in this case, it is possible to reduce saturation of bipolar transistors by arranging a plurality of well potential supply wires in the erase block.

Also in the nonvolatile semiconductor memory device 3000 according to the embodiment 9 of the present invention, it is possible to perform parallel writing of a plurality of data and a parallel verify operation described with reference to FIGS. 16 to 18 in relation to the nonvolatile semiconductor memory device 1000 according to the embodiment 1 of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device being formed on a semiconductor substrate, comprising:
    a memory cell array including a plurality of memory cells being arranged in rows and columns;
    a plurality of bit lines being provided in correspondence to said columns of said memory cells respectively;
    a plurality of word lines being provided in correspondence to said rows of said memory cells respectively; and
    a plurality of first cell selector lines being provided in correspondence to said rows of said memory cells,
    each said memory cell including a memory cell transistor having:
        a second conductivity type source region and a drain region of said second conductivity type being formed on a first conductivity type major surface of said semiconductor substrate,
        a channel region being held between said source region and said drain region,
        a charge storage electrode being formed on said channel region with an oxide film therebetween, and
        a control electrode being formed above said charge storage electrode with an insulating film therebetween,
    said drain region being coupled with corresponding said bit line,
    the potential of said control electrode being controlled by corresponding said word line,
    said nonvolatile semiconductor memory device further comprising:
        memory cell selector means for selecting corresponding said word line and providing a potential difference between selected said bit line and selected said first cell selector line in response to an external address signal in a read operation of said nonvolatile semiconductor memory device;
        a plurality of bipolar transistors each being provided between said source region of corresponding said memory cell transistor and corresponding said first cell selector line and so coupled as to amplify a current flowing between said source region and said drain region of selected said memory cell transistor as a base current for controlling the quantity of a current flowing through said selected first cell selector line; and
        data read means for reading data being held in selected said memory cell in response to the value of said current flowing through said selected first cell selector line; wherein:
            said memory cell selector means includes write means for injecting/extracting electrons into/from said charge storage electrodes of said memory cell transistors to write data into said memory cell transistors in a write operation, and
            said write means has
                row selector means for keeping the potential level of the selected word line higher than that of the semiconductor substrate according to an address signal during the write operation, and
                column selector means for keeping the potential level of the selected bit line lower than that of the semiconductor substrate according to said address signal during the write operation.

2. A nonvolatile semiconductor memory device being formed on a semiconductor substrate, comprising:
    a memory cell array including a plurality of memory cells being arranged in rows and columns;
    a plurality of bit lines being provided in correspondence to said columns of said memory cells respectively;
    a plurality of word lines being provided in correspondence to said rows of said memory cells respectively; and
    a plurality of first cell selector lines being provided in correspondence to said rows of said memory cells,
    each said memory cell including a memory cell transistor having:
        a second conductivity type source region and a drain region of said second conductivity type being formed on a first conductivity type major surface of said semiconductor substrate,
        a channel region being held between said source region and said drain region,
        a charge storage electrode being formed on said channel region with an oxide film therebetween, and
        a control electrode being formed above said charge storage electrode with an insulating film therebetween,
    said drain region being coupled with corresponding said bit line,
    the potential of said control electrode being controlled by corresponding said word line,
    said nonvolatile semiconductor memory device further comprising:

memory cell selector means for selecting corresponding said word line and providing a potential difference between selected said bit line and selected said first cell selector line in response to an external address signal in a read operation of said nonvolatile semiconductor memory device;

a plurality of bipolar transistors each being provided between said source region of corresponding said memory cell transistor and corresponding said first cell selector line and so coupled as to amplify a current flowing between said source region and said drain region of selected said memory cell transistor as a base current for controlling the quantity of a current flowing through said selected first cell selector line; and data read means for reading data being held in selected said memory cell in response to the value of said current flowing through said selected first cell selector line, wherein each said bipolar transistor is provided for each corresponding pair of said first and second memory cell transistors adjacent each other in a column direction, and each said first cell selector line is provided for each row of said bipolar transistors.

3. The nonvolatile semiconductor memory device in accordance with claim 2, wherein each said bipolar transistor includes:

a first conductivity type emitter region being formed to be enclosed with said source regions of said corresponding memory cell transistors except said major surface of said semiconductor substrate, a second conductivity type base region sharing its area with both said source regions of said corresponding first memory cell transistor and said corresponding second memory cell transistor, and a collector region sharing its area with said first conductivity type major surface of said semiconductor substrate being provided with said corresponding memory cell transistors.

4. The nonvolatile semiconductor memory device in accordance with claim 3, wherein said memory cell selector means includes:

write means injecting or extracting electrons into or from said charge storage electrodes of said memory cell transistors in a write operation, and said write means has:

row selector means for setting said selected word line at a first potential in response to an external address signal, column selector means for setting said selected bit line at a second potential in response to an external address signal, and cell selector control means for setting said selected first cell selector line at a third potential in response to an external address signal.

5. The nonvolatile semiconductor memory device in accordance with claim 4, wherein said row selector means simultaneously sets a plurality of said word lines being selected in response to said external address signal at corresponding potential levels in response to a plurality of externally supplied write data respectively and writes said data in a plurality of said memory cell transistors being selected in response to said external address signal in parallel with each other, said nonvolatile semiconductor memory device further comprising:

write control means for reading said data in parallel with each other through a plurality of said first cell selector lines corresponding to said selected plurality of memory cell transistors and confirming said write data.

6. The nonvolatile semiconductor memory device in accordance with claim 4, wherein said row selector means applies a fourth potential being reverse in polarity to said first potential to non-selected said word lines.

7. The nonvolatile semiconductor memory device in accordance with claim 3, wherein said memory cell transistors are formed in a first conductivity type well being provided on said major surface of said semiconductor substrate, and said first conductivity type well is divided into a plurality of well blocks, said nonvolatile semiconductor memory device further comprising:

well potential driving means for generating a well potential to be supplied to each said well block, and a plurality of interconnections being provided at least in a pair in correspondence to each said well block for transmitting said well potential outputted from said well potential driving means.

8. A nonvolatile semiconductor memory device being formed on a semiconductor substrate, comprising:

a memory cell array including a plurality of memory cells being arranged in rows and columns;

a plurality of bit lines being provided in correspondence to said columns of said memory cells respectively;

a plurality of word lines being provided in correspondence to said rows of said memory cells respectively; and a plurality of first cell selector lines being provided in correspondence to said rows of said memory cells, each said memory cell including a memory cell transistor having:

a second conductivity type source region and a drain region of said second conductivity type being formed on a first conductivity type major surface of said semiconductor substrate, a channel region being held between said source region and said drain region, a charge storage electrode being formed on said channel region with an oxide film therebetween, and a control electrode being formed above said charge storage electrode with an insulating film therebetween, said drain region being coupled with corresponding said bit line, the potential of said control electrode being controlled by corresponding said word line, said nonvolatile semiconductor memory device further comprising:

memory cell selector means for selecting corresponding said word line and providing a potential difference between selected said bit line and selected said first cell selector line in response to an external address signal in a read operation of said nonvolatile semiconductor memory device;

a plurality of bipolar transistors each being provided between said source region of corresponding said memory cell transistor and corresponding said first cell selector line and so coupled as to amplify a current flowing between said source region and said drain region of selected said memory cell transistor as a base current for controlling the quantity of a current flowing through said selected first cell selector line; and data read means for reading data being held in selected said memory cell in response to the value of said current flowing through said selected first cell selector line, wherein each said bipolar transistor is provided for each corresponding said memory cell transistor, and each said first cell selector line is provided for each corresponding said row, wherein:

said memory cell selector means includes write means for injecting/extracting electrons into/from said charge storage electrodes of said memory cell transistors to write data into said memory cell transistors in a write operation, and said write means has row selector means for keeping the potential level of the selected word line higher than that of the semiconductor substrate according to an address signal during the write operation, and column selector means for keeping the potential level of the selected bit line lower than that of the semiconductor substrate according to said address signal during the write operation.

9. The nonvolatile semiconductor memory device in accordance with claim 8, wherein each said bipolar transistor includes:

a first conductivity type emitter region being formed to be enclosed with said source region of said corresponding memory cell transistor except said major surface of said semiconductor substrate, a second conductivity type base region sharing its area with said source region of said corresponding memory cell transistor, and a collector region sharing its area with said first conductivity type major surface of said semiconductor substrate being provided with said corresponding memory cell transistor.

10. The nonvolatile semiconductor memory device in accordance with claim 9, wherein said memory cell selector means includes:

write means injecting or extracting electrons into or from said charge storage electrodes of said memory cell transistors in a write operation of said nonvolatile semiconductor memory device, and said write means has:

row selector means for setting said selected word line at a first potential in response to an external address signal, column selector means for setting said selected bit line at a second potential in response to an external address signal, and cell selector control means for setting said selected first cell selector line at a third potential in response to an external address signal.

11. The nonvolatile semiconductor memory device in accordance with claim 10, wherein said row selector means simultaneously sets a plurality of said word lines being selected in response to said external address signal at corresponding potential levels in response to a plurality of externally supplied write data respectively and writes said data in a plurality of said memory cell transistors being selected in response to said external address signal in parallel with each other, said nonvolatile semiconductor memory device further comprising:

write control means for reading said data in parallel with each other through a plurality of said first cell selector lines corresponding to said selected plurality of memory cell transistors and confirming said write data.

12. The nonvolatile semiconductor memory device in accordance with claim 10, wherein said row selector means applies a fourth potential being reverse in polarity to said first potential to non-selected said word lines.

13. A nonvolatile semiconductor memory device being formed on a semiconductor substrate, comprising:

a memory cell array including a plurality of memory cells being arranged in rows and columns;

a plurality of bit lines being provided in correspondence to said columns of said memory cells respectively;

a plurality of word lines being provided in correspondence to said rows of said memory cells respectively; and a plurality of first cell selector lines being provided in correspondence to said rows of said memory cells, each said memory cell including a memory cell transistor having:

a second conductivity type source region and a drain region of said second conductivity type being formed on a first conductivity type major surface of said semiconductor substrate, a channel region being held between said source region and said drain region, a charge storage electrode being formed on said channel region with an oxide film therebetween, and a control electrode being formed above said charge storage electrode with an insulating film therebetween, said drain region being coupled with corresponding said bit line, the potential of said control electrode being controlled by corresponding said word line, said nonvolatile semiconductor memory device further comprising:

memory cell selector means for selecting corresponding said word line and providing a potential difference between selected said bit line and selected said first cell selector line in response to an external address signal in a read operation of said nonvolatile semiconductor memory device;

a plurality of bipolar transistors each being provided between said source region of corresponding said memory cell transistor and corresponding said first cell selector line and so coupled as to amplify a current flowing between said source region and said drain region of selected said memory cell transistor as a base current for controlling the quantity of a current flowing through said selected first cell selector line; and data read means for reading data being held in selected said memory cell in response to the value of said current flowing through said selected first cell selector line, wherein each said bipolar transistor is provided for each corresponding said memory cell transistor, and each said first cell selector line is provided for each corresponding said row, each said bipolar transistor includes:

a first conductivity type emitter region being formed to be enclosed with said source region of said corresponding memory cell transistor except said major surface of said semiconductor substrate, a second conductivity type base region sharing its area with said source region of said corresponding memory cell transistor, and a collector region sharing its area with said first conductivity type major surface of said semiconductor substrate being provided with said corresponding memory cell transistor, wherein said memory cell transistors are formed in a first conductivity type well being provided on said major surface of said semiconductor substrate, and said first conductivity type well is divided into a plurality of well blocks, said nonvolatile semiconductor memory device further comprising:

well potential driving means for generating a well potential to be supplied to each said well block, and a plurality of interconnections being provided at least in a pair in correspondence to each said well block for transmitting said well potential outputted from said well potential driving means.

14. A nonvolatile semiconductor memory device being formed on a semiconductor substrate, comprising:

a memory cell array including a plurality of memory cells being arranged in rows and columns;

a plurality of bit lines being provided in correspondence to said columns of said memory cells respectively;

a plurality of word lines being provided in correspondence to said rows of said memory cells respectively; and a plurality of first cell selector lines being provided in correspondence to said rows of said memory cells, each said memory cell including a memory cell transistor having:

a second conductivity type source region and a drain region of said second conductivity type being formed on a first conductivity type major surface of said semiconductor substrate, a channel region being held between said source region and said drain region, a charge storage electrode being formed on said channel region with an oxide film therebetween, and a control electrode being formed above said charge storage electrode with an insulating film therebetween, said drain region being coupled with corresponding said bit line, the potential of said control electrode being controlled by corresponding said word line, said nonvolatile semiconductor memory device further comprising:

memory cell selector means for selecting corresponding said word line and providing a potential difference between selected said bit line and selected said first cell selector line in response to an external address signal in a read operation of said nonvolatile semiconductor memory device;

a plurality of bipolar transistors each being provided between said source region of corresponding said memory cell transistor and corresponding said first cell selector line and so coupled as to amplify a current flowing between said source region and said drain region of selected said memory cell transistor as a base current for controlling the quantity of a current flowing through said selected first cell selector line; and data read means for reading data being held in selected said memory cell in response to the value of said current flowing through said selected first cell selector line, further comprising:

a plurality of second cell selector lines being provided in correspondence to said rows of said memory cells respectively, each said memory cell further includes:

a cell selector transistor for selectively opening/ closing a conduction path of a current flowing between each said bit line and said base region of each said bipolar transistor through each said memory cell transistor, each said bipolar transistor is provided for each corresponding pair of said first and second memory cell transistors adjacent each other in a column direction, each said first cell selector line is provided for each row of said bipolar transistors, and said memory cell selector means activates said second cell selector line corresponding to selected said memory cell for rendering said cell selector transistor of said selected memory cell conductive.

15. The nonvolatile semiconductor memory device in accordance with claim 14, wherein each said bipolar transistor includes:

a first conductivity type emitter region being formed to be enclosed with said source regions of said corresponding memory cell transistors except said major surface of said semiconductor substrate, a second conductivity type base region sharing its area with both said source regions of said corresponding first memory cell transistor and said corresponding second memory cell transistor, and a collector region sharing its area with said first conductivity type major surface of said semiconductor substrate being provided with said corresponding memory cell transistors, and each said cell selector transistor is provided between said drain region of corresponding said memory cell transistor and said corresponding bit line.

16. The nonvolatile semiconductor memory device in accordance with claim 15, wherein said row selector means applies a fourth potential being reverse in polarity to said first potential to non-selected said word lines.

17. The nonvolatile semiconductor memory device in accordance with claim 15, wherein said memory cell transistors are formed in a first conductivity type well being provided on said major surface of said semiconductor substrate, and said first conductivity type well is divided into a plurality of well blocks, said nonvolatile semiconductor memory device further comprising:

well potential driving means for generating a well potential to be supplied to each said well block, and a plurality of interconnections being provided at least in a pair in correspondence to each said well block for transmitting said well potential outputted from said well potential driving means.

18. The nonvolatile semiconductor memory device in accordance with claim 14, wherein each said bipolar transistor includes:
- a first conductivity type emitter region being formed to be enclosed with said source regions of said corresponding memory cell transistors except said major surface of said semiconductor substrate,
- a second conductivity type base region sharing its area with both said source regions of said corresponding first memory cell transistor and said corresponding second memory cell transistor, and
- a collector region sharing its area with said first conductivity type major surface of said semiconductor substrate being provided with said corresponding memory cell transistors, and each said memory cell transistor is provided between a drain of corresponding said cell selector transistor and said corresponding bit line.

19. The nonvolatile semiconductor memory device in accordance with claim 14, wherein said memory cell selector means includes:
- write means injecting or extracting electrons into or from said charge storage electrodes of said memory cell transistors in a write operation, and said write means has:
- row selector means for setting said selected word line at a first potential in response to an external address signal,
- column selector means for setting said selected bit line at a second potential in response to an external address signal, and
- cell selector control means for setting said selected first cell selector line at a third potential and activating said second cell selector line corresponding to said selected memory cell in response to an external address signal.

20. The nonvolatile semiconductor memory device in accordance with claim 19, wherein said row selector means simultaneously sets a plurality of said word lines being selected in response to said external address signal at corresponding potential levels in response to a plurality of externally supplied write data respectively and writes said data in a plurality of said memory cell transistors being selected in response to said external address signal in parallel with each other, said nonvolatile semiconductor memory device further comprising:
- write control means for reading said data in parallel with each other through a plurality of said first cell selector lines corresponding to said selected plurality of memory cell transistors and confirming said write data.

* * * * *